United States Patent
Chiozzi et al.

(10) Patent No.: US 7,932,622 B2
(45) Date of Patent: Apr. 26, 2011

(54) POWER SWITCH CIRCUIT FOR DRIVING AN AIRBAG SQUIB MODULE

(75) Inventors: Giorgio Chiozzi, Padua (IT); Alberto Flore, Samugheo (IT); Joachim Glaeser, Munich (DE); Alberto Gola, Montú Beccaria (IT); Michael Lenz, Zorneding (DE); Nicola Macri, Vicenza (IT); Salvatore Piccolella, Padua (IT)

(73) Assignee: Infineon Technologies AG, Neubiberg (DE)

( * ) Notice: Subject to any disclaimer, the term of this patent is extended or adjusted under 35 U.S.C. 154(b) by 653 days.

(21) Appl. No.: 11/537,097

(22) Filed: Sep. 29, 2006

(65) Prior Publication Data

US 2007/0103001 A1    May 10, 2007

(30) Foreign Application Priority Data

Sep. 30, 2005  (EP) .................................. 05021518

(51) Int. Cl.
*B06L 1/00*    (2006.01)
(52) U.S. Cl. .................. 307/9.1; 307/10.1; 307/121
(58) Field of Classification Search ............... None
See application file for complete search history.

(56) References Cited

U.S. PATENT DOCUMENTS

| | | | |
|---|---|---|---|
| 5,135,254 A | 8/1992 | Masegi et al. | 280/735 |
| 5,309,030 A | 5/1994 | Schultz | 307/10.1 |
| 5,420,790 A * | 5/1995 | Ravas et al. | 307/10.1 |
| 5,631,843 A | 5/1997 | Munday et al. | 364/492 |
| 5,722,687 A | 3/1998 | Cook, Jr. et al. | 280/735 |
| 5,734,317 A | 3/1998 | Bennett et al. | 340/436 |
| 5,882,034 A | 3/1999 | Davis et al. | 280/735 |
| 2004/0108698 A1 | 6/2004 | Rothleitner | 280/735 |
| 2005/0179424 A1 * | 8/2005 | Mayumi | 323/282 |

FOREIGN PATENT DOCUMENTS

| | | |
|---|---|---|
| EP | 0 805 074 A1 | 11/1997 |
| JP | 2001-171477 A * | 6/2001 |
| JP | 2001-341612 A * | 12/2001 |

OTHER PUBLICATIONS

Machine translations for JP2001-341612 and JP2001-171477.*

* cited by examiner

*Primary Examiner* — Fritz M Fleming
(74) *Attorney, Agent, or Firm* — Eschweiler & Associates, LLC

(57) ABSTRACT

A power switch circuit for driving an airbag squib module has a power transistor, a pre-charge capacitance for storing a charge, a charging circuit and a controllable energy-coupling element. The power transistor has a first electrode, a second electrode and a control electrode. A path between the first electrode and the second electrode is connected in series with the airbag squib module between a supply potential and a reference potential. The charging circuit charges the pre-charge capacitance and the charging circuit is therefore coupled with the pre-charged capacitance. The controllable energy coupling element is connected between a first electrode of the pre-charge capacitance and the control electrode of the power transistor. The power switch exhibits a high degree of stability, allows a fast switching of the power transistor and further has an advantageous transient response.

42 Claims, 18 Drawing Sheets

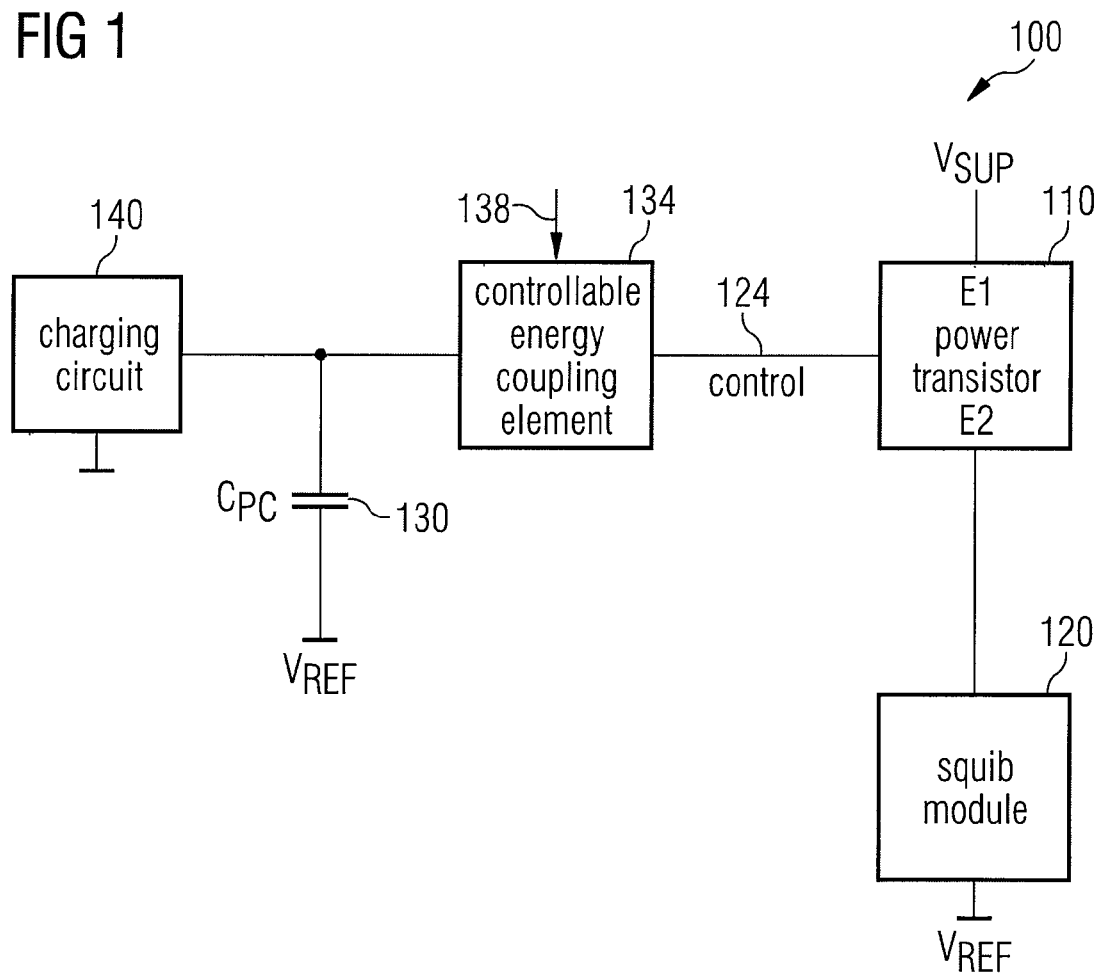

(Voltage regulate + driving stage)

FIG 5B
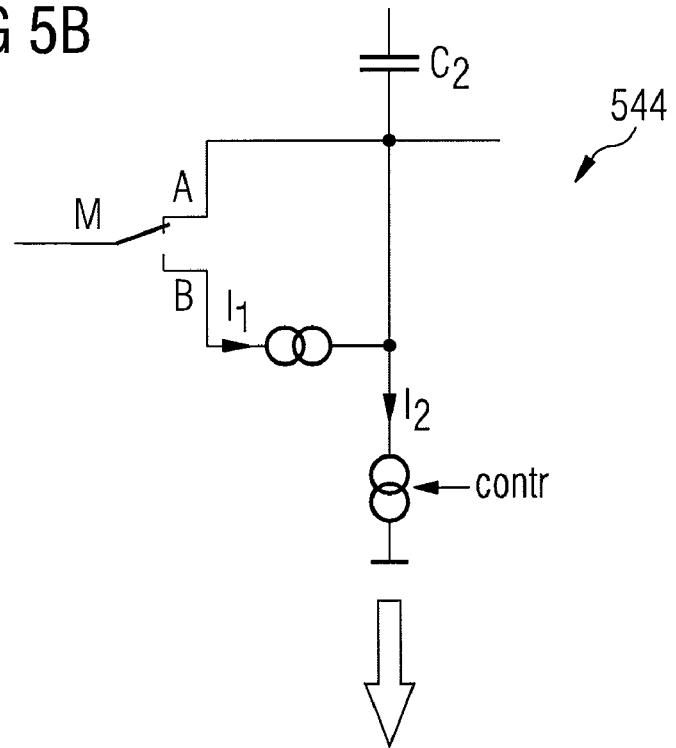
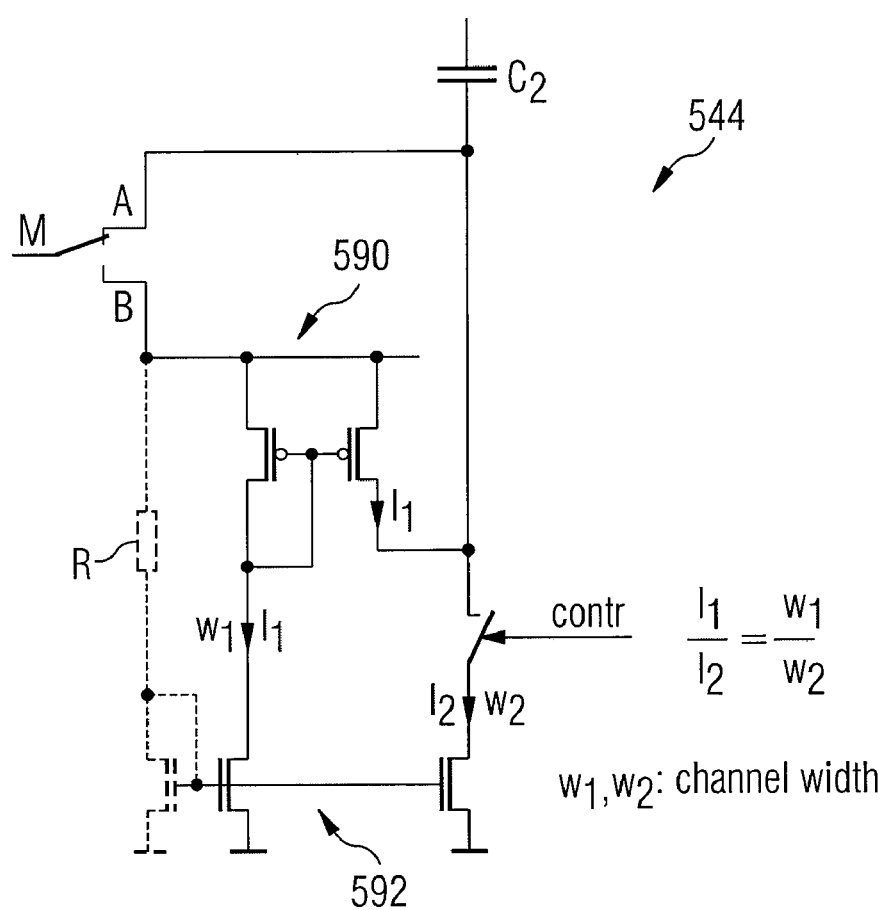
$$\frac{I_1}{I_2} = \frac{w_1}{w_2}$$
$w_1, w_2$: channel width

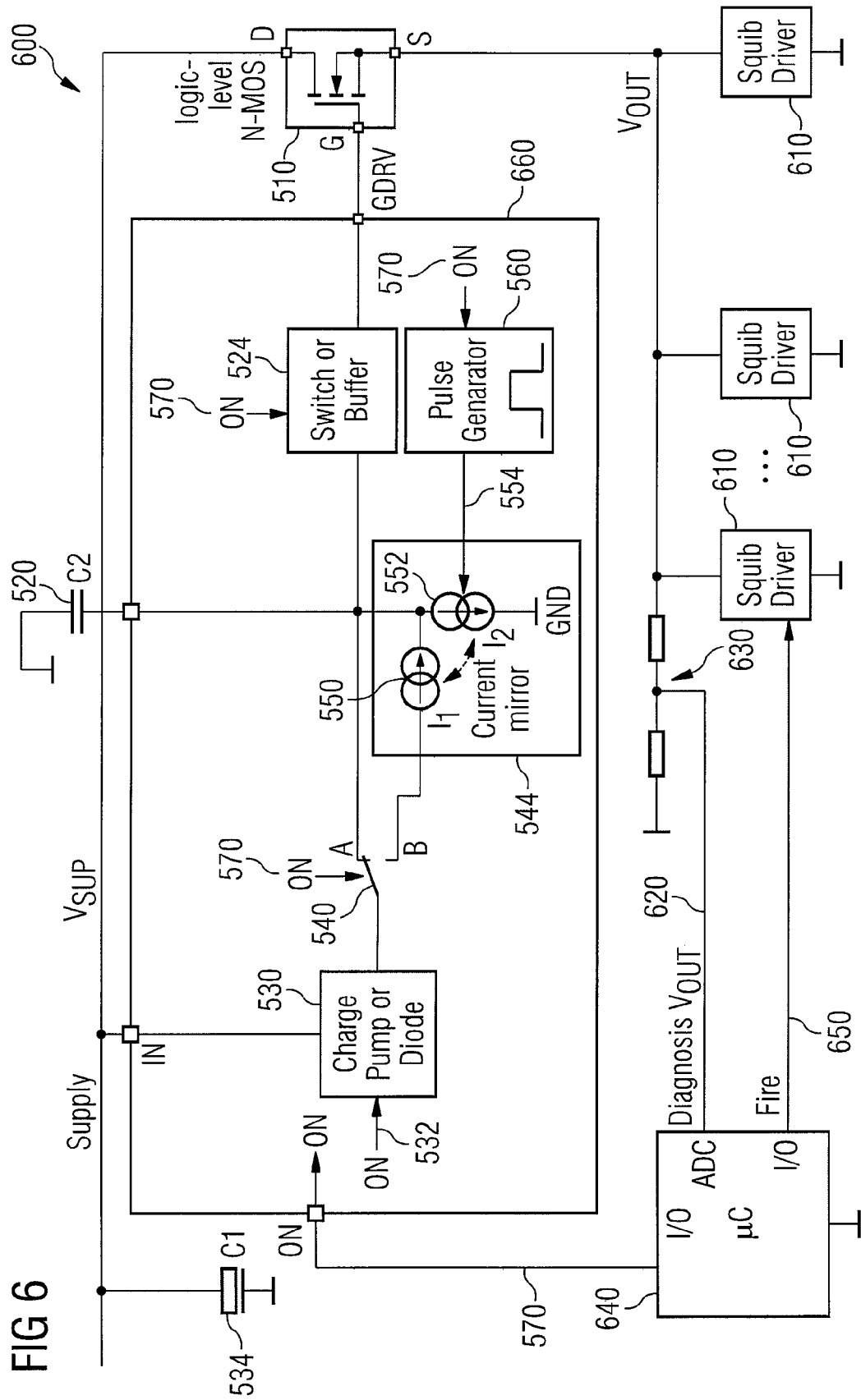

FIG 7
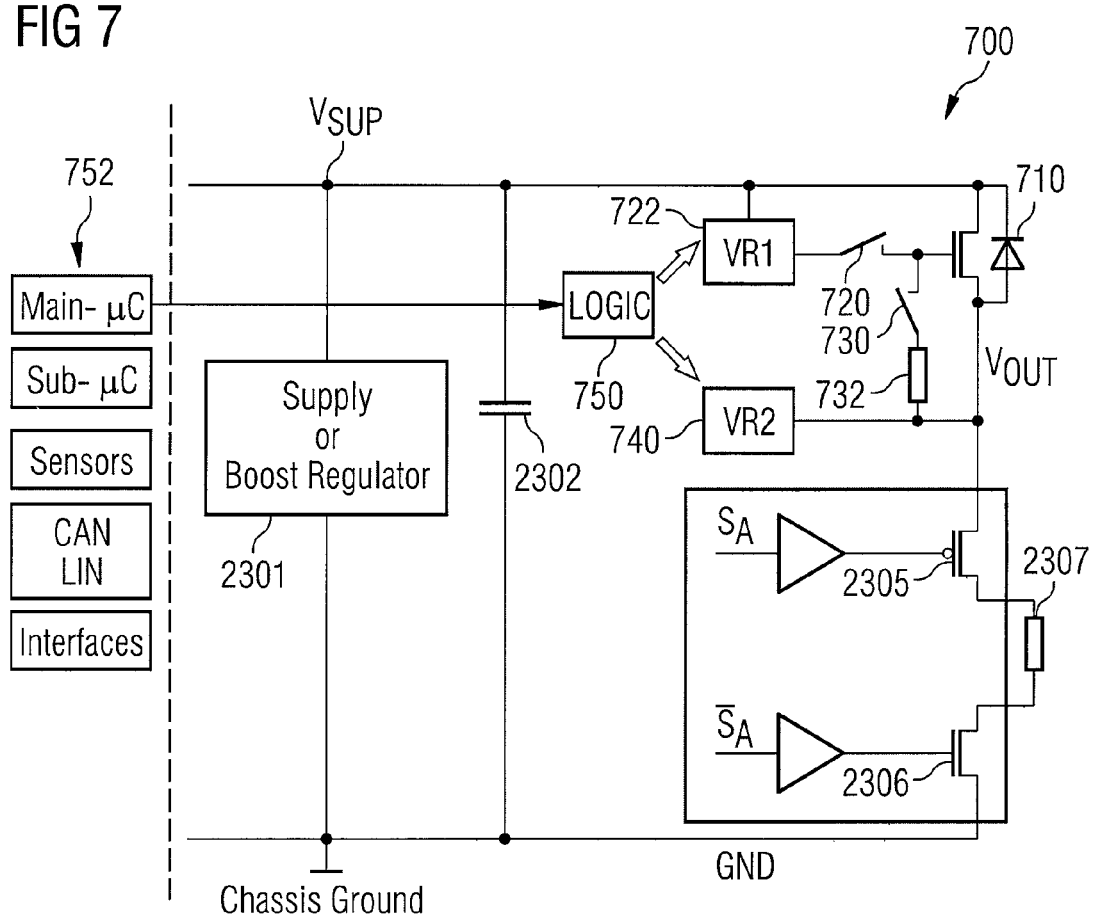
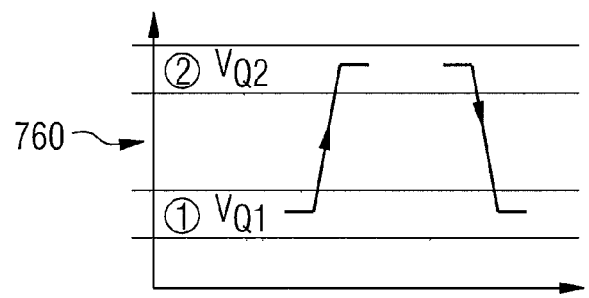

gate-source short-circuited output capacitor presence check

CP capacitor not connected

US 7,932,622 B2

POWER SWITCH CIRCUIT FOR DRIVING AN AIRBAG SQUIB MODULE

PRIORITY

This application claims priority from European Patent Application No. 05021518.5, which was filed on Sep. 30, 2005 and is incorporated herein by reference in its entirety.

TECHNICAL FIELD

The present invention is generally related to a power switch circuit for driving an AIRBAG squib module, in particular to a very fast transient response power-MOS-switch gate driver circuit for AIRBAG application.

BACKGROUND

Modern automotive security systems may require a very fast reaction time. This is particularly true for AIRBAG systems wherein the inflation of the AIRBAG is triggered by a squib module. It has further been found that power transistors driving the squib module should react very fast so that a well-timed inflation of the AIRBAG can be achieved. Furthermore it was found out that power-MOSFETs (MOSFET=metal-oxide-semiconductor field-effect transistor) are well-suited for driving the squib module of an AIRBAG.

A power-MOSFET may be typically driven by an appropriate gate driver circuit. In power-MOSFET driver circuits, the most important design parameters to be fulfilled are the transient response to load variations and the AC stability issue. Furthermore, it should be noted that in actual AIRBAG applications we face growing driving current capabilities and faster slew rates of load current.

An actual AIRBAG application will subsequently be described with reference to FIGS. 17 and 18. FIG. 17 shows a block schematic diagram of a conventional AIRBAG driver circuit, and FIG. 18 shows a graphical representation of a maximum current slew rate and a maximum current as a function of time for the AIRBAG driver circuit of FIG. 17.

The schematic block diagram of FIG. 17 shows an AIRBAG application system. The airbag driver circuit of FIG. 17 is designated in its entirety with 2100. An input voltage $V_{ER}$ is available at the input of the AIRBAG application system 2100. Input voltage $V_{ER}$ is usually obtained by a boost converter in series with the battery voltage in order to get a voltage much higher than the battery voltage for AIRBAG safety purposes. The input energy provided by the battery and/or the boost converter (both not shown here) is then stored in a big "reservoir" and capacitor $C_{ER}$ in the order of tenths of mF. The capacitor $C_{ER}$ is followed in series by an anti-reverse power diode 2109. The input energy stored in the reservoir capacitor $C_{ER}$ can be "shorted" to the load (e.g. an AIRBAG SQUIB module) via a power-MOS-switch 2102.

Special requirements with respect to the shown AIRBAG application system is the capability to sustain very fast variations of load current in order to provide current to the AIRBAG squib modules 2107, 2108 exactly they require this current. It should be noted here that the AIRBAG squib modules 2107, 2108 request current exactly when the AIRBAG security system managed by the central processing unit (CPU) 2105 detects that the firing condition is fulfilled and the CPU has already switched the system from the normal stand-by mode to the firing mode. In other words, the CPU 2105 may preferably switch from stand-by mode to firing mode before the squib modules are triggered.

The block named "Power-MOS-switch" 2102 plus the block "Power Control System" 2103 has seen a new evolution during the last recent years, starting from a "pure" switch which simply shorts the input voltage $V_{ER}$ to the output voltage $V_{OUT}$. Also, instead of a simple power-MOS-switch driven directly by the CPU, a voltage regulator concept using the power control system 2103 has been shown. The power control system 2103 is responsible for stabilizing a gate voltage provided to the MOS-switch 2102 in order to give the AIRBAG squib modules 2107, 2108 an output voltage $V_{OUT}$ much lower than the input voltage $V_{ER}$. The necessity to use a lower output voltage $V_{OUT}$ comes from a technological change of the voltage class of the AIRBAG squib modules 2107, 2108.

It should be noted that the AIRBAG driver circuit of FIG. 17 further comprises an output capacitor 2106, a current source 2101 connected between the input and the output of the power-MOS-switch 2102 and a diagnosis circuit 2104. Furthermore, at the input of the power-MOS-switch 2102 an additional diode 2110 and an additional buffer capacitor 2111 may be connected in the shown way.

Furthermore, it should be noted that the firing of the AIRBAG in an automobile typically requires a pair of field-effect transistors (FETs) in order to let the current flow through the series of them. Typically, one field-effect transistor of the pair of field-effect transistors is placed at each side of the squib. In order to decrease the area of the field-effect transistors (FETs) on silicon (i.e. to limit the amount of energy they have to dissipate), and even more in order to avoid undesired and very dangerous explosion commands to the squib, a solution with an external additional power element added has already been proposed in US patent application U.S. 2004/0108698A1.

In FIG. 18, a first curve 2210 describes a maximum current slew rate $dI_{SD}/dt$ as a function of time, wherein the current $I_{SD}$ is defined in FIG. 17. A second curve 2220 describes the maximum available current $I_{SD}$ as a function of time. For the circuit 2100 of FIG. 17, in operation mode 3 (firing mode) the maximum current slew rate $dI_{SD}/dt$ (1.5 A/μs) is reached only after a minimum of 8 μs. The complete timing is specified in the diagram of FIG. 18.

FIG. 19 shows a prior-art solution according to U.S. 2004/0108698A1. In other words, FIG. 19 shows a block schematic diagram of a prior-art AIRBAG driver circuit. The circuit of FIG. 19 is designated in its entirety with 2300. With reference to FIG. 19, the firing circuit 2300 is connected between a supply voltage $V_{SUP}$ and a reference potential GND (also designated as ground GND). A supply circuit or a boost regulator 2301 may be used to provide the supply voltage $V_{SUP}$. Charge-pumps are used to boost the voltage for firing circuits above the voltage supplied by the vehicle battery (not shown here). A pre-charged capacitor 2302 can be used to supply power to the electronics if the vehicle battery becomes disconnected or damaged during a crash event. For that reason, the pre-charged capacitor 2302 has to be really huge (order of magnitude of some mF). Both a high-side switch 2305 and a low-side switch 2306 are closed during the firing pulse, when the proper command SA on their gates is generated by a microprocessor. In this way, a certain amount of current (typically few amperes of current) can flow through the series connection (consisting of field-effect transistor 2304, high-side switch 2305, squib 2307 and low-side switch 2306) during a small period of time (few milliseconds), thus producing explosions.

It should further be noted that the widespread drive circuit used to explode the squib in AIRBAG deployment systems has a series of a high-side switch to the firing cap and of a low-side switch on the other side, as, for example, described in U.S. Pat. No. 5,631,834 and U.S. Pat. No. 5,135,254.

Furthermore, it should be noted that some circuits intended to define and limit the amount of current (flowing through the series connection) have already been proposed and studied. Some possible solutions are shown in U.S. Pat. No. 5,734,317A and U.S. Pat. No. 5,309,030. However, in the solutions of the prior art the silicon area of the driver transistors 2305, 2306 and thus so far their thermal capacity has been increased so that the driver transistors 2305, 2306 can absorb a high amount of energy. Thus, the problem of a high cost by integrating a large silicon area of the driver transistors using a complex wafer manufacturing technology arises unless the special solution of U.S. 2004/0108698 A1 is adopted.

It should further be noted that if both transistors used for firing are inadvertently activated simultaneously due to some chip-internal fault, this leads to a faulty firing with the consequence that an airbag unfolds without the relative external reason. This can lead to serious accidents. With the solution proposed in U.S. 2004/0108698 A1, there is no need for external auxiliary mechanical closable switches to face this safety problem, because the introduction of another power element 2304 connected in series with the high-side switch 2304 is adopted. If the additional power element 2304 is normally switched off, an unwanted explosion can be avoided. In the shown configuration, the gate voltage of the external N-type channel field-effect transistor (FET) 2304 is generated by a constant voltage source 2303. The output (the source terminal of the additional power element 2304) is driven in a source-follower configuration, wherein the source voltage is determined directly by the value of the gate voltage.

However, in normal operation mode different from the firing mode, i.e. with the gate of the N-type channel field-effect transistor (FET) 2304 not fed but shorted to ground, there is no way available for easily monitoring the squib driver circuitry because no output voltage is guaranteed to the squib driver circuitry 2305, 2306 for diagnostic purposes. Moreover, with the configuration presented in U.S. 2004/0108698 A1 there is no easy way available for monitoring the behavior of the additional power element 2304 itself. Accordingly, there is still a possibility that a malfunction is not detected.

From the above discussion it can be concluded that the prior-art solutions may still comprise severe drawbacks and bring along serious design problems or even security risks. In particular, prior-art power switches for AIRBAG applications are potentially unstable. Furthermore, it may be difficult to perform a complete system diagnosis using a prior-art AIRBAG driver. Besides, the power switches in conventional systems may be typically rather slow due to the introduction of stabilizing networks.

SUMMARY

According to an embodiment, a power switch circuit for driving an AIRBAG squib module, may have: a power transistor having a first electrode, a second electrode and a control electrode, a path between the first electrode and the second electrode being connected in series with the AIRBAG squib module between the supply potential and the reference potential, a pre-charge capacitor for storing a charge, a charging circuit for charging the pre-charge capacitor, the charging circuit coupled to the pre-charge capacitance, and a controllable energy-coupling element connected between a first electrode of the pre-charge capacitor and the control electrode of the power transistor.

BRIEF DESCRIPTION OF THE DRAWINGS

These and other objects and features of the present invention will become clear from the following description taken in conjunction with the accompanying drawings, in which:

FIG. 1 is a block schematic diagram of an power switch circuit according to a first embodiment;

FIG. 2b is a block schematic diagram of a second power switch circuit derived from the circuit of FIG. 2a;

FIG. 5b is a schematic of a switched current source circuit for usage in the power switch circuit according to the third embodiment;

FIG. 6 is a block schematic diagram of an application comprising the power switch circuit according to the third embodiment;

FIG. 7 is a block schematic diagram of an power switch circuit according to the fourth embodiment;

DETAILED DESCRIPTION

Figure 2A:
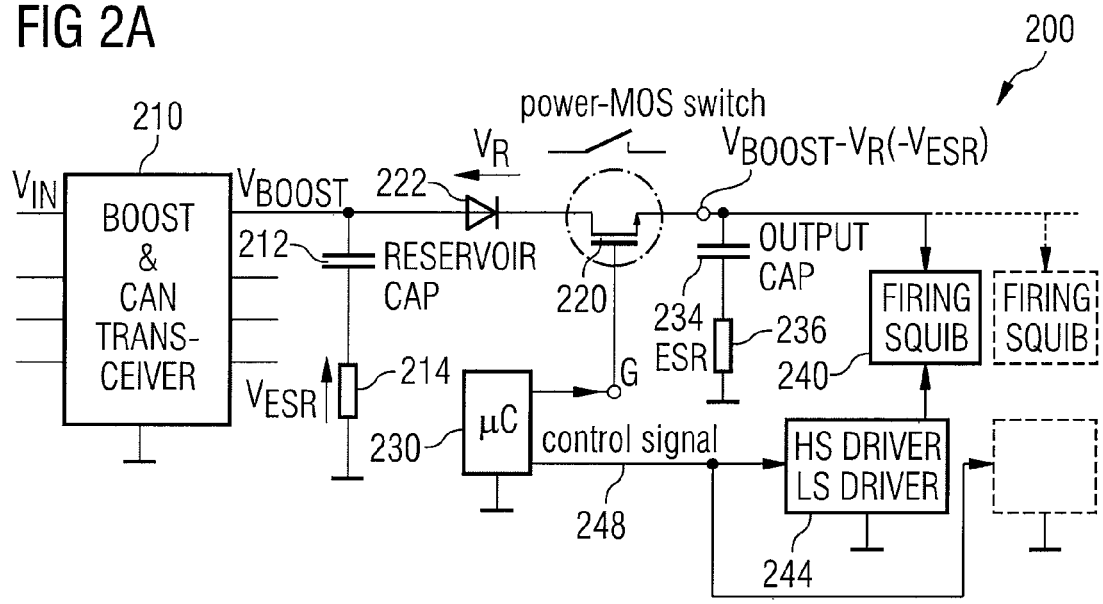
FIG. 2a is a block schematic diagram of a first power switch circuit serving as a starting point for the design of the power switch circuit.

According to an embodiment, a charge for the power transistor can be provided by storing the charge in a pre-charge capacitor which can be coupled to the power transistor over a controllable energy-coupling element. It has been recognized that a capacitor can provide the necessary charge very fast. Also, at comparable cost, the capacitor can provide significantly lower impedance than any known driving circuit. Furthermore, in accordance with an embodiment the pre-charge capacitance can be coupled with a charging circuit. Accordingly, the charging circuit can charge the pre-charge capacitance when the controllable energy-coupling element is in a non-conducting state. Consequently, the pre-charge capacitance typically carries a significant amount of charge, which is immediately available as soon as the controllable energy-coupling element is switched to a conducting state. In the conducting state of the controllable energy-coupling element, the charge of the pre-charge capacitance can be transferred to the control electrode of the power transistor very fast. As a consequence, only the typically very low resistance of the controllable energy-coupling element limits the speed at which the charge can flow to the control electrode of the power transistor. Accordingly, the power transistor can be switched on very fast, which is a very important requirement in an AIRBAG driver circuit.

Besides, the circuit brings along a transient response to load variations, which is significantly faster than the transient response of conventional power switch circuits. If a load variation occurs when the controllable energy-coupling element is in a conducting state (i.e. the current through the first electrode and the second electrode of the power transistor changes very fast) a fast response of the charge at the control terminal of the power transistor is necessary in order to keep the voltage at the AIRBAG squib module constant. In other words, a very high current must be available to charge the control electrode of the power transistor for a short time in order to change the amount of charge stored in the control region of the power transistor. Such a large current cannot be easily provided by a conventional drive circuit for a power transistor. However, the pre-charge capacitance can store a charge and can therefore provide a part of the charge to the input terminal of the power transistor very fast. Accordingly, a changing load of the power transistor can be compensated for very fast, which results in a good transient response of the whole power switch circuit.

In other words, the pre-charge capacitance provides a very low AC impedance which is not degraded severely by the controllable energy-coupling element connected between the first electrode of the pre-charge capacitance and the control electrode of the power transistor. This is due to the fact that a capacitor constitutes a low impedance element for a high-frequency signal.

Furthermore, it was found out that the stability of such an power switch circuit is significantly better than that of a conventional circuit. The pre-charge capacitor constitutes a low-impedance element which largely de-couples the charging circuit from the power transistor the AIRBAG squib module. While in conventional circuits instabilities can arise from the fact that the driving circuit of the power transistor, the power transistor itself and the AIRBAG squib module (in other words, the load) form a third-order system which may be potentially unstable, a decoupling introduced by the pre-charge capacitance helps to avoid such instability. In contrast, poles of the charging circuit do no longer get combined with poles of the output circuit (comprising the power transistor and the AIRBAG squib module). Accordingly, it is sufficient to adjust the stability of the charging circuit and the stability of the output circuit independently.

In other words, it is no longer necessary to drive the power transistor with a one-pole driving stage. In contrast, due to the pre-charge capacitance the charging circuit can be considered (in a first and sufficiently precise approximation) an ideal voltage source, which reduces the order of the system to a second-order system, compared to a third-order system occurring in conventional solutions. The effort to make the second-order system stable is significantly lower than the effort to make a conventional higher-order system stable.

Besides, the presence of the pre-charge capacitance can help to avoid "ringing" effects occurring in conventional power switch circuits in the presence of inductances.

It should further be mentioned that the advantages of the present invention can be reached using a combination of the pre-charge capacitance and the controllable energy-coupling element. The combination of these two elements allows both a high degree of stability and a sufficiently fast switching speed.

In one embodiment, the energy-coupling element can be a switch or controllable buffer. For example, the energy-coupling element may preferably be a MOS switch. Both a switch or a controllable buffer are adapted to transfer the charge stored on the pre-charge capacitance to the control electrode of the power transistor very efficiently. Furthermore, both the buffer and the switch have a sufficiently small resistance so that they do not severely degrade the transient response of the power switch circuit. In other words, a switch or a controllable buffer allow for a sufficiently strong coupling between the control electrode of the power transistor and the pre-charge capacitance. A switch, for example a MOS switch, can be designed very easily, using, for example, one or two field-effect transistors and biasing the respective gate terminals appropriately to switch on and to switch off the drain-source path or paths. A controllable buffer may further introduce some level-shifting. A controllable buffer may also contribute to further isolate the charging circuit from the power transistor and the load circuit comprising the squib module.

Besides, it may be preferred that the power transistor is a power-MOS field-effect transistor. In this case, the first electrode may be preferably the drain electrode of the power-MOS field-effect transistor and the second electrode is the source electrode of the power-MOS field-effect transistor. Further, the control electrode can be preferably a gate electrode of the power-MOS field-effect transistor. It has been found that a MOS field-effect transistor (or power MOS field-effect transistor) is particularly advantageous for use as a power transistor. Further, a MOS field-effect transistor can be advantageously controlled by a charge on the gate electrode which can be provided by the pre-charge capacitance. In other words, the pre-charge capacitor is very well-suited as a counterpart to the gate-source capacitance of the MOS field-effect transistor. Furthermore, the MOS field-effect transistor does not need a drive current in a stationary mode of operation. This can help to relax the requirements with respect to the charging circuit and reduce the overall current consumption.

In one embodiment, the second electrode of the pre-charge capacitance may be connected to a fixed potential. For example, the fixed potential may be the reference potential. Accordingly, the pre-charge capacitance can help to stabilize the potential at the control electrode of the power transistor at a fixed value. Therefore, with the power transistor operating in a source-follower or emitter-follower mode of operation, a voltage at the source terminal or emitter terminal of the power transistor can be stabilized with respect to the fixed potential. As a consequence, a fast transit response of the power switch circuit can be achieved, which ensures that the voltage provided to the squib module returns to a desired value very fast after a load change.

Furthermore, it may be preferred that the charger comprises a voltage regulator adapted to adjust the potential at the first electrode of the capacitance to a predetermined value based on a reference voltage. Accordingly, the pre-charge capacitor can be charged to a predetermined voltage, which again contributes to a precise regulation of the voltage supplied to the squib module. The voltage regulator can, for example, be a voltage follower using a reference voltage, wherein the reference voltage can be generated by a bandgap voltage source, a zener diode or any other voltage source (or reference voltage source). Furthermore, the voltage follower can be adapted to scale the reference voltage, which can, for example, be achieved by an appropriate circuit comprising an operational amplifier. In other words, the charging circuit may comprise an operational amplifier, the output of which is coupled with the pre-charge capacitance. Using an operational amplifier can be particularly advantageous as the operational amplifier can be implemented easily and provides a very high accuracy of the output voltage. Also, using the concept comprising the pre-charge capacitor and the controllable energy-coupling element, an operational amplifier may be used without running into stability problems, while serious stability issues are known from the prior-art solutions.

Using an operational amplifier it may also be possible to define an adjustable voltage regulator for charging the pre-charge capacitor and for controlling the power transistor. Accordingly, the voltage provided to the squib module can be adjusted, which may be advantageous in order to adapt the circuit to different squib module technologies in order to perform diagnosis functions.

The charging circuit may also comprise a charge pump coupled to the pre-charge capacitance and adapted to drive the potential at the first electrode of the pre-charge capacitance to a potential level higher than the supply potential of the charging circuit. Consequently, the usage of a charge pump may allow overcoming restrictions in the relation between the power transistor characteristics, the supply voltage of the charging circuit and the voltage supplied to the AIRBAG squib module. By using a charge pump, the potential provided to the pre-charge capacitance and finally to the control terminal (or input terminal) of the power transistor may not be limited by the supply voltage of the charging circuit. Therefore, the charging circuit can be supplied with a voltage lower than the voltage to be provided to the AIRBAG squib module. This may be advantageous as it may be easier to stabilize a low supply voltage rather than the typically high supply voltage for the AIRBAG squib module. Also, strong load-induced variations may occur on the supply voltage which is powering the AIRBAG squib module, so that the usage of a lower supply voltage in combination with a charge pump for charging the pre-charge capacitor may bring along big advantages. Furthermore, if a power-MOS field-effect transistor is used as the power transistor, a threshold voltage of the power-MOS field-effect transistor may be determined by technological requirements. However, the threshold voltage typically may determine a minimum potential difference between the gate terminal and the source terminal of the power-MOS field-effect transistor necessary in order to provide a source current. If the threshold voltage is large, it may be necessary to provide a relatively high gate voltage (possibly higher than the supply voltage for the airbag squib) to the gate terminal of the power-MOS field-effect transistor in order to yield a sufficient voltage at the source terminal of the power-MOS field-effect transistor. If the requirement is such that the gate potential has to be higher than the highest available supply potential, then a charge pump may even be required.

The charger circuit may further comprise a diode connected between a supply potential of the charger (charging circuit). The diode is connected in order to charge the pre-charge capacitance based on the supply potential of the charging circuit if the supply potential of the charging circuit is higher than the potential at the first terminal of the pre-charge capacitance. Besides, the diode is adapted to be in the blocking state if the supply potential of the charging circuit is insufficient to charge the pre-charge capacitance. In other words, the diode may be used as a very simple charging circuit for the pre-charge capacitor which can still avoid that the pre-charge capacitance is discharged if the supply voltage of the charging circuit is insufficient. The combination of the diode and the pre-charge capacitance brings along another significant security feature, as the pre-charge capacitance will be able to provide energy to the control terminal of the power transistor even if the supply potential of the charging circuit is insufficient or disconnected. So, the power transistor can even be activated (put into the conducting state) in the absence of a sufficient supply potential for the charging circuit. It should further be noted here that the supply potential of the charging circuit may be identical with the supply potential from which the AIRBAG squib module is supplied if the power transistor is in a conductive state, or may be a different potential.

In a further embodiment the charging circuit can be adapted to provide a current to charge the pre-charge capacitance either in a voltage-limited mode of operation, wherein the charging current is primarily limited by an output impedance of a voltage-providing circuit, or in a current controlled mode, wherein the current for charging the pre-charge capacitance is provided by a current source contained in the charging circuit. In the voltage-limited mode of operation, the pre-charge capacitance can be charged particularly fast, as there is no explicit current limitation applied in the charging. Accordingly it can be ensured that the pre-charge capacitor reaches its desired steady-state value as fast as possible. However, as soon as the pre-charge capacitance has reached its steady-state value, it is only necessary to compensate for charge losses and to compensate for charge variations due to load changes. It was found out that the latter functionality can be reached best by providing a current to the pre-charge capacitance using a current source. It was found that the high output impedance of the current source when compared to a typically low impedance of a voltage-providing circuit can result in a particularly stable operation. Also, a current source typically introduces less parasitic effects than a voltage source. Furthermore, providing a current to the pre-charge capacitor in a current-controlled mode of operation can also be advantageous when performing diagnosis of the power switch, as the usage of a current source for providing the current to the pre-charge capacitor results in a very well-defined transient response when the power transistor (power switch) transitions between different states. This allows a simple identification of any defective elements.

In another embodiment the charging circuit can be adapted to provide a current to charge the pre-charge capacitance in a first mode of operation, and to provide a current to discharge the pre-charge capacitance in a second mode of operation. Such a charging circuit is particularly advantageous as it was found that providing a current to discharge the pre-charge capacitance offers the chance to implement advanced diagnosis methods to detect any defective circuit elements.

In another embodiment the power switch circuit further may comprise a control logic adapted to control the operation of the power switch circuit, wherein the control logic is adapted to control the charging circuit to provide a current charging the pre-charge capacitance in a stand-by mode, to provide a current discharging the pre-charge capacitance for a predetermined period of time after a transition from the stand-by mode to a firing mode, and to provide a current charging the capacitor after the predetermined period of time has elapsed (provided the power switch circuit remains in firing mode). Furthermore, the control logic can be preferably adapted to switch the energy-coupling element to a conducting state in the firing mode and to a non-conducting state in the stand-by mode, wherein the energy-coupling element is adapted to provide energy (in the form of charge) from the pre-charge capacitance to the control input of the power transistor in the conducting state. The energy-coupling element may be further preferably adapted to isolate the pre-charge capacitance from the control electrode of the power transistor in the non-conducting state.

In other words, it was found that it might be advantageous to discharge the pre-charge capacitance for a predetermined period of time when the power switch circuit transitions from the stand-by mode to the firing mode. In other words, the direction of the current provided by the charging circuit to the pre-charge capacitance is changed for the predetermined period in time after the transition from stand-by to firing mode. It should further be noted that in the firing mode (i.e. as soon as the power transistor is put into the conductive state by switching the controllable energy-coupling element to the conductive state) the voltage at the pre-charge capacitance is reflected by a voltage at the AIRBAG squib module, because in the firing mode the power transistor may preferably act as an emitter-follower or a source-follower. Accordingly, measuring the voltage at the AIRBAG squib module allows deriving from that the voltage at the pre-charge capacitance. When applying a current discharging the pre-charge capacitance it can be ensured that in the absence of the pre-charge capacitance (i.e. if the pre-charge capacitance is either defective or disconnected) the voltage at the AIRBAG squib module will be very small at least for the predetermined period in time. This is due to the fact that a current directed to discharge the pre-charge capacitance will effectively remove charge from the control terminal of the power transistor (while a current directed to charge the pre-charge capacitance would add charge to the control terminal of the power transistor). So, a current directed to discharge the pre-charge capacitance will switch off (or keep switched off) the power transistor as soon as the controllable energy-coupling element is put into the conductive state. On the other side, if the pre-charge capacitance is present the current directed to discharge the pre-charge capacitance will only slightly reduce the charge of the pre-charge capacitance but will not have a strong impact on the overall circuit functionality. This is particularly true if the predetermined period in time is chosen such that the charge sunk from the pre-charge capacitance during the predetermined time is smaller than the charge stored on the pre-charge capacitance at the point in time of switching from the stand-by mode to the firing mode.

In another embodiment the control logic and the charging circuit can be adapted such that the charging circuit provides a current to charge the pre-charge capacitance in a voltage-limited mode of operation in the stand-by mode, wherein the current provided by the charging circuit is primarily limited by an output impedance of a voltage-providing circuit in the voltage-limited mode of operation. Furthermore, the control logic and the charging circuit may be preferably adapted to provide a current to discharge the pre-charge capacitance during the predetermined period of time after the transition from the stand-by mode to the firing mode. Besides, the charging circuit can be preferably controlled to provide a current to charge the pre-charge capacitance in a current-controlled mode after the predetermined period of time has elapsed, wherein the current provided by the charging circuit is determined by a current source in the current-controlled mode. In other words, in the stand-by mode the pre-charge capacitance is charged as fast as possible in the voltage-limited mode by a voltage-providing circuit, while the capacitance is charged in the current-controlled mode after the predetermined period of time has elapsed after the transition to the firing mode. So, different charging modes are used in the stand-by mode and in the firing mode in order to adapt the charging to the respective required conditions in the stand-by mode and the charging mode. In the stand-by mode charging should be performed as fast as possible, whereas in the firing mode a fast transient response and circuit stability are the key requirements. It should be noted that in the stand-by mode the charging circuit provides a low impedance (the impedance of the voltage-providing circuit), which is necessary for fast charging of the pre-charge capacitance. In contrast, in firing mode the charging circuit has the high low-frequency impedance (DC-impedance) of the current source. This high impedance results in a very good decoupling between the control terminal of the power transistor and the charging circuit, and accordingly helps to improve stability.

In another embodiment the charging circuit may comprise a first current source coupled with the pre-charge capacitance and adapted to charge the pre-charge capacitance with a first current, and a second current source that can be activated or deactivated. The second current source can be adapted to discharge the pre-charge capacitance by sinking a second current if the second current source is activated. This first current source and the second current source can be preferably coupled in such a way that the first current and the second current are in a predetermined relationship, wherein the first current source and the second current source are adapted such that an absolute magnitude of the first current is smaller than the absolute magnitude of the second current. In other words, the charging circuit provides two current sources which are coupled, wherein the first current source charges the pre-charge capacitance and the other current source is connected to discharge the pre-charge capacitance. Furthermore, the first current source and the second current source can both be activated at the same time, wherein the second current source can be activated and deactivated. Accordingly, if only the first current source is active the capacitance is charged. In contrast, if the second capacitance is also activated, the pre-charge capacitance is discharged as the absolute magnitude of the current of the second current source is larger than the absolute magnitude of the current of the first current source. Furthermore, by coupling the first current source and the second current source such that the first and the second current are in a predetermined relationship allows ensuring that the pre-charge capacitance is discharged if both the first current source and the second current source are active, even in the case of process tolerances. Furthermore, it can be ensured that the charging current and the discharging current provided to the pre-charge capacitance are in a known and predetermined relationship independent of process tolerances which may be very useful for performing diagnosis of the power switch circuit. Besides, it should be noted that a predetermined relationship of the first current and the second current can, for example, be achieved by appropriately choosing geometric parameters of field-effect transistors (like a channel width) if the first current source and the second current source are realized by field-effect transistors.

Furthermore, the charging circuit may comprise a voltage-providing circuit for providing a voltage and a multiplexer for alternatively connecting an output of the voltage-providing circuit to the capacitance or to a supply terminal of the first current source. Furthermore, the charging circuit may comprise a control logic for connecting the output of the voltage-providing circuit to the capacitance if the energy-coupling element is in a non-conducting state (e.g. in the stand-by mode), and to connect the voltage-providing circuit to the supply terminal of the first current source if the energy-coupling element in a conducting state (e.g. in the firing mode). In this configuration, the first current source can efficiently be activated and deactivated. If the multiplexer is switched to connect the output of the voltage-providing circuit to the capacitance, the first current source is deactivated. In this way it can be avoided that a current is sunk from the pre-charge capacitance as long as the pre-charge capacitance is directly connected to the voltage-providing circuit. In this way, an unnecessary loading of the voltage-providing circuit can be avoided, which would reduce the speed at which the pre-charge capacitance can be charged. On the other hand, it is advantageous to use the voltage output by the voltage-providing circuit as a supply voltage for the first current source, as this allows charging the capacitance to the same steady-state voltage both by directly connecting the pre-charge capacitance to the voltage-providing circuit and using the first current source. Accordingly, an identical steady-state voltage can be obtained in both operation modes (i.e. in stand-by mode and firing mode). The voltage of the pre-charge capacitance is always regulated out to the same steady-state value due to the saturation characteristic of a current source.

The second current source may preferably be connected between the first terminal of the pre-charge capacitance and the reference potential. With the potential provided by the voltage-provider circuit being different from the reference potential, the pre-charge capacitance can be charged if it is directly connected to the output of the voltage-provider circuit or if the first current source is active and the second current source is deactivated. The pre-charge capacitance can be discharged if the second current source is active.

In another embodiment the charging circuit can be adapted such that the first current and the second current are both derived from the same reference current or reference voltage, and at least one current mirror is used in order to achieve that a fixed base potential of the first current source is different from a fixed base potential of the second current source. Such a circuit may have advantages as the base potentials of the first current source and the second current source should preferably be different in order to allow charging and discharging of the capacitance. It was further found out that the different base potentials of the first current source and the second current source can be reached by a current mirror circuit, wherein it can be ensured that the first current and the second current are still in a predetermined relationship.

A particularly good operation of the circuit can be achieved if the charging circuit is adapted such that the magnitude of the second current is at least 1.1 times the magnitude of the first current and not larger than 20 times the magnitude of the first current. This is due to the fact that the first and the second current determine time constants for charging and discharging the pre-charge capacitance. These time constants may be evaluated in a self diagnosis of the power switch circuit. It was found that the diagnosis can be achieved best if the currents are in the above-mentioned relationship.

An embodiment may comprise a voltage-monitoring circuit for monitoring a potential in a load circuit of the power transistor at a point in time when the charging circuit is providing a current to discharge the pre-charge capacitance, and to determine, based on the potential in the load circuit, whether the capacitance is damaged (or disconnected). In other words, the voltage-monitoring circuit provides a means for a self diagnosis and for identifying whether the pre-charge capacitance is defective or not. The voltage-monitoring circuit may, for example, monitor a voltage at a terminal of the power transistor connected to the AIRBAG squib module or to a squib module control element. Besides, it should be noted that the voltage-monitoring circuit can also determine whether the pre-charge capacitance is present or not, wherein it is assumed that the pre-charge capacitance is defective if the voltage-monitoring circuit finds out that the pre-charge capacitance is not present.

In another embodiment, the power switch circuit further may comprise a second switch connected between a control electrode of the power transistor and the second electrode of the power transistor in order to ensure that the power transistor does not pass the current through the path between first electrode and the second electrode (i.e. through the collector-emitter path or the drain-source path) if the second switch is closed. In other words, the second switch constitutes a security switch which short-circuits a control path (e.g. a base emitter path or a gate source path) of the power transistor. Accordingly, if the second switch is closed the AIRBAG squib module cannot be supplied over the power transistor. In this way, an inflation of the AIRBAG can be prevented, which is an important security feature in a power switch circuit for driving an AIRBAG squib module. The security feature can be supported by a control circuit adapted to close the second switch when the energy-coupling element is inactive (e.g. in stand-by mode) and to open the second switch when the coupling element is in a conducting state (e.g. in the firing mode).

Furthermore, the squib can be connected in series with at least a high-side transistor and a low-side transistor between the second terminal of the power transistor and the reference potential. In this way, the power transistor can act both as a voltage-regulating element and a protective circuit for the AIRBAG squib module. Furthermore, the power transistor may consume a large portion of the power dissipation when the squib is ignited, so that the high-side transistor and the low-side transistor do not need to be designed to have a very large thermal capacity. Also, using the power transistor in combination with a high-side transistor and a low-side transistor, the functionalities of a protective switch and the ignition of the squib itself can be separated in different semiconductor devices. This increases safety and further brings along the possibility for extensive process diagnosis of the whole system.

In another embodiment the power switch further may comprise an auxiliary voltage source coupled to the second terminal of the power transistor. The auxiliary power source provides further diagnosis features to the power switch circuit. Even if the power transistor is in a non-conductive state, a well-defined voltage can be applied to the second terminal of the power transistor, which is typically coupled with the AIRBAG firing squib (either directly or over at least one further switching element, a high-side switch or a low-side switch). The diagnosis voltage may, for example, be used to measure the resistivity of the squib or to test additional transistors (e.g. a high-side switch and/or a low side switch) connected in series with the squib between the second terminal of the power transistor and the reference potential. Such tests can be performed without the power transistor being switched on. It is assumed that the power transistor comprises a security function (e.g. a switch short-circuiting the control electrode with the first electrode or with the second electrode), and that the auxiliary voltage source is chosen such that, even if the auxiliary voltage source is activated, the squib can only be ignited if the power transistor is in a conductive state. Therefore, a very safe diagnostic procedure can be performed by means of the auxiliary voltage source.

The voltage of the auxiliary voltage source can be provided to the squib and potentially to any further switch element circuited between the power transistor and the reference potential without running the risk that the squib is unintentionally fired.

The auxiliary power source may be adapted to regulate the voltage at the second terminal of the power transistor in a closed loop mode. In other words, the auxiliary voltage source may sense the voltage at the second terminal of the power transistor and comprise a closed regulator loop. This allows providing a very well-defined voltage at the second terminal of the power transistor for diagnosis purposes. Also, the voltage can be regulated to such a value that the squib cannot be ignited from the voltage provided by the auxiliary voltage source.

As was mentioned, the voltage of the auxiliary voltage source can be preferably adapted such that the squib connected between the second terminal of the power transistor and the reference potential cannot be ignited if the power transistor is not in the conductive state. As a further option, the auxiliary voltage source may comprise a current limiter adapted to limit the current in such a way that the squib connected between the second terminal of the power transistor and the reference potential cannot be ignited by the maximum current provided by the auxiliary current source. In other words, a high voltage may be provided to the load circuit between the second terminal of the power transistor and the reference potential which would theoretically be sufficient to ignite the squib. However, if the load circuit path is intentionally or unintentionally closed, then the voltage provided by the auxiliary voltage source will automatically be reduced due to the current limiter such as to avoid an ignition of the squib. Therefore, tests of additional switch elements connected between the second terminal of the power transistor and the reference potential can be performed with a high voltage if only a very small current is flowing. Such a case may, for example, occur if two switching elements (e.g. a high-side driver and a low-side driver) are connected in series with the squib, and only one of the switching elements is activated. In this case, realistic voltage conditions may be present, but still the current is limited to a very small value.

In other words, the embodiment may comprise a control logic for activating the high-side switch and/or the low-side switch when the power transistor is not in the conducting mode. Furthermore, the power switch circuit comprises a test circuit for measuring at least one voltage in the load circuit between the second electrode of the power transistor and the reference potential, and for obtaining information on the integrity of the load circuit comprising the high-side transistor, the low-side transistor and the squib from the voltage measured in the load circuit.

It should also be noted that in another embodiment the present invention may comprise a load capacitance connected between the second terminal of the power transistor and the reference potential. The power switch circuit further comprises a test circuit for evaluating the time response of a potential in the load circuit between the second terminal of the power transistor and the reference potential. For this purpose, the power transistor is switched to the non-conductive state. The test circuit can preferably be adapted to determine whether the load capacitance is defective by evaluating the time response of the respective potential in the load circuit. For example, the test circuit may use a time constant of the measured potential (or voltage) and/or a voltage present after a predetermined time to make a decision whether the load capacitance is defective or not.

FIG. 1 shows a block schematic diagram of an power switch circuit according to a first embodiment. The circuit of FIG. 1 is designated in its entirety with 100. A power transistor 110 is the central element of the power switch circuit 100. A first terminal E1 of the power transistor 110 is coupled with a supply potential $V_{SUP}$, and a second terminal E2 of the power transistor 110 is coupled with a squib module 120. The squib module 120 is further coupled with a reference potential $V_{REF}$. In other words, the power transistor 110 (or the load path thereof) is connected in series with the squib module 120 between the supply potential $V_{SUP}$ and the reference potential $V_{REF}$. Furthermore, a control terminal 124 of the power transistor 110 is coupled with a pre-charge capacitor $C_{PC}$ 130 over a controllable energy-coupling element 134. The controllable energy-coupling element 134 is further adapted to receive a control signal 138, e.g. from a microcontroller. Besides, the pre-charge capacitance 130 is coupled with a charging circuit 140.

It can be preferred that a first terminal of the pre-charge capacitance 130 is coupled both to the charging circuit 140 and to the controllable energy-coupling element 134, while a second terminal of the pre-charge capacitance is connected to a fixed potential, for example to the reference potential $V_{REF}$.

Based on the above structural description, the operation of the power switch circuit will be described in detail below.

It is the objective of the circuit 100 to provide a stable power switch circuit with a fast transient response for controllably supplying the squib module 120 with electric energy. For this purpose, an appropriate control signal is generated and applied to the control terminal 124 of the power transistor 110. A charging circuit 140 charges the pre-charge capacitance 130 to a predetermined voltage. If the pre-charge capacitance 130 is charged (i.e. is carrying a charge), the charge of the pre-charge capacitance 130 is available for transfer to the control electrode 124 of the power transistor. Accordingly, when the power transistor 110 is to be switched to a conducting state (i.e. when the power transistor 110 is to be activated), a part of the charge stored on the pre-charge capacitance 130 is transferred to the control electrode 124 of the power transistor 110 over the controllable energy-coupling element 134. As the controllable energy-coupling element 134 may preferably comprise a low on-state resistance the charge can be transferred from the pre-charge capacitance 130 to the control terminal 124 of the power transistor 110 very fast. However, if the capacitance value of the pre-charge capacitance 130 is sufficiently large, only a small variation of the voltage over the pre-charge capacitance 130 will be the result. On the other hand, if charge is transferred from the pre-charge capacitance 130 to the control electrode 124 of the power transistor 110, the power transistor 110 is ready to supply a certain amount of current to the squib module 120.

Besides, in order to compensate for the charge transferred from the pre-charge capacitance 130 to the control terminal 124 of power transistor 110, the charging circuit 140 may preferably recharge the pre-charge capacitance 130 by applying a current source or a voltage source (having a finite output impedance) to the pre-charge capacitance 130.

Furthermore, if the load of the power transistor 110, i.e. the current through the squib module 120, changes, the power transistor 110 typically reacts to such a load change by changing the voltage between the first terminal and the second terminal. In order to compensate for the load change (i.e. in order to bring back the potential at the second terminal E2 of the power transistor 110 to its original value), charge is exchanged between the pre-charge capacitance 130 and the control electrode 124 of the power transistor 110. In other words, a load change causes a current flow at the control electrode 124 of the power transistor 110, wherein the current is mainly provided by the pre-charge capacitance 130. Accordingly, the charging circuit 140 is strongly decoupled from any load changes due to the presence of the pre-charge capacitance 130.

The power switch circuit 100 brings along a number of advantages compared to a conventional power switch circuit. Firstly, using the circuit comprising a pre-charge capacitance 130, there is no need for a driving stage with a high current capability directly connected to the control terminal 124 of the power transistor. While in conventional circuits the control current (or charge) for switching on the power transistor must be provided directly by a transistor circuit, the current (or charge) for switching on the power transistor 110 is stored in the pre-charge capacitance 130 according to an embodiment. Consequently, the charging circuit 140 does not need to have a high current drive capability, as the pre-charge capacitance 130 can provide a high current whenever needed by the control terminal 124 of the power transistor 110. Furthermore, the pre-charge capacitance 130 also results in an advantageous transient response of the power switch circuit 100. Being a linear passive device, the pre-charge capacitance 130 does not introduce any distortions. Also, the pre-charge capacitance 130 can provide a current faster than conventional driver circuits and, unlike conventional circuits, does not introduce an unacceptable tendency for ringing or instability if a load change occurs at the power transistor 110.

Besides, the pre-charge capacitance 130 strongly decouples the charging circuit 140 from the power transistor 110. This improves the stability of the overall power switch circuit 100. Any poles introduced by the impulse response of the charging circuit 140 do not contribute to an instability of the overall power switch circuit 100. Accordingly, using the pre-charge capacitance 130 the power switch circuit can be made stable with much less effort than it is necessary in conventional circuits.

Also, it should be noted that the pre-charge capacitance 130 constitutes a safety mechanism. The pre-charge capacitance 130 constitutes an energy reservoir which is available even if the supply of the charging circuit 140 is interrupted. Accordingly, a triggering of the AIRBAG squib module 120 is even possible if the charging circuit 140 fails to be operative as a consequence of a crash event.

The circuit 100 can be modified remarkably. For example, the pre-charge capacitance 130 need not be connected to the reference potential $V_{REF}$ at its second terminal. In contrast, another potential which can be preferably fixed with respect to the reference potential $V_{REF}$ can be used. Furthermore, the controllable energy-coupling element 134 can be a switch or a controllable buffer. It should be noted here that a MOS switch can be implemented with particularly small effort. Therefore, such a solution can be preferred, while other circuits which can transfer a charge from the pre-charge capacitance 130 to the control electrode 124 of the power transistor 110 may also be used. The power transistor 110 may preferably be a power-MOS field-effect transistor. Assuming that the supply potential $V_{SUP}$ is positive with respect to the reference potential $V_{REF}$, an N channel power-MOS field-effect transistor may be preferred for the power transistor 110. In this case, the first electrode E1 connected to the supply potential $V_{SUP}$ is the drain electrode (also designated with D), while the second electrode E2 coupled with the squib module 120 is the source electrode (also designated with S). A gate electrode (also designated with G) is used as the control electrode 124. However, a complementary configuration (using complementary semiconductor types and complementary polarity of the voltages) may also be used.

Furthermore, the squib module 120 may comprise additional switch elements. For example, the squib module 120 may comprise a series connection of a high-side switch (e.g. a PMOS field-effect transistor), the squib itself and a low-side switch (e.g. an NMOS field-effect transistor). Furthermore, the squib module 120 may also comprise an additional load capacitor (designated as $C_L$) as well as some monitoring and/or self-test circuits. For example, the squib module 120 may have one or more connections to sense at least one potential occurring within the squib module 120.

In the following, it will be shown how the circuit can be developed starting from less elaborate circuits. Also, some characteristics of the circuit will be derived.

FIG. 2a shows a block schematic diagram of a first power switch circuit serving as a starting point for the design of the power switch circuit. The circuit shown in FIG. 2a is designated in its entirety with 200. Circuit 200 optionally comprises an interface unit 210 for providing an increased supply voltage $V_{BOOST}$ based on an input voltage $V_{IN}$. The increased supply voltage $V_{BOOST}$ is buffered in a reservoir capacitor 212 which has an equivalent series resistance (ESR) designated with 214. The increased supply voltage $V_{BOOST}$ can be considered to be a supply voltage for the airbag switch circuit, and is provided to a power-MOS switch 220 over a reverse diode 222. A gate electrode of the power-MOS switch 220 is directly controlled by a microcontroller 230. In other words, the microcontroller 230 drives the gate of the MOS path-transistor 220 directly.

Figure 19:
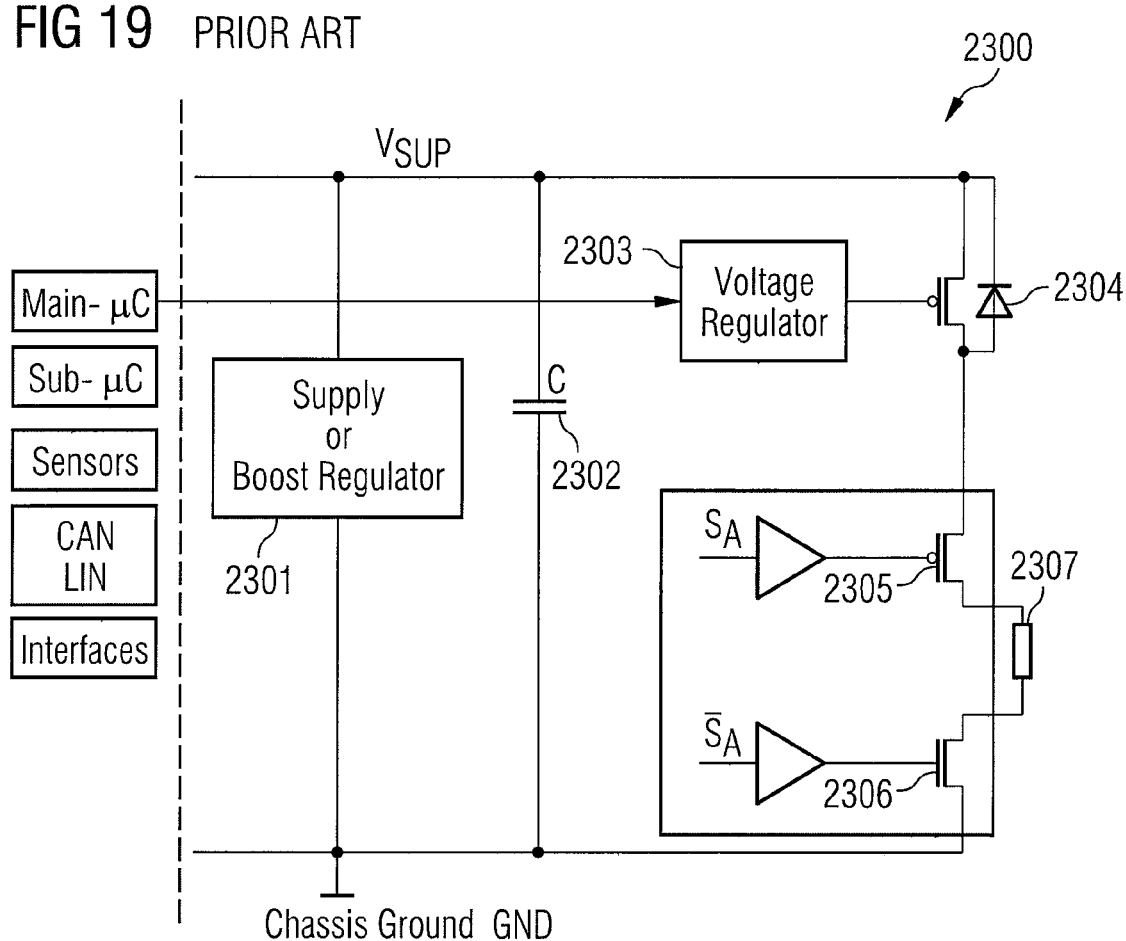
FIG. 19 is a block schematic diagram of a prior-art AIRBAG driver circuit.

The source terminal of the power-MOS switch 220 is connected with an output capacitor 234, wherein an equivalent series resistance (ESR) 236 is attributed to the output capacitor 234. The source terminal of the power-MOS switch 220 is further coupled to a firing squib 240. The firing squib 240 is connected with or embedded in a driver circuit 244. The driver circuit 244 may, for example, comprise a high-side switch and/or a low-side switch for firing the squib 240. Accordingly, the driver circuit 244 receives a driver control signal 248 from the microcontroller 230. For example, the firing squib 240 and the driver circuit 244 may be connected as already described with reference to FIG. 19 (cf. high-side transistor 2305, low-side transistor 2306 and squib 2307). It should further be noted that several similar firing squibs and/or driver circuits 244 can be connected in parallel between the source terminal of the power-MOS switch and the reference potential (or another fixed potential).

Figure 2B:
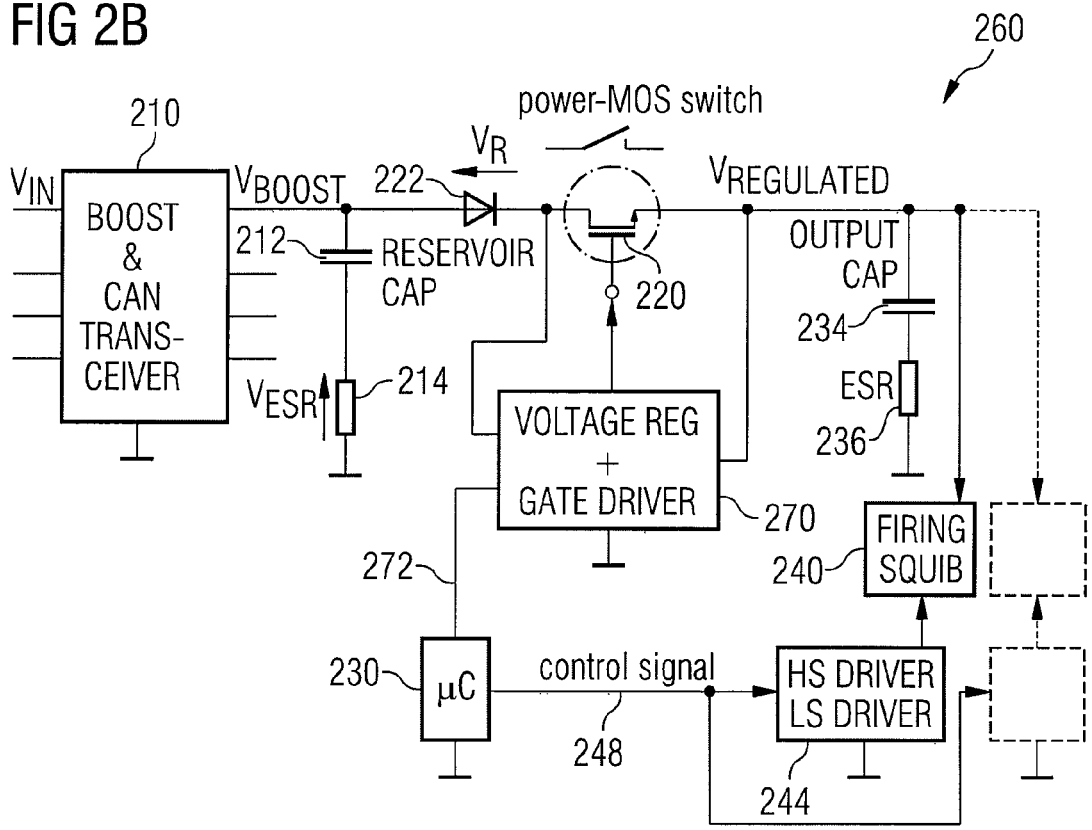

FIG. 2b shows a block schematic diagram of an second power switch circuit derived from the circuit of FIG. 2a. The circuit of FIG. 2b is designated in its entirety with 260. As circuits 200 and 260 are very similar, the same means are designated with the same reference numerals in both figures. Besides, it should be noted that the circuit 260 of FIG. 2b further comprises a voltage regulator block 270 driving the MOS gate electrode of the power-MOS switch 220. The voltage regulator block 270 receives a control signal 272 from the microcontroller 230. Furthermore, the voltage regulator block 270 may receive the voltage present at the drain terminal of the power-MOS switch 220 as a supply voltage. Besides, the voltage regulator block 270 may also provide a regulated voltage to the source terminal of the power-MOS switch 220, as will be described in more detail below.

In the following, details on the voltage regulator and gate driver block 270 will be described.

Figure 3:
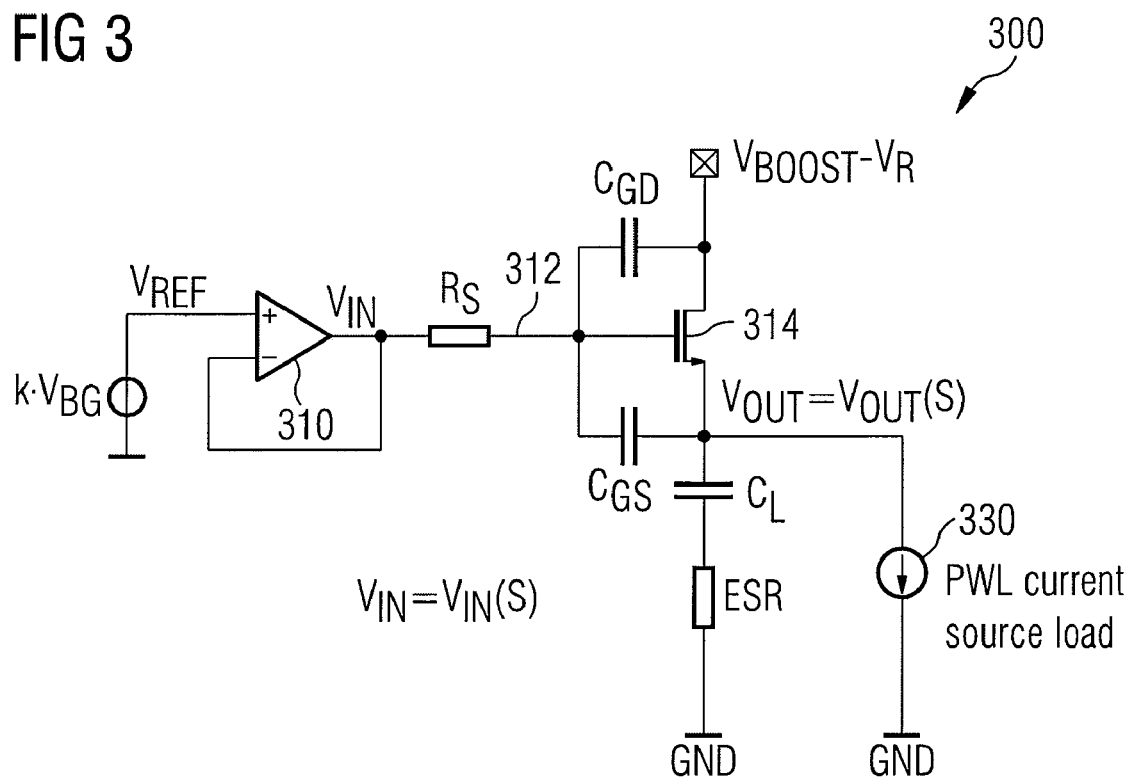
FIG. 3 is an equivalent circuit of a third power switch circuit serving as a starting point for the design of the power switch circuit.

FIG. 3 shows an equivalent circuit, the circuit serving as a starting point for the design of the power switch circuit. The equivalent circuit of FIG. 3 is designated in its entirety with 300. In other words, FIG. 3 shows a simple model of a power regulator block including a power-MOS transistor. An ideal buffer 310 (e.g. comprising an operational amplifier) regulates the gate voltage 312 of the power-MOS field-effect transistor 314 to a precise reference voltage value $V_{ref}$. The reference voltage $V_{ref}$ can, for example, be defined as $V_{ref}=\text{const}*V_{bandgap\_voltage}$. The bandgap voltage $V_{bandgap\_voltage}$ may be derived from a bandgap reference voltage source, and is also designated with $V_{BG}$. K is a constant. It should be noted that one of the most important parameters of the "driving+voltage regulator" system 300 can be in the simplest way modeled as an output resistance $R_S$. In other words, the output resistance $R_S$ describes imperfections of the buffer or voltage source 310.

Initial considerations are based on the idealized assumption that the block mentioned above (i.e. the ideal buffer 310, forming the "driving+voltage regulator" system) does not introduce any pole into the frequency response. Thus, the ideal buffer 310 is modeled as a voltage source.

Furthermore, the power-MOS switch 314 (in the shown circuit preferably a power NMOS field-effect transistor) is added to the above-mentioned simple initial model. Here, the main capacitances of the power-MOS switch 314, namely a gate-drain capacitance $C_{GD}$ and a gate-source capacitance $C_{GS}$, are considered, wherein the gate-drain capacitance $C_{GD}$ is modeled between the gate terminal and the drain terminal of the power-MOS switch 314. The gate-source capacitance $C_{GS}$ is modeled between the gate terminal of the power-MOS switch 314 and the source terminal of the power-MOS switch 314. Furthermore, an external capacitance (or load capacitance) $C_L$ is added to the equivalent circuit 300 together with a respective equivalent series resistance ESR. The external capacitance $C_L$ and the equivalent series resistance ESR are connected in series between the source terminal of the power-MOS switch 314 and the reference potential GND. It should further be noted that the equivalent series resistance of the external capacitance $C_L$ is considered negligible for initial considerations and calculations. Furthermore, the equivalent circuit 300 comprises an external load 330 connected between the source terminal of the power-MOS switch 314 and the reference potential GND. The external load 330 is considered as an ideal PWL-current-source-load. Besides, it should be noted that the drain terminal of the power-MOS switch 314 is connected to a supply potential. The supply potential is designated with "$V_{BOOST}-V_R$".

The model described by the equivalent circuit 300 can be studied considering it is a simple source-follower stage driven by a simple voltage generator with an output resistance $R_S$. Under this assumption, a transfer function between an input voltage $V_{in}(s)$ and an output voltage $V_{out}(s)$ can be calculated as follows:

$$\frac{V_{OUT}(s)}{V_{IN}(s)} = \frac{g_{m,MOS} + C_{GS} \cdot s}{R_S \cdot (C_{GS} \cdot C_L + C_{GS} \cdot C_{GD} + C_{GD} \cdot C_L) \cdot s^2 + (g_{m,MOS} \cdot R_S \cdot C_{GD} + C_L + C_{GS}) \cdot s + g_{m,MOS}} \quad \text{Equation (1)}$$

In the above formula, s is the complex parameter of the Laplace transform (with $s=\sigma+j\omega$), as well known to those skilled in the art. $g_{m,MOS}$ designates the transconductance of the power-MOS switch (or power MOS field-effect transistor). CGS, CGD, CL and RS designate the gate-source capacitance, the gate-drain capacitance, the load capacitance and the voltage source impedance, respectively, as described above.

As appears from the above formula, also designated as equation (1), the above-described equivalent circuit 300 is a second-order system, if we consider an ideal voltage generator and an ideal buffer stage. However, as soon as we introduce also the pole due to a real buffer stage into the considerations, the system becomes a third-order system, and so it becomes potentially unstable.

Also, it should be noted, that for the above described analysis the equivalent series resistance (ESR) of the output capacitor $C_L$ is initially neglected. However, as soon as we consider also the equivalent series resistance (ESR) due to the output capacitor contribute, we obtain a more complex transfer function with two left half plane zeros, wherein the second zero is due to the equivalent series resistance. The system becomes a third order system, as can be seen from the denominator of the complete formula (transfer function) shown below:

$$\frac{V_{OUT}(s)}{V_{IN}(s)} = \frac{(1 + s \cdot C_L \cdot ESR) \cdot (1 + sC_{GS}/g_{m,MOS})}{s^3 \cdot \left(C_L \cdot C_{GD} \cdot C_{GS} \cdot \frac{R_S ESR}{g_m}\right) + s^2 \cdot \left(\begin{array}{c} R_S \cdot ESR \cdot C_L \cdot C_{GD} + \\ \frac{C_{GS}}{g_{m,MOS}}(R_S \cdot C_{GD} + ESR \cdot C_L) + \\ \frac{C_L \cdot R_S(C_{GS} + C_{GD})}{g_{m,MOS}} \end{array}\right) + s\left(\begin{array}{c} R_S C_{GD} + ESR \cdot C_L + \frac{C_{GS}}{g_{m,MOS}} + \\ \frac{C_L R_{L,MIN} + R_S C_{GS} + R_S C_{GD}}{g_{m,MOS} \cdot R_{L,MIN}} \end{array}\right) + \left(1 + \frac{1}{g_{m,MOS} R_{L,MIN}}\right)} \quad \text{Equation (2)}$$

The formula shown here, taking into account the equivalent series resistance ESR of the output capacitance $C_L$, is designated as equation (2). Same symbols are used in equation 2 as described with respect to equation 1. It should also be noted, that a complete derivation of equations (1) and (2) will be given below.

Starting from the circuit 300 shown in FIG. 3, it was found that in order to make the circuit stable and reliable the output resistance $R_s$ should be minimized. By minimizing the output resistance $R_S$, the order of the denominator of the transfer function shown in equation (1) can be reduced, as can be seen from equation (1). Similar considerations also apply in view of equation (2). In other words, we are looking for minimizing the output impedance $R_S$ of the driving stage driving the gate of the power-MOS switch 314 (represented here, for example, by a power-NMOS field-effect transistor). The output impedance $R_S$ of the driving stage could, for example, be reduced by using a class-AB stage. However, designing a class-AB stage would require great care in order to achieve a sufficiently high current capability and in order to design the class-AB stage with only one very well-controlled pole. A high current capability is necessary to drive the gate of a large power-MOS switch sufficiently fast. Furthermore, the presence of only one very well-controlled pole is necessary in order to allow a combination of the class-AB stage with the power-MOS switch circuit. In other words, the class-AB stage may only have one very well-controlled pole in order to manage it together with the rest of the transfer function.

However, a main drawback of using a class-AB stage is related to the step response. It was found that it is very difficult to make the step response fast enough to fulfill the extremely stringent specifications requested for new AIRBAG systems. Another secondary effect on the transient response will also be a ringing of the time response due to parasitic inductances representing cable connections, bond wires and metal paths on the board. It was found that it is difficult to eliminate ringing using a class-AB stage.

Figure 4A:
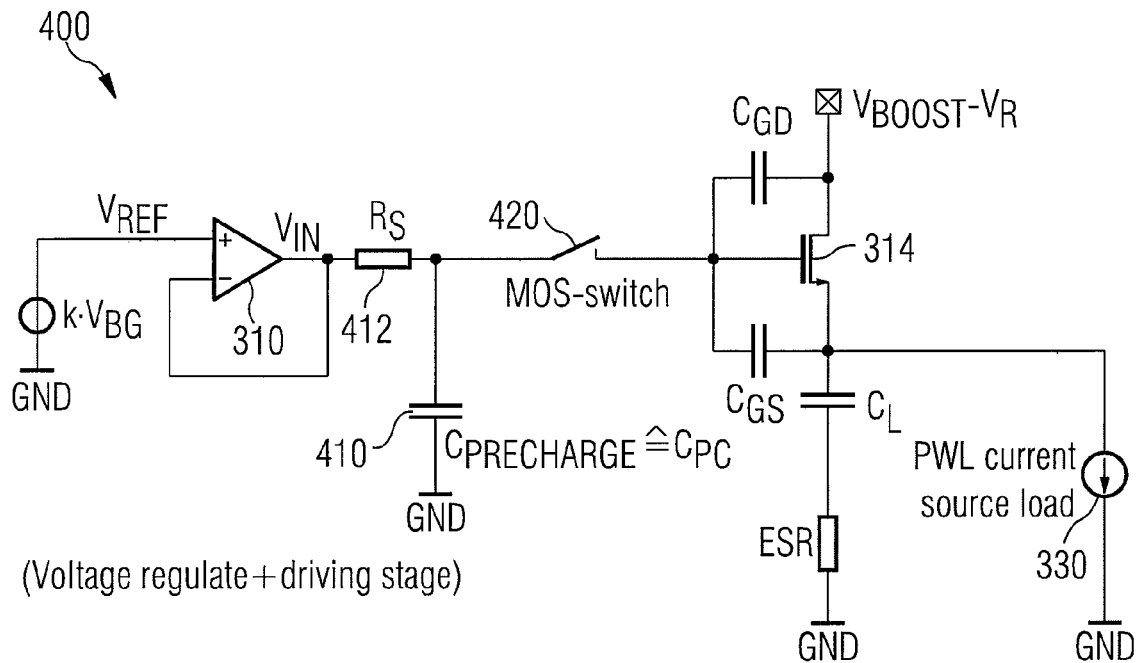
FIG. 4a is a schematic of a power switch circuit according to a second embodiment.

In view of the above-mentioned difficulties, FIG. 4a shows a schematic diagram of an power switch circuit according to a second embodiment. The circuit shown in FIG. 4a is designated in its entirety with 400. It should be noted here that the circuit 400 is similar to the circuit 300, so that the same means are designated with the same reference signs and will not be explained again here. However, a major difference can be seen between the power switch circuit 300 and the power switch circuit 400 with respect to the drive circuitry for the gate electrode of the power-MOS switch 314. The circuit 400 comprises a pre-charge capacitance $C_{PC}$ 410. A first terminal of the pre-charge capacitance 410 is connected with the output of the buffer 310. The buffer 310 is modeled here in combination with a parasitic resistance $R_S$ 412 describing an output impedance of the buffer 310. It should be noted here that in an actual implementation the resistance 412 will not explicitly be included. In contrast, for an actual implementation the resistance 412 merely represents a parasitic but not an actual circuit element. It should further be noted that the buffer 310 represents any kind of a charging circuit which may provide a charge to the pre-charge capacitance 410. In other words, the buffer 310 and the parasitic resistance 412 in FIG. 4a may be replaced by a voltage source and/or a current source charging and/or discharging the pre-charge capacitance 410.

The first electrode of the pre-charge capacitance 410 is further coupled to the gate electrode of the MOS switch 314 over a second MOS switch 420. The second MOS switch 420 can be opened and closed, and can therefore alternatively connect the pre-charge capacitance 410 with the gate terminal of the power-MOS switch 314 or separate the pre-charge capacitance 410 from the gate terminal of the power-MOS switch 314.

It should be noted here that the second MOS switch 420 may also be replaced by a buffer as will, for example, be described with reference to FIGS. 5a and 6. Furthermore, the power-MOS switch 314 may, for example, be a power-NMOS field-effect transistor or a power-PMOS field-effect transistor or any other form of a controllable power switch. Even a bipolar transistor could be used as the power-MOS switch 314 in some embodiments.

It should further be noted that a second terminal of the pre-charge capacitance 410 is connected to a reference potential (or ground potential) here. However, the second terminal of the pre-charge capacitance 410 could also be connected to another fixed potential.

Besides, it should be noted that in real applications the PWL current source load 330 would be replaced by an AIRBAG squib module, possibly comprising further switch elements like, for example, a high-side field-effect transistor and/or a low-side field-effect transistor.

With respect to the operation of the circuit 400, it should be noted that the control MOS switch 420 (also designated as second MOS switch) with a low on-state resistance $R_{sat}$ is connected in series between the pre-charge capacitance 410 and the gate electrode of the power-MOS switch 314 in order to couple the desired regulation voltage information stored in the pre-charge capacitance 410 to the gate of the power-MOS switch 314 only when the system is in the firing condition and when it is really needed to pre-charge the gate of the power-MOS switch 314 to the operating "firing" gate voltage.

In other words, an AIRBAG control system comprising the power switch circuit 400 typically comprises at least two states, namely a stand-by mode and a firing mode. The control circuit, typically implemented as a microcontroller, determines which of the modes the system should exhibit. Typically, the stand-by mode is taken over, if it is assumed that a firing of the AIRBAG need not be performed. In contrast, the microcontroller may switch the AIRBAG control system to the firing mode, if it is assumed that inflation of the AIRBAG will be necessary (or, at least, may be necessary) in an overseeable time interval. Furthermore, transitions between the stand-by mode and the firing mode may also be performed during a self diagnosis procedure intended to check the AIRBAG control system. However, with respect to the circuit 400, it may be noted that in the stand-by mode, when an ignition of the AIRBAG squib module does not need to be performed within a certain time interval, the second MOS switch 420 can be preferably switched to the open (i.e. non-conductive) state. In contrast, in the firing mode, when it is expected that the squib will be ignited within an overseeable time interval, the MOS switch 420 can be preferably brought into a closed (i.e. conductive) state.

In other words, apart from an optional self diagnosis mode, the pre-charge capacitance 410 is only coupled to the gate of the power-MOS switch 314 over the closed (conductive) second MOS switch 420 if it is expected that the power-MOS switch 314 needs to provide a source current (to the squib module represented by the PWL current source load 330) within an overseeable time interval. A respective construction of the power switch circuit 400 realizes another security feature, because the power-MOS switch 314 is accordingly only conductive in the firing mode. However, on the other hand, the described concept exhibits the best results if the pre-charge capacitance 410 provides a charge to the gate terminal of the power-MOS switch very fast, which can be ensured by choosing the second MOS switch 420 such that it comprises a low ON-resistance.

Furthermore, it should be noted that the charge stored on the pre-charge capacitance 410 can be considered a voltage regulation information, because the power-MOS switch 314 may indeed act as a source-follower so that the voltage at the source terminal of the power-MOS switch 314 is dependent on the voltage at the gate terminal of the power-MOS switch 314 and accordingly is dependent on the potential at the first electrode of the pre-charge capacitance 410.

In the following, the advantages of the circuit 400 of FIG. 4a will be described. First of all, using the circuit 400 is not necessary to have a complicated class-AB driving stage to supply a current needed to pre-charge the gate electrode of the power-MOS switch 314, because the pre-charging current is already stored in the pre-charge capacitance 410. It was found that the circuit constitutes a very simple and efficient solution to the problem of providing the charge to the gate electrode of the power-MOS switch 314. Using the circuit 400 of FIG. 4a (rather than a conventional circuit) it is also not necessary to have a one-pole driving stage, as the poles of the driving stage do no longer endanger the stability of the power switch circuit. The voltage regulator block can therefore be represented by an ideal voltage follower block. For less precise systems, the voltage regulator block (represented by the ideal buffer 310 in combination with the parasitic resistance 412 in circuit 400) could also be a zero-order bandgap voltage, with a Zener chain, for example. Overall, using this approach the order of the system is reduced to a second-order system. Accordingly, less effort has to be taken to make the system stable and reliable when compared to previous "state of the art" systems.

Another feature of the circuit 400 is the fact that, related to the dimension of the pre-charge capacitance $C_{PC}$, we obtain a fixing of the gate voltage of the power-MOS switch 314 to a very stable DC and AC value. In this way, "fast ringing", which is unavoidable with conventional solutions, can be avoided (or at least reduced). Furthermore, the fastest possible transient response to a load variation can be obtained using the pre-charge capacitance 410.

It should further be noted that the advantages described above are based on the fact that using an circuit 400 it is not necessary to have a complicated class-AB driving stage and on the fact that the charging current is already stored in the pre-charge capacitance when the second MOS switch 420 is activated (put into the conductive state).

Figure 4B:
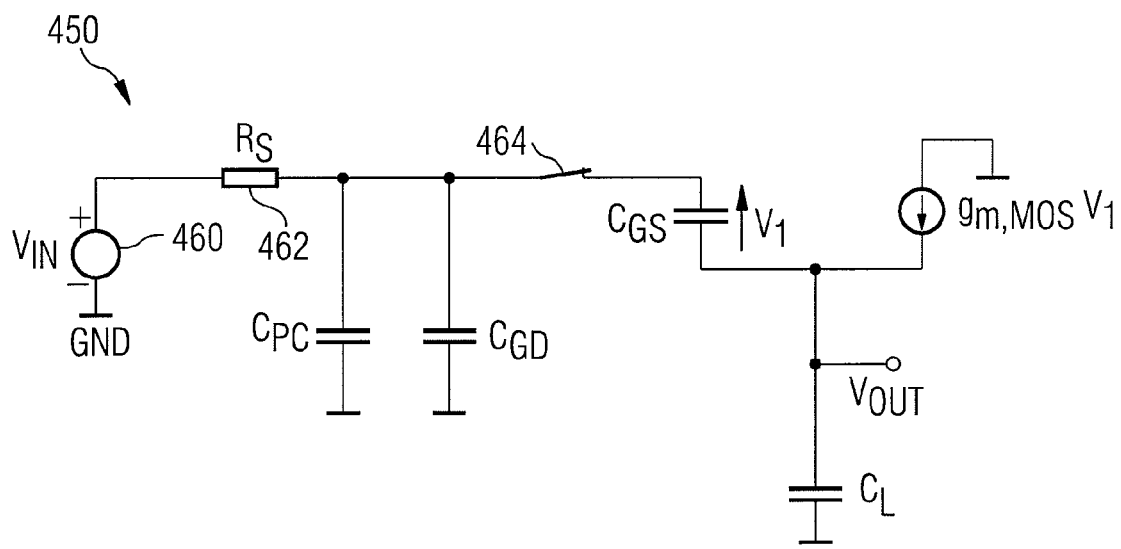
FIG. 4b is an equivalent circuit of the power switch circuit according to the second embodiment.

FIG. 4b shows an equivalent circuit of the power switch circuit according to the second embodiment. The equivalent circuit of FIG. 4b is designated in its entirety with 450. The voltage regulator and driving stage (comprising the operational amplifier 310 and the parasitic resistance 412) is modeled here as a constant voltage source 460 in series with an output impedance 462. The second MOS switch 420 is assumed to have a very low on-state resistance. The second MOS switch 420 is, therefore, modeled as a short circuit 464. The drain source path of the power-MOS switch 314 is modeled as a voltage controlled current source with transfer conductance $g_{m,MOS}$. A drain current of the power-MOS switch 314 is assumed to be proportional to the gate source voltage designated $V_1$. Furthermore, the gate source capacitance $C_{GS}$ and the gate drain capacitance $C_{GD}$ are included in the equivalent circuit 450, as shown. Also, the output capacitance $C_L$ is considered, wherein the equivalent series resistance ESR of the output capacitance $C_L$ is neglected. The derivation of the transfer function, calculated as the ratio between the output voltage $V_{out}(s)$ and the input voltage $V_{in}(s)$, is shown in the following.

For the calculation of the transfer function between $V_{in}$ and $V_{out}$ it is assumed that the pre-charge capacitance $C_{PC}$ is much larger than the gate drain capacitance $C_{GD}$. This can be expressed mathematically as:

$$C_{PC} + C_{GD} >> C_{GD} \quad (3)$$

Under this assumption, it can be concluded that for $$C_{PRECHARGE} \| C_{GD} = C_{PC} + C_{GD} \quad (4)$$

it can be written $$C_{PC} + C_{GD} \approx C_{PC} \quad (5)$$

Further calculation steps are shown below, along with the resulting transfer function (with reference to the equivalent circuit 450 of FIG. 4b).

$$(V_1 C_{GS} \cdot s + g_{m,MOS} V_1 = V_{OUT} C_L s) \rightarrow V_1 = \frac{V_{OUT} C_L s}{(g_{m,MOS} + C_{GS} s)}$$

$$\frac{(V_{IN} - V_1 - V_{OUT})}{R_S} = V_1 \cdot (C_{GS} s) + (V_1 + V_{OUT}) \cdot (C_{PC} + C_{GD}) s$$

$$\cong V_1 C_{GS} \cdot s + (V_1 + V_{OUT}) C_{PC} \cdot s$$

$$V_{IN} = V_1 + V_{OUT} + R_S [V_1 \cdot C_{GS} \cdot s + (V_1 + V_{OUT}) \cdot C_{PC} \cdot s]$$

$$\rightarrow V_{IN} = V_1 + V_{OUT} + R_S [V_1 C_{GS} + (V_1 + V_{OUT}) C_{PC}] \cdot s$$

-continued $$V_{IN} = V_{OUT} + R_S V_1 C_{GS} s + V_1 + R_S V_1 C_{PC} s + R_S V_{out} C_{PC} s$$

$$= V_{OUT} + R_S V_{OUT} C_{PC} s + V_1 (s R_S C_{GS} + 1 + R_S C_{PC} s)$$

$$= V_{OUT} (1 + R_S C_{PC} s) + \frac{V_{OUT} C_L s}{(g_{m,MOS} + C_{GS} s)} \cdot (1 + R_S (s C_{GS} + C_{PC} s))$$

$$V_{IN} = V_{OUT} \left( 1 + R_S C_{PC} s + \frac{C_L s}{(g_{m,MOS} + C_{GS} s)} + \frac{R_S C_L \cdot s (s C_{GS} + C_{PC} s)}{(g_{m,MOS} + C_{GS} s)} \right)$$

$$\frac{V_{OUT}}{V_{IN}} = \frac{(g_{m,MOS} + C_{GS} s)}{g_{m,MOS} + C_{GS} \cdot s + R_S g_{m,MOS} C_{PC} s + s^2 R_S C_{PC} C_{GS} + C_L s + R_S C_L C_{GS} s^2 + R_S C_L C_{PC} s^2}$$

$$\frac{V_{OUT}(s)}{V_{IN}(s)} = \frac{g_{m,MOS} + C_{GS} \cdot s}{R_S \cdot (C_{PC} \cdot C_{GS} + C_L \cdot C_{GS} + C_{PC} \cdot C_L) \cdot s^2 + (g_{m,MOS} \cdot R_S \cdot C_{PC} + C_L + C_{GS}) \cdot s + g_{m,MOS}}$$

It should also be noted that typically the pre-charge capacitance 410 is quite big and cannot be integrated. Accordingly, the pre-charge capacitance 410 is typically provided as an external capacitance even if the rest of the circuit is integrated on a wafer.

In the following, a further improvement of the circuit will be shown. It should be noted here that in many security-related systems the intended functionality can only be achieved because of a reservoir capacitance that guarantees that the system is working even if the main supply has been disconnected. In such security-related systems a periodic check of the presence of the reservoir capacitance has to be performed. The usual way to check the presence of a capacitor is to sink a current from the capacitor and to monitor the slope of the voltage during discharge. The microcontroller can use the monitored information (for example the information on the time response of the capacitor voltage during discharge) in order to determine whether the reservoir capacitance is present or not. However, such a known solution requires additional wiring. Also, it is conventionally necessary to measure the voltage across the capacitor to perform this check.

With respect to the circuit described so far, the pre-charge capacitance 130, 410 is a critical element. In other words, in a security-critical system like an AIRBAG control circuit it is necessary to detect whether the pre-charge capacitance 130, 410 is present or not, or whether the pre-charge capacitance 130, 410 is defective or not. This check is particularly necessary, as the pre-charge capacitance 130, 410 is typically provided off-chip, which brings along a relatively high risk that the connection between the pre-charge capacitance 130, 410 and the rest of the power switch circuit may be interrupted (because the rest of the power switch circuit, except for the power transistor 110, 314, is typically arranged on a wafer). It should be noted here, that the pre-charge capacitance typically cannot be integrated monolithically with the rest of the circuit at acceptable cost, as it is quite big.

Figure 5A:
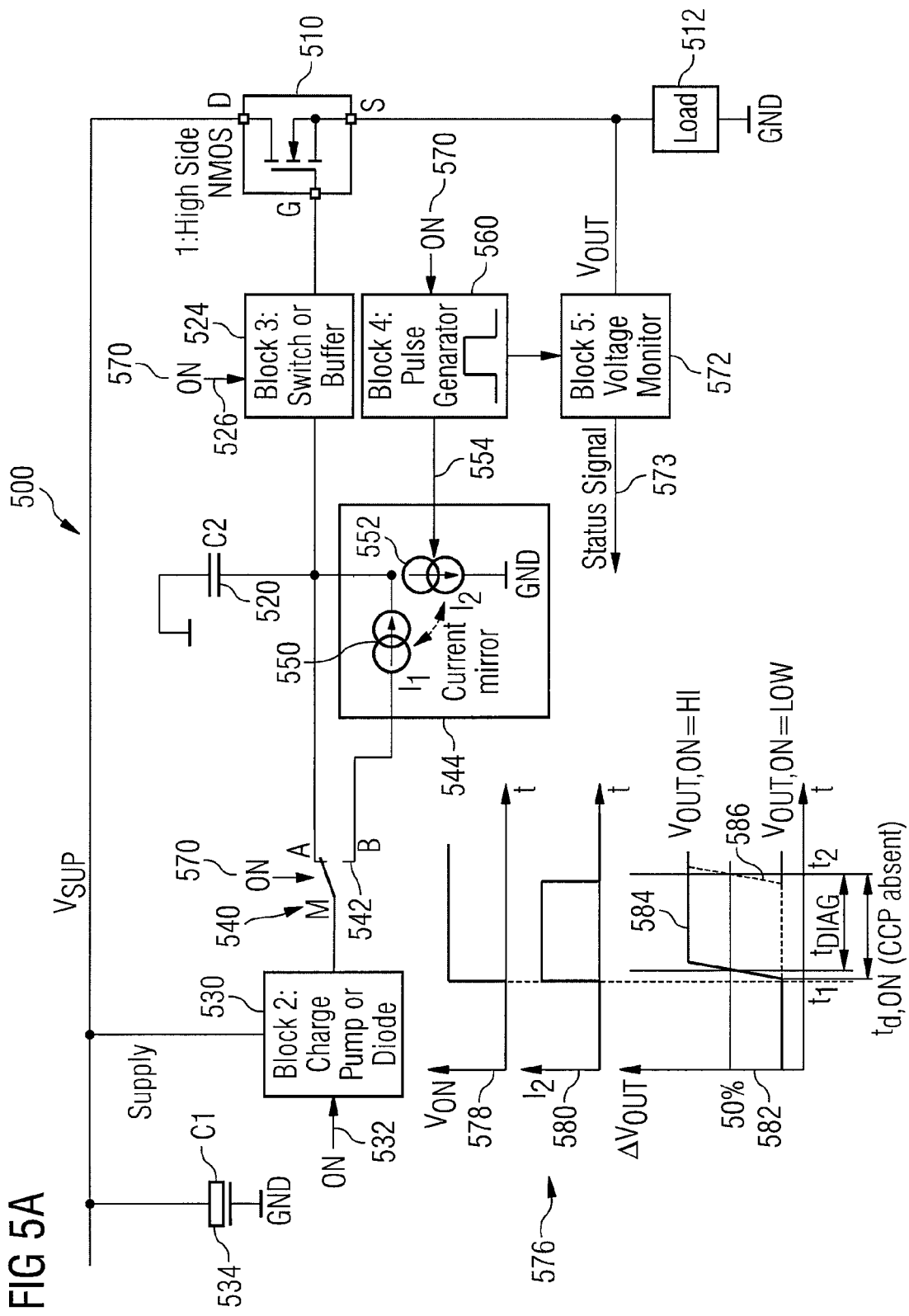
FIG. 5a is a block schematic diagram of a power switch circuit according to a third embodiment.

FIG. 5 shows a block schematic diagram of a power switch circuit according to a third embodiment. The circuit of FIG. 5a is designated in its entirety with 500. The power switch circuit 500 uses a high-side NMOS transistor 510 to switch a load current provided to a load 512. The load 512 may, for example, be an AIRBAG squib module, possibly including further switching elements like another high-side switch and/or a low-side switch. The high-side NMOS transistor 510 can be preferably a power-NMOS field-effect transistor. Although the high-side NMOS transistor 510 may be integrated with the rest of the shown control circuit, it may be preferred that the high-side NMOS transistor 510 is a discrete transistor, as it has to dissipate a significant amount of power in a typical AIRBAG driver application. A drain terminal of the high-side NMOS transistor 510 is connected with a supply potential $V_{SUP}$. A source terminal of the high-side NMOS transistor 510 is connected with a first terminal of the load 512. The second terminal of the load 512 may be preferably connected with a reference potential GND. In other words, the load path of the high-side NMOS transistor 510 may be preferably connected in series with the load 512 between the supply potential $V_{SUP}$ and the reference potential GND. The gate terminal of the high-side NMOS transistor 510 may be preferably coupled with a pre-charge capacitor 520 over a switch or buffer 524. The switch or buffer 524 can receive a control signal 526, which brings the switch or buffer 524 in a conducting (active) or a non-conducting (inactive) state. In the conducting state, the switch or buffer 524 can forward charge from the pre-charge capacitance 520 to the gate electrode of the high-side NMOS transistor 510. On the other hand, in the non-conductive state, the switch or buffer 524 may preferably isolate the pre-charge capacitance 520 from the gate terminal of the high-side NMOS transistor 510. In other words, the switch or buffer 524 can also be considered a controllable energy-coupling element.

The circuit 500 further comprises a voltage-providing circuit 530. The voltage-providing circuit 530 may receive a voltage-providing circuit control signal 532 which can activate or deactivate the voltage-providing circuit 530. It should further be noted that the voltage-providing circuit 530 is supplied from the supply potential $V_{SUP}$. However, the voltage-providing circuit 530 can also be supplied by another supply potential, which can be preferably lower than the supply potential $V_{SUP}$. It should further be noted that the supply potential $V_{SUP}$ is buffered by a supply voltage buffer capacitor 534, which is connected between the supply potential $V_{SUP}$ and the reference potential GND.

It should further be noted that the voltage-providing circuit 530 can, for example, comprise a charge pump providing a potential which is higher than the supply potential $V_{SUP}$, based on the supply potential $V_{SUP}$. Also, the voltage-providing circuit 530 may comprise a diode connected between the supply potential $V_{SUP}$ and the output of the voltage-providing circuit 530.

The output of the voltage-providing circuit 530 is coupled to the first terminal of the pre-charge capacitance 520 over a multiplexer 540 if the multiplexer is in the first switching state designated with "A". The output of the voltage-providing circuit 530 can also be coupled to a supply terminal 542 of a current regulation unit 544.

The current regulation unit 544 comprises a first current source 550 and a second switchable current source 552. The first current source 550 is supplied by the voltage-providing circuit 530 over the source terminal 542 and over the multiplexer 540, if the multiplexer 540 is in a second state designated with "B". Thus, the voltage provided by the voltage providing circuit 530 my be considered the fixed base potential of the first current source 550. The first current source 550 is adapted to provide the first current I1 to the pre-charge capacitance 520 if the multiplexer 540 is in the second state "B", wherein a second terminal of the first current source 550 is coupled with the first terminal of the pre-charge capacitance 520. The current I1 provided by the first current source 550 is directed such as to charge the pre-charge capacitance 520. Furthermore, the second current source 552 is connected between the first terminal of the pre-charge capacitance 520 and the reference potential GND, and is adapted to sink the second current I2 from the pre-charge capacitance 520 if the second current source 552 is activated by a corresponding current source activation-signal 554. Accordingly, the reference potential may be considered to be the fixed base potential of the second current source 552.

The current source activation-signal 554 for the second current source 552 can be preferably generated by a pulse generator 560 (or another control logic performing comparable function as will be described below). The pulse generator 560 can be preferably adapted to generate a pulse of a predetermined length upon receiving an on-signal 570, in order to activate the second current source 552 for the predetermined period in time.

Furthermore, the switch circuit comprises a voltage monitor circuit 572 which is adapted to monitor a voltage at the source electrode of the high-side NMOS transistor 510 or any other voltage within the load 512. Furthermore, the voltage monitor 572 receives a synchronization-signal from the pulse generator 560.

It should further be noted that the multiplexer 540, the switch or buffer 524 and the pulse generator 560 are all controlled by the same on-signal 570. If the on-signal is inactive, the multiplexer can be preferably in the first state designated with "A", the switch or buffer 524 is in the non-conductive state and the pulse generator 560 is in the inactive state. Furthermore, if the on-signal 570 is in the active state, the multiplexer 540 can be preferably in the second state designated with "B", and the switch or buffer 524 is in the conducting state. Furthermore, the pulse generator 560 may preferably generate a pulse upon a transition of the on-signal 570 from the inactive state to the active state. The pulse generated by the pulse generator 560 may preferably activate the second current source 552. Furthermore, the pulse generator 560 may preferably notify the voltage monitor 572 to sample the output voltage $V_{OUT}$ at a point in time during which the pulse generator 560 generates the pulse. Preferably, the pulse generator 560 may signalize to the voltage monitor 572 to sample the output signal $V_{OUT}$ in the middle of the pulse.

It should further be noted that the on-signal 570 may optionally act on the voltage-providing circuit 530 in order to activate or deactivate the voltage-providing circuit 530 or to adjust the voltage provided by the voltage-providing circuit 530 to one out of two values.

Moreover, it should be noted that the active state of the on-signal 570 may preferably indicate the firing mode of the power switch circuit and the underlying AIRBAG control system, while the inactive state of the on-signal 570 indicates the stand-by mode of the power switch circuit and the underlying AIRBAG control system.

FIG. 5a further shows a timing diagram 576. The timing diagram 576 describes in a first graphical representation 578 the on-signal 570 as a function of time. A second graphical representation 580 describes the current I2 provided by the second current source 552 as a function of time. A third graphical representation 582 describes, as a function of time, a relative change of the output signal $V_{OUT}$ with reference to the output voltage $V_{OUT}$ when the on-signal 570 is inactive. The third graphical representation 582 shows the relative change of the output voltage $V_{OUT}$, wherein a relative change of 100% is assumed after a long period of time (i.e. in a steady state).

It should further be noted that the graphical representations 578, 580, 582 are aligned with respect to time. The third graphical representation 582 shows a first curve 584 which describes the relative change of the output voltage $V_{OUT}$ as a function of time if the pre-charge capacitance 520 is present in the circuit. A second curve 586 in contrast describes the relative change of the output voltage $V_{OUT}$ as a function of time, if the pre-charge capacitance 520 is missing.

It can be seen from the third graphical representation 582 that the output voltage starts to change shortly after the on-signal 570 is activated. In this case, the change of the output signal reaches the 50% level at the first time $t_1$. In contrast, in the absence of the pre-charge capacitance 520 the relative change of the output voltage $V_{OUT}$ reaches the 50% level at the second time designated $t_2$.

Accordingly, the pulse generator 560 should preferably signalize to the voltage monitor 572 to sample the output voltage in the time interval designated with $t_{DIAG}$ (or at a certain point of time within the time interval $t_{DIAG}$). In the test time interval $t_{DIAG}$, defined by the first time $t_1$ when the relative change of the output voltage $V_{OUT}$ reaches the 50% level in the presence of the pre-charge capacitance 520, and the second time $t_2$, when the relative change of the output voltage reaches the 50% level in the absence of the pre-charge capacitance 520, an efficient diagnosis can be made to detect whether the pre-charge capacitance is present or not.

If the voltage monitor 572 detects a small (absolute or relative) voltage change (e.g. smaller than a predetermined threshold) during the test time interval $t_{DIAG}$ (or at a certain point in time during the test time interval $t_{DIAG}$), e.g. the relative voltage change being smaller than 50%, it can be concluded that the pre-charge capacitance is absent or defective. Otherwise, if the voltage monitor 572 detects a high absolute or relative voltage change (e.g. higher than a predetermined threshold, which may, for example be set to a relative change of 50%) of the output $V_{OUT}$ during the test interval $t_{DIAG}$, it can be concluded that the pre-charge capacitance 520 is present and not defective. Accordingly, the pulse generator 560 (or another comparable control logic) may preferably provide a sample impulse to the voltage monitor 572, wherein the sample impulse can be preferably located within the test interval $t_{DIAG}$.

Furthermore, FIG. 5b shows a schematic of a switched current source circuit 544 for usage in the power switch circuit according to the third embodiment. In other words, FIG. 5b shows a possible implementation of the current regulation unit 544. The current regulation unit 544 of FIG. 5b comprises, for example, a current mirror 590, the current mirror 590 comprising two PMOS field-effect transistors connected in the shown way. Furthermore, the current regulation unit 544 comprises a current bank 592, the current bank 592 comprising two NMOS field-effect transistors. However, an implementation using bipolar transistors is also possible. It should be noted here that any possible implementation of the current regulation unit 544 having the functionality described earlier may be applied, provided it is ensured that the first current $I_1$ and the second current $I_2$ are in a fixed relationship which can be determined preferably by a geometry of integrated devices like resistors, diodes or transistors. Also, it should be noted that it is in principle sufficient if it is ensured that the absolute magnitude of the second current $I_2$ is larger than the absolute magnitude of the first current $I_1$, even if the relationship between the first current $I_1$ and the second current $I_2$ is not fixed by geometrical parameters.

FIG. 6 shows a block schematic diagram of an application comprising the power switch circuit according to the third embodiment. The block schematic diagram of FIG. 6 is designated in its entirety with 600. Furthermore, the same means are designated with the same reference numerals when compared to the circuit 500 of FIG. 5a. It should further be noted that identical means are not described again here. However, FIG. 6 shows a particularly advantageous practical implementation of the above described circuit concept. It should be noted that the load 512 of FIG. 5a is replaced by at least one squib driver. Indeed, FIG. 6 shows a parallel circuit of three squib drivers 610 replacing the load 512. The diagnosis signal 620 describing the output voltage $V_{OUT}$ at the source of the power-MOS switch 510 is derived from the output voltage $V_{OUT}$ using a resistive voltage divider network 630. Application 600 further comprises a microcontroller 640 which provides the on-signal 570. Furthermore, the microcontroller 640 receives the diagnosis signal 620 and sends a fire signal 650 to the squib drivers 610 in order to trigger the ignition of the squib.

It is important to note that the pre-charge capacitor 520 and the high-side NMOS transistor 510 may be preferably provided as external discrete components, while a voltage-providing circuit 530, the multiplexer 540, the current regulation unit 544, the switch or buffer 524 and the pulse generator 560 can be preferably provided integrated on a chip 660. Preferably, the voltage providing circuit, the multiplexer 540, the current regulation unit 544, the switch or buffer 524 may be provided on the same chip, while the pre-charge capacitance 520 is an external capacitor. This is due to the fact that the pre-charge capacitance 520 is typically so large that an on-chip implementation brings along unacceptably high costs or is even practically impossible. Also, the high-side NMOS transistor 510, which can also be a logic level NMOS transistor, typically has to dissipate such a high energy that an on-chip implementation would bring along unacceptably high costs.

However, the implementation of the logic level NMOS transistor 510 (also designated as high side NMOS transistor) and the pre-charge capacitance 520 as external component raises the need to have an efficient method for testing these external components. A respective testing method for the pre-charge capacitance 520 has been described above, while a method for testing the transistor 510 will be described below.

To summarize the above, it should be noted that an power switch circuit (as e.g. shown in FIG. 5a) comprises as a key component a high-side NMOS transistor 510 to provide a current to the load 512. Furthermore, preferably a charge pump or a diode can be used in order to provide a supply voltage to a system (at the output of the voltage-providing circuit 530 connected to the multiplexer 540). A charge pump is advantageous if a voltage higher than the supply voltage $V_{SUP}$ is required for the operation of the circuit or as a control voltage for the high-side NMOS transistor 510. Otherwise, the voltage-providing circuit 520 can be realized using a diode. Besides, the system comprises a switch or buffer 524 that can provide the drive voltage (or charge) for the gate of the high-side NMOS transistor 510 operating from the energy stored in the pre-charge capacitance 520. The pulse generator 560 can be considered as a block generating pulse at every transition from stand-by to firing mode. Another block 572 monitors the output voltage $V_{OUT}$. Furthermore, a couple of matched currents $I_1$ and $I_2$ are provided, where preferably $I_2 = 2 * I_1$. An circuit further may preferably comprise a multiplexer designated with 540. During stand-by mode, multiplexer 540 may preferably select the path designated with "A". The pre-charge capacitance 520 (also designated as capacitor C2) is charged to the desired value (voltage) in the fastest way because the load current is not limited (or only limited by a parasitic output impedance of the voltage providing circuit 530). The switch in the switch or buffer block 524 (also designated as block 3) is open, and the gate of the external MOS 510 is shorted to the source in order to maintain the MOS 510 in off condition. In other words, the circuit 500 may comprise a switch for short-circuiting gate and source terminals of the high-side NMOS transistor 510, wherein the switch for short-circuiting the gate and source electrodes of the NMOS transistor 510 can be preferably also operated by the on-signal 570. In other words, if the on-signal is inactive, the gate and source electrodes of the high-side NMOS transistor 510 can be preferably short-circuited.

When switching to firing mode three actions are performed in the system. Firstly, multiplexer 540 switches to the second path designated with "B". Secondly, the switch or buffer block 524 (also designated as block 3) connects the gate of the external MOS 510 (also designated as high side NMOS transistor) to the pre-charge capacitance (capacitor C2). In another embodiment, a buffer contained in the switch or buffer block 524 drives the gate of the MOS 510 using the energy stored in the pre-charge capacitance 520 (capacitor C2). Thirdly, the pulse generator 560 (also designated as block 4) generates a pulse of a duration $t_{DIAG}$, wherein the pulse activates the second current source 552 to provide a second current $I_2$.

At the beginning of the firing mode (i.e. after a transition from stand-by mode to firing mode) the pre-charge capacitance 520 (C2) has to provide the current to load the gate to source capacitance of the MOS 510 (also designated as high-side NMOS transistor) and the difference current $I_{diff}=I_2-I_1$. Because of the matching between the first current $I_1$ and the second current $I_2$, the difference current $I_{diff}$ is always positive, even in the case of fabrication spreads.

In case the pre-charge capacitor 520 (C2) is not connected, there is no energy available to charge the gate to source capacitance of the MOS 510 and the output (described by the output voltage $V_{OUT}$) will not rise for the time $t_{DIAG}$. The timing diagram 576 of FIG. 5a (and in particular the third graphical representation 582) shows the different behavior of the output voltage $V_{OUT}$ in the case of the pre-charge capacitance 520 (C2) connected or disconnected. The voltage monitor 572 (also designated as block 5) can be preferably monitoring the output voltage $V_{OUT}$ at the time $t=t_{DIAG}/2$ (i.e. half the test time $t_{DIAG}$ after the transition of the on-signal 570 from an inactive to an active state). The voltage monitor 572 further provides a status signal 573 (preferably based on the voltage measured at time t) which can be evaluated by any superordinate diagnosis means.

The circuit 500 as described above brings along a number of advantages. So, no additional wiring or hardware is needed in order to check the presence of the pre-charge capacitance C2. In contrast, the diagnostic is done using an already available voltage $V_{OUT}$ (as output voltage $V_{OUT}$ is preferably monitored anyway for diagnosis purposes). Furthermore, an explicit diagnostic mode is not needed in order to check the presence of the pre-charge capacitance 520 (C2) because the above-described diagnostic can be done at every startup (wherein the term "startup" preferably designates a transition from the stand-by mode to the firing mode, as defined earlier). Consequently, additional logic states are not needed in order to check the presence of the pre-charge capacitance 520.

In other words, the key idea of the circuit 500 shown in FIG. 5a is to reduce the current loading the reservoir capacitor (pre-charge capacitance 520) in the firing mode (when compared to the stand-by mode) and to sink a current from the reservoir capacitor (pre-charge capacitance 520) that is approximately double the sustaining current for a limited time (the test time or diagnosis time $t_{DIAG}$). In other words, a difference current $I_{diff}$ is sunk from the capacitor with $I_{diff}=I_2-I_1$. This allows a fast startup as the current is not limited in stand-by mode. In other words, the pre-charge capacitance 520 is charged as fast as possible in stand-by mode, so that a transition to the firing mode can occur as soon as possible. Furthermore, the diagnostic of the presence of the pre-charge capacitance 520 can be performed at every startup (wherein a startup is a transition from the stand-by mode to the firing mode).

Another key idea of the power switch circuit 500 is to have the first current $I_1$ and the second current $I_2$ mirrored in order to overcome fabrication spreads.

FIG. 6 shows an application of the power switch circuit. The application is a firing system for airbag applications.

The capacitor C1 (also designated as supply potential buffer capacitor 534) is a reservoir capacitor needed to store the energy for the explosions of the airbags. A typical value is in the order of some mF. The capacitor C1 534 is pre-charged to the voltage designated "supply". In the case a crash occurs, this may be the only energy available for the airbag explosions. The high-side NMOS is driven by the microcontroller and provides the current needed for the squib explosions. The squib drivers are the exploding elements in the system. When the right voltage is present at the OUT node (the source terminal of the NMOS field-effect transistor 510), the microcontroller 640 gives a signal 650 to have the airbag explosion. The system can also perform self diagnostics. Every time that the system changes from stand-by to firing mode, the microcontroller 640 can check the voltage $V_{OUT}$ after a time which is approximately equal to $t_{DIAG}/2$. If the voltage is okay (for example as defined above), the microcontroller 640 can recognize that the capacitor (pre-charge capacitance 520) is connected. Furthermore, the microcontroller can also determine whether the reservoir capacitance 534 (also designated as supply potential buffer capacitance) is present.

FIG. 7 shows a block schematic diagram of an power switch circuit according to a fourth embodiment. The circuit of FIG. 7 is designated in its entirety with 700. It should be noted here that some of the components of power switch circuit 700 are identical to AIRBAG driving circuit 2300 described with reference to FIG. 19. Such means will not be described here separately. Rather, reference is made to the description of FIG. 19. Furthermore, it should be noted that in FIGS. 7 and 19 equivalent means are designated with equivalent reference signs.

However, the circuit 700 comprises a new circuitry for driving MOS switch 710 (typically a power transistor), wherein the NMOS switch can be preferably an N-type channel MOS field-effect transistor (N-MOSFET) or an power N-type channel MOS field-effect transistor. It should further be noted that the MOS switch 710 can have both a switching and a voltage-regulating function in the sense of being operated in a source-follower mode of operation.

A gate electrode of MOS switch 710 is connected to a supply potential $V_{SUP}$. A source electrode of MOS switch 710 provides an output voltage $V_{OUT}$ to the AIRBAG squib module (for example comprising a high-side transistor 2305, a low-side transistor 2306 and the squib 2307, connected in series).

A gate electrode of the MOS switch 710 can be coupled over a first switch 720 to the first voltage regulator 722. It should be noted here that the first switch 720 can be a switch or buffer which can transfer charge and/or energy from the first voltage regulator 722 to the gate electrode of the MOS switch 710. Therefore, the first switch 720 can also be generally considered to be a controllable energy-coupling element. The first voltage regulator 722 can be preferably adapted to provide a constant voltage which can be fed to the gate electrode of the MOS switch 710 over the first switch 720. The first voltage regulator may, for example, comprise any voltage regulation means. Also, the voltage regulator 722 may comprise a circuit as shown in FIG. 4a using a buffer 310 and a pre-charge capacitance 410. However, it is not necessary to have such a pre-charge capacitance 410 within the first voltage regulator 722.

Furthermore, power switch circuit 700 comprises a second switch 730 connected in series with a resistor 732 between the gate electrode of the MOS switch 710 and the source electrode of the MOS switch 710. However, in another embodiment the resistor 732 may be omitted. Also, it is possible to use a resistor 732 only without the second switch 730 being present. In other words, the gate electrode and the source electrode of the MOS switch 710 can be preferably connected either by a resistor alone, by a switch alone or by a series connection of a resistor and a switch. The path between the gate electrode and the source electrode of the MOS switch 710 is used in order to ensure that the MOS switch 710 is in the non-conducting state unless the first switch 720 is in the conducting state. So, the first switch 720 must be closed to explicitly activate the MOS switch 710. Also, the second switch 730 and the resistor 732 can be adapted in such a way that the MOS switch 710 is always in the non-conducting state if the second switch 730 is closed, irrespective of whether the first switch 720 is active or not. In this way, the second switch 730 can prevent the MOS switch 710 from being activated even if the first switch 720 is unintentionally switched to a conducting state, for example in the case of a malfunction. Accordingly, the second switch 730 can be considered a security switch to avoid an unintentional inflation of the AIRBAG.

Besides, a second voltage source 740 is connected to the source electrode of the MOS switch 710. The second voltage source 740 can be preferably adapted to provided a voltage to the source electrode of the MOS switch 710. The voltage provided by the second voltage source can be preferably too small to allow for an ignition of the squib 2307, even if the high-side switch 2305 and the low-side switch 2306 are in the conducting state. In another embodiment, the second voltage source 740 may provide a voltage which would be high enough to allow for an ignition of the squib 2307, wherein the second voltage source further comprises a current limitation which is adapted such that an ignition of the squib 2307 is prevented. The second voltage source 740 may also be controllable in such a way that it is activated and deactivated. Moreover, the second voltage source 740 may offer the possibility to adjust the voltage and/or the current limit.

Circuit 700 further comprises control logic 750 connected with the microcontroller 752. The control logic 750 can be preferably adapted to activate either the first voltage regulator 722 or the second voltage regulator 740. In other words, in a stand-by mode, preferably the second voltage regulator 740 can be active. Also, in the stand-by mode preferably the second switch 730 can be preferably closed to short-circuit the gate electrode and the source electrode of the MOS switch 710. Furthermore, the logic may also act on the first voltage regulator 722 in the stand-by mode as it was described earlier, for example with respect to the circuit 400 of FIG. 4a and the circuit 500 of FIG. 5a. In other words, the first voltage regulator 722 may be replaced by the a combination of a voltage source and a pre-charge capacitance, as described with respect to power switch circuit 400 of FIG. 4a (cf. 310, 410). Also, the first voltage regulator 722 may be replaced by a charging circuit as described with respect to power switch circuit 500 of FIG. 5a (cf. reference numerals 520, 530, 540, 544).

Further, in the stand-by mode the first switch 720 can be preferably open (i.e. in the non-conducting state).

Besides, in the firing mode the logic 750 may preferably close the first switch 720 and open the second switch 730, so that the MOS switch 710 is prepared to provide a high current to the squib module. Furthermore, the logic 750 may deactivate the second voltage source 740 in the firing mode. However, this is not necessary, as the second voltage source 740 may be adapted such that it can only provide a relatively small current when compared to the current flowing through the load path of the MOS switch 710. In this case, the second voltage source 740 may remain connected to the source terminal of the MOS switch 710 without severely degrading the operation of the power switch circuit.

The control logic 750 may act on the first voltage regulator 722 to reconfigure the first voltage regulator 722 in the firing mode, as described earlier with reference to FIG. 5a. In particular, control logic 750 may also control one or more self diagnosis steps. It should be pointed out here that diagnosis circuits can be preferably active during transitions between the different states, for example during the transition between the stand-by mode and the firing mode, when the voltage $V_{OUT}$ at the source terminal of MOS switch 710 changes from a first voltage level $V_{Q1}$ to the second voltage level $V_{Q2}$. It should be noted here that the circuit 700 ensures that the voltage $V_{OUT}$ and the first terminal of the MOS switch 710 is well-defined both in the stand-by mode and in the firing mode. In the stand-by mode, the voltage at the source terminal of MOS switch 710 is defined by the second voltage source 740. In contrast, in the firing mode, when the MOS switch 710 is operating as a source-follower, the voltage at the source terminal of the MOS switch 710 is determined by the first voltage regulator 722.

Respective transitions of the output voltage $V_{OUT}$ at the source terminal of the MOS switch 710 are shown in the graphical representation 760.

It should be noted that the circuit 700 is based on the circuit shown in U.S. 2004/0108698 A1. However, the circuit 700 provides a novel implementation and it resolves some additional important issues when compared to U.S. 2004/0108698 A1.

As can be seen from FIG. 7, the power switch circuit 700, which may be part of an AIRBAG deployment system, makes use of a certain supply voltage provided the vehicle battery or the boost regulator 2301 (wherein the boost regulator 2301 may provide a properly boosted increased voltage based on the supply voltage $V_{SUP}$). The circuit 700 further comprises a pre-charged capacitor 2302 for storing energy based on the supply voltage $V_{SUP}$. Circuit 700 further comprises a high-side switch 2305 having an electrode controlled by a microprocessor (or a microcontroller). A controlled path of the high-side switch 2305 is connected to a firing element 2307. Furthermore, an electrode of a low-side switch 2306 is controlled by a microprocessor (or a microcontroller). Again, a controlled path of the low-side switch 2306 is connected to the firing element 2307. Both switches (i.e. both the high-side switch 2305 and the low-side switch 2306) have to be activated simultaneously when a drive signal SA is provided in order to let a current flow through the series connection (and through the firing element or squib 2307).

Furthermore, MOS switch 710 provides a power switching element having a controlled path connected in series with the high-side switch 2305 and the low-side switch 2306. The first voltage regulator 722 (also designated as VR1) establishes an output voltage in an open-loop mode. Furthermore, the second voltage regulator 740 (also designated as VR2) establishes an output voltage in a closed-loop mode. Circuit 700 further comprises a switch between the gate electrode and the source electrode of the power switching element 710. Besides, some control logic coordinates the proper operation of the components of the circuit 700.

The circuit 700 focuses on details related to the power switching element 710 and provides a possible solution to improve the safety features of this element of the system.

In the following, the operation of the power switch circuit 700 will be described in detail. When the power switch circuit 700 (or the underlying AIRBAG control system) is in standby mode, which is the normal conditions operation mode, the second regulator 740, directly connected to the source of the N-type channel field-effect transistor 710, is turned on by the logic block 750 and keeps the output voltage at the source at a certain desired voltage in closed-loop mode. For up-to-date technology squibs, a voltage of typically 12 V can be applied to the source terminal of the N-type channel field effect transistor 710. This voltage was found to be useful to implement some kind of diagnostic on the squib driver circuit. Furthermore, the voltage applied to the source of the N-type channel field-effect transistor 710 can be considered to be a safety feature, as will be outlined in detail below.

Firstly, it should be noted that the switch closed between the gate electrode and the source electrode of the N-type channel field-effect transistor 710 guarantees that the N-type channel field-effect transistor 710 does not turn on. This can be achieved by shorting the gate electrode and the source electrode. Accordingly, the condition for the power switch element or the N-type channel field-effect transistor 710 is 12 V at the source electrode. Besides, the gate source voltage $V_{GS}$ is equal to zero. No current can flow through the N-type channel field-effect transistor 710 forming the power switch. Thus, no unexpected squib explosions can occur.

Furthermore, the voltage of approximately 12 V, which is present at the source of the N-type channel field-effect transistor 710, produces a constant voltage for the squib explosion circuitry (comprising the high-side switch 2305, the low-side switch 2306 and the firing element 2307). The presence of a constant voltage for the squib explosion circuitry was found to be useful to check whether squibs are functional or not. The diagnosis can simply be performed by forcing a small amount of current through the squibs and measuring thus the resistivity.

When the circuit 700 (or the underlying AIRBAG control system) is in firing mode, i.e. when an imminent impact signal is provided by the microcontroller 752, then the second switch 730 previously connecting the gate terminal and the source terminal of the N-type channel field-effect transistor 710 opens, and the gate electrode is regulated in open-loop mode to a second voltage higher than the previous one and able to drive the high current to the squibs. In other words, in the firing mode a gate voltage is applied to the N-type channel field-effect transistor 710 through the first switch 720, wherein the gate voltage is provided by the first voltage regulator 722. The gate voltage should preferably be chosen higher than the gate voltage in standby mode, such that the voltage $V_{OUT}$ at the source of the N-type channel field-effect transistor 710 is higher than in the stand-by mode. Furthermore, in the firing mode of operation the N-type channel field-effect transistor 710 may conduct a high current through its load path. In other words, only in the firing mode some current can flow from the supply or from the storing energy capacitance 2302 over the load path of the N-type channel field-effect transistor 710. The current flowing over the load path of the N-type channel field-effect transistor 710 may be delivered directly to the firing element 2307.

The introduction of two regulated voltage sources 722, 740 (two regulated loops operation) brings along the advantage that the performance of the system can be improved. Furthermore, the system gets much safer (when compared to conventional systems). Certain diagnostic functions can be performed directly on the squib drivers but also on the external power switching element itself in order to check the integrity of the system. The microcontroller 752 can change from a first state (idle or stand-by) to the second state (firing mode) and vice versa. During these two possible transitions, some checks can be performed on the functionality of the power switching element and on the squib drivers.

A first kind of diagnostic check monitors the resistivity parameters of the squib. A second kind of diagnostic check monitors the generated voltage on the charge boost storage capacitor 2302 that stores the energy to fire the squibs. To assure readiness of the firing circuit to fire, it is desirable to test the squib drivers circuits for operability. Such driver tests can be carried out by switching on an individual high-side switch 2305 or low-side switch 2306 without there being the need to limit the driver current to an uncritical value so that a firing event is not triggered. In order to enable such a test, it is just necessary to have a certain regulated voltage at the input of the squib drivers circuitry, i.e. at the source of the N-type channel field-effect transistor 710. This voltage is provided according to the circuit 700 by the second voltage regulator 740. Furthermore, a functional test of the driving circuit for the N-type channel field-effect transistor 710 can easily be implemented by monitoring the transitions low-to-high or high-to-low at the source terminal of the N-type channel field-effect transistor 710. Further details of possible tests will be explained below.

To summarize the above, the circuit 700 allows for applying another methodology for implementing safe firing systems for AIRBAG applications. Starting from the solutions proposed in U.S. 2004/0108698 A1, the circuit 700 constitutes a new concept of driving the N-type channel field-effect transistor 710. The circuit 700 introduces the idea of two different voltage ranges for operating the N-type channel field-effect transistor driving. Two regulators act separately, one on the gate and the other one on the source of the N-type channel field-effect transistor 710, wherein a switch is provided between the gate electrode and the source electrode of the N-type channel field-effect transistor 710. Additionally, some logic interfaces manage the transitions from stand-by mode to firing mode and vice versa. When the first voltage regulator acts on the gate of the MOS field-effect transistor 710 and the switch between the gate and the source of the field-effect transistor 710 is open, at the output (i.e. at the source terminal of the N-type channel field-effect transistor 710) an open-loop voltage is guaranteed and the circuit is able to drive the squibs (firing mode). The term "open-loop voltage" describes that the first voltage regulator 720 regulates the gate voltage of the N-type channel field-effect transistor 710 to a fixed value but does not have a feedback path to the source terminal of the N-type channel field-effect transistor 710. On the other hand, when the second voltage source 740 acts directly on the source terminal of the N-type channel field-effect transistor 710 and the switch between the source terminal and the gate terminal of the N-type channel field-effect transistor 710 is closed, a closed-loop voltage is guaranteed at the output (i.e. at the source terminal of the N-type channel field-effect transistor 710). The term "closed-loop voltage" indicates that the second voltage regulator 740 preferably has a feedback path to the source terminal of the N-type channel field-effect transistor 710. In other words, the second voltage source 740 can preferably sense the voltage at the source terminal of the N-type channel field-effect transistor 710. The guaranteed closed-loop voltage provided by the second voltage source 740 is needed for new-generation squibs and is useful for implementing the diagnosis (stand-by mode).

In the above-described way, the method for diagnosing the N-type channel field-effect transistor driver circuit integrity is feasible by stepping from one operation mode to the other. Also, the diagnostic of the squib driver circuits, which require a regulated voltage as input and a limited current for diagnosis, is possible using the circuit 700.

Figure 8A:
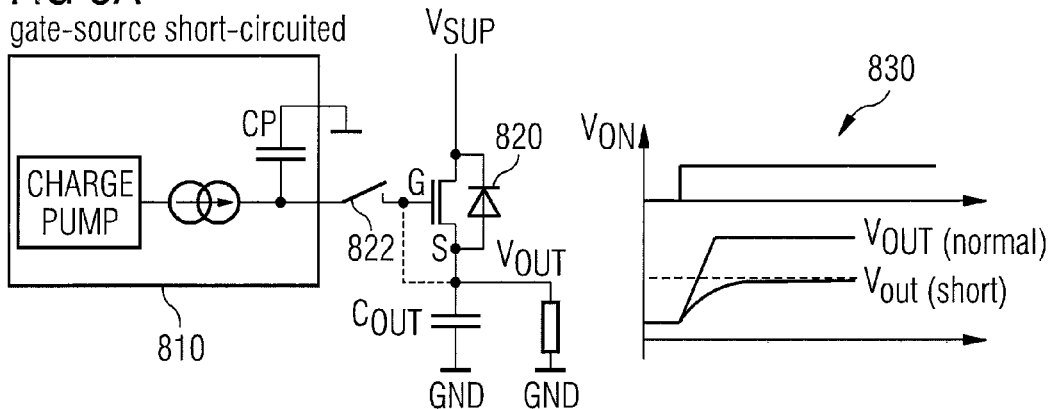
FIG. 8a is a graphic representation of an method for detecting a gate source short circuit in a power switch circuit.
Figure 8B:
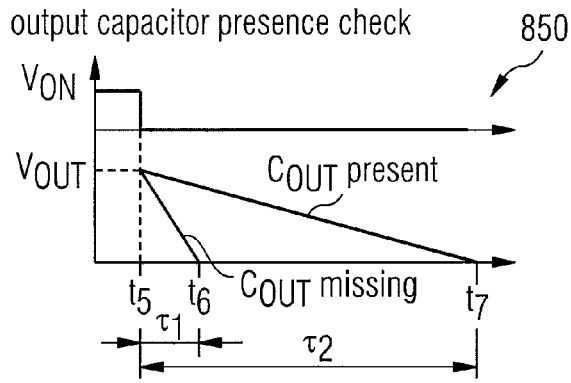
FIG. 8b is a graphic representation of output signals when performing a presence check method checking the presence of the output capacitor.
Figure 8C:
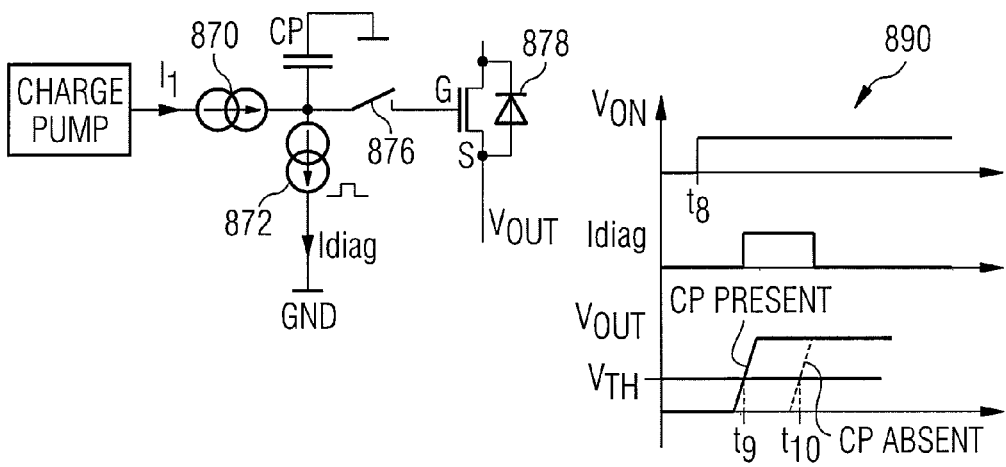
FIG. 8c is a graphic representation of a method for performing a presence check, for checking the presence of the pre-charge capacitance.

FIGS. 8a, 8b and 8c show three possible first diagnosis tests which can be performed using the circuits 500, 600 or 700. In other words, FIGS. 8a, 8b and 8c show some examples of how to implement a diagnostic on the system for activating AIRBAG deployment. The examples of FIGS. 8a, 8b and 8c are intended to show some ways to exploit transitions at the gate of the N-type channel field-effect transistor, which is designated with 510, 710 in FIGS. 5a, 6 and 7. Both a low-to-high transition and a high-to-low transition at the gate of the N-type channel field-effect transistor 510, 710 can be exploited. However, it should be noted that there are many other opportunities for performing self-diagnosis test with some diagnosis capacitors connected internally or externally, depending also on the specific circuitries integrated for the N-type channel field-effect transistor driver.

The self-diagnosis checks are performed by looking at the levels of voltage on capacitors and on delay times. Diagnosis tests are typically performed in coordination with a microprocessor, wherein control signals and measured data may be interfaced between the microprocessor and the test circuitry. In the case that some abnormality is found, the microprocessor can signal the abnormality to a higher system level, keeping the power switch circuit and an AIRBAG control system using the power switch circuit at an extremely high level of safety.

FIG. 8a shows a self-diagnosis test which can be performed on any of the circuits 100, 400, 500, 700. More specifically, FIG. 8a shows a graphic representation of an method for detecting a gate source short circuit in a power switch circuit.

For performing the test shown in FIG. 8a it is merely necessary to have a voltage source 810 that can be coupled to the gate terminal of a power transistor 820 (preferably an MOS switch, an MOS field-effect transistor or a power-MOS field-effect transistor) via a switch (or buffer) 822. A drain electrode of the power transistor 820 can be preferably coupled with a supply potential $V_{SUP}$.

Furthermore, it is assumed that a source electrode S of the power transistor 820 is connected to the load comprising a resistive and possibly also a capacitive component.

Furthermore, according to the method shown in FIG. 8a, the voltage at the source terminal S of the power transistor 820, a voltage derived from the voltage at the source terminal of the power transistor 820 or another voltage in the load circuit connected between the source terminal of the power transistor 820 and the reference potential should be monitored (cf. for example the resistive voltage divider 630 of circuit 600). Furthermore, the monitoring voltage (designated here as voltage $V_{OUT}$) should be monitored at a point in time after the switch 822 is closed. From the measured voltage $V_{OUT}$ it can then be concluded whether the power transistor 820 is defective or not defective or whether the power transistor 820 is connected properly. For example, it can be detected by sampling the voltage $V_{OUT}$ at a point in time after the switch 822 is closed whether the gate electrode and the source electrode of the power transistor 820 are short-circuited or not. Respective time responses of the voltage $V_{out}$, designated $V_{OUT}$(normal) for the case of normal operation and $V_{out}$(short) for the case that the gate terminal and the source terminal of the power transistor 820 are short-circuited, are shown in a graphical representation 830.

It should be noted that FIG. 8a shows an example of a system for driving the N-type channel field-effect transistor 820 comprising a pre-charge capacitor designated as CP connected to the gate of the N-type channel field-effect transistor 820, and an output capacitor $C_{OUT}$. It should be noted here that the output capacitor $C_{OUT}$ is not necessary in order to detect a short-circuit of the gate-source path of the power transistor 820, but is required for performing another test described below with reference to FIG. 8b.

For the circuit of FIG. 8a, if the gate electrode of the external N-type channel field-effect transistor 820 gets short-circuited with the source electrode thereof, then the power transistor 820 will not be able to deliver current to the output. Hence, the output capacitor $C_{OUT}$ is charged only by the energy stored in the capacitance $C_{CP}$ and/or from the current from the charge pump present in the system. To be more general, the output capacitance $C_{OUT}$ is charged by the voltage source 810. Consequently, the output voltage $V_{OUT}$ rises only to approximately half of the expected value.

FIG. 8b shows a graphical representation of a time response of the output voltage $V_{OUT}$ when performing a presence check method for checking the presence of the output capacitor $C_{OUT}$ using a circuit configuration as shown in FIG. 8a.

With respect to FIG. 8a it should be noted that it is assumed that the switch 822 shown in FIG. 8a is opened at a time $t_5$. With respect to the graphical representation 850 of FIG. 8b it should be noted that after the point in time when the switch 822 is opened (designated as time $t_5$) the output voltage $V_{OUT}$ decays with a first time constant $\tau_1$ if the output capacitor $C_{OUT}$ is missing. Besides, the output voltage $V_{OUT}$ decays with a second time constant $\tau_2$ larger than the first time constant $\tau_1$ if the output capacitor $C_{OUT}$ is present. The first time constant $\tau_1$ and the second time constant $\tau_2$ can be determined either by means of measurement or by means of simulation. Furthermore, it can be preferred that a monitoring circuit samples the output voltage $V_{OUT}$ at a point in time between the time $t_6$ and the time $t_7$, wherein the time $t_6$ is defined by time $t_5$ and the first time constant $\tau_1$ as $t_6=t_5+\tau_1$. Furthermore, time $t_7$ is determined as $t_7=t_5+\tau_2$. From the sampled value for $V_{OUT}$ it can be decided whether the output capacitance $C_{OUT}$ is present or missing.

In other words, with reference to the circuit's configuration shown in FIG. 8a, FIG. 8b represents a method to determine a failure due to the absence of the output capacitor $C_{OUT}$. Since the load in stand-by mode is small, the output capacitor $C_{OUT}$ will discharge slowly after it was charged to a voltage of, for example, approximately 25 V for diagnosis purposes. The diagnosis can, for example, be controlled by a microprocessor in combination with some logic. Consequently, the absence of the output capacitance $C_{OUT}$ leads to a fast decline of $V_{OUT}$ (e.g. after switching from firing mode to stand-by mode), wherein the fast decline of $V_{OUT}$ can be detected immediately.

FIG. 8c shows a graphical representation of the method for performing a presence check for the pre-charge capacitance CP. With reference to FIG. 8c, it is, for example, assumed that the pre-charge capacitance is charged by a first current source 870 providing a first current $I_1$. The supply voltage for the first current source 870 may, for example, be provided by a charge pump, but any other energy-providing circuit can also be used. A second current source 872, which can be activated and deactivated, is also coupled to the pre-charge capacitance CP and can sink a diagnostic current $I_{DIAG}$, wherein the absolute magnitude of the diagnostic current $I_{DIAG}$ can be preferably larger than the absolute magnitude of the first current $I_1$. Also, it should be noted that the first current $I_1$ and the diagnostic current $I_{DIAG}$ have opposite signs or current directions. Furthermore, the second current source 872 can be preferably activated for a predetermined period of time after switching the circuit of FIG. 8*c* from stand-by mode to firing mode. It should be noted here that a switch 876 connecting the pre-charge capacitance CP and the gate electrode of the power transistor 878 is closed when switching the circuit of FIG. 8*c* into a firing mode, as it was described in detail earlier. The graphical representation 890 shows the time response of a signal VON switching the circuit of FIG. 8*c* from stand-by mode to firing mode at time $t_8$. The graphical representation 890 further shows that the second current source 872 is activated for a predetermined period of time to provide the diagnostic current $I_{DIAG}$. Furthermore, the graphical representation 890 shows a time response of the output voltage $V_{OUT}$ in the presence and absence of the pre-charge capacitance CP.

It should further be noted that details with respect to the check described in FIG. 8*c* have already been described with reference to FIG. 5*a*. To summarize the above, after setting the system to firing mode, a current that is higher than the current $I_1$ normally provided to the gate is driven (or sunk) from the pre-charge capacitance CP to the reference potential GND for a certain amount of time-delay. The amount of time-delay can be set in a specific design. In case the pre-charge capacitance CP is absent, the output voltage $V_{OUT}$ remains at its low level during this time-delay, leading to an increased switch-on delay that can be observed on the output voltage $V_{OUT}$. Accordingly, the absence of the pre-charge capacitance CP, which can be considered a malfunction, can easily be detected by a microcontroller. The microcontroller really needs to monitor the output voltage $V_{OUT}$. By monitoring the output voltage $V_{OUT}$ the microcontroller can determine the switch-on time-delay of the output voltage $V_{OUT}$. If the switch-on time-delay is low (as shown by time $t_9$) the microcontroller can conclude that the pre-charge capacitance CP is present. If the switch-on time-delay is large (as shown by time $t_{10}$), the microcontroller can conclude that the pre-charge capacitance CP is absent and report this error condition. For performing a simple check, the microcontroller can thus sample the output voltage $V_{OUT}$ at a point in time which is between a first point in time (e.g. time $t_9$) when the output voltage $V_{OUT}$ rises in the presence of the pre-charge capacitance CP and a second point in time (e.g time $t_{10}$) when the output voltage $V_{OUT}$ rises in the absence of the pre-charge capacitance CP. The first point in time and the second point in time are designated in FIG. 8*c* as $t_9$ and $t_{10}$, wherein the times $t_9$ and $t_{10}$ are defined as times when the output voltage $V_{OUT}$ passes a predefined voltage threshold $V_{TH}$ in the presence and in the absence of the output capacitor $C_{OUT}$, respectively.

In the following, a general amplifier feed back biased minimum selector (GA-FBB-MS) class AB power-MOS-switch gate-driver circuit, for high voltage AIRBAG application will be described.

On other words, in the following, a GA-FFB-MS Class AB driving stage for High Voltage AIRBAG application to efficiently drive a Power-MOS switch is described, that has at the same time the advantage to obtain a fast transient response to load variations (with a rate of about 5 A/us, passing from 1 mA up to 50 A load!) and also shows an acceptable AC stability under all conditions.

The described circuit has to have a low total quiescent current (<0.4 mA, partially coming from an high voltage storage capacitor and the rest from an internal supply).

Figure 9:
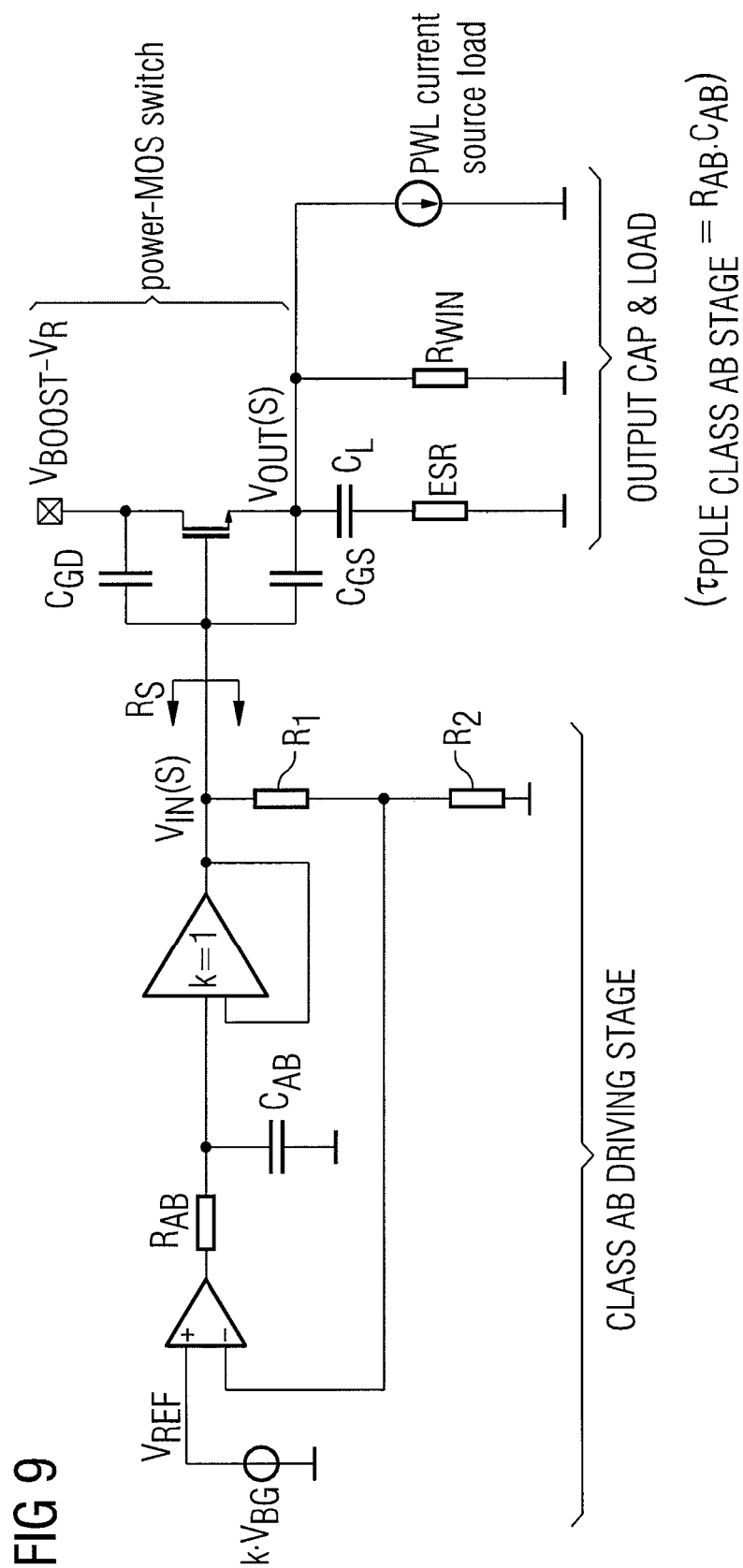
FIG. 9 is a schematic diagram of a power switch circuit having a class AB driving stage.

In the following, the complete calculations for deriving expressions for the transfer functions of the circuits 300 of FIG. 3 and 900 of FIG. 9 will be presented, wherein FIG. 9 shows a schematic diagram of a power switch circuit having a class AB driving stage. In the derivation, the following steps will be taken into account:

1. Driver stage is considered as an ideal Voltage buffer, with output resistance $R_s$, and ESR of the output cap is neglected;
2. Driver stage is considered an ideal Voltage buffer, with output resistance $R_s$, and ESR of the output cap is not neglected;
3. Following the last step, some simplifications are made, only valid for a particular case, showing again a third order denominator, not easy to factorize.
4. Furthermore, if we consider a non ideal driving stage but a good one, with only one pole (single stage driver, may be a class AB), we finally conclude that the system can be unstable.

Figure 15A:
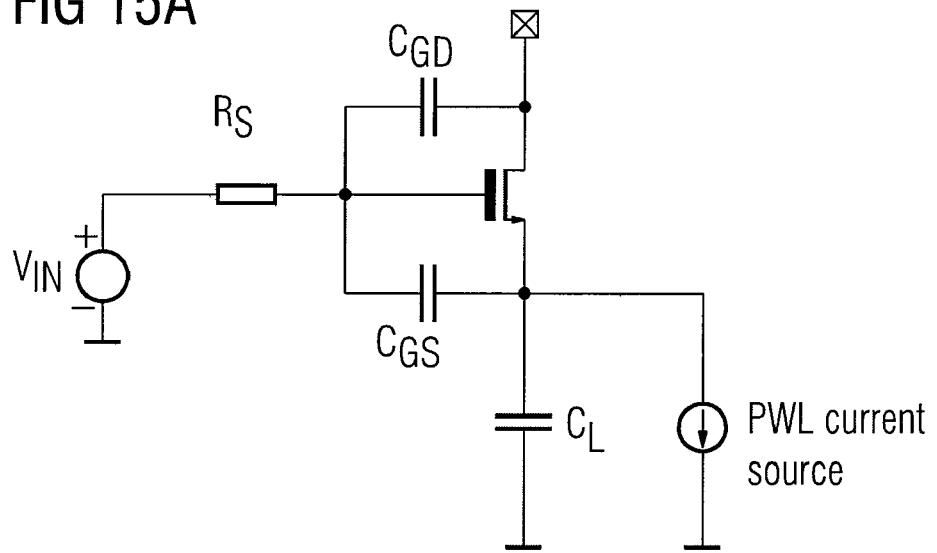
FIG. 15a is a simplified schematic of a driving stage for a power switch circuit.
Figure 15B:
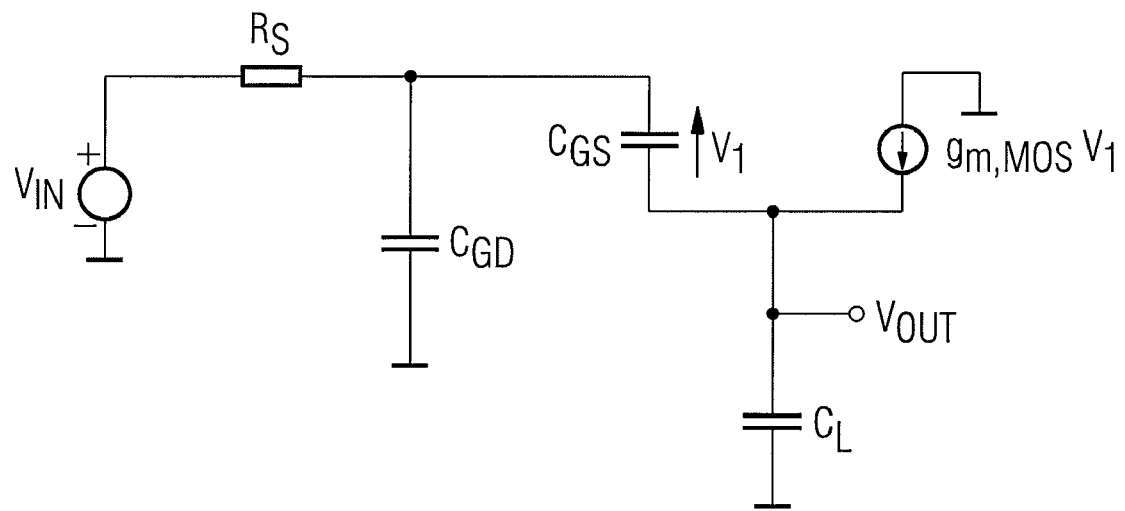
FIG. 15b is a simplified equivalent circuit of a driving stage for a power switch circuit.

Accordingly, the calculation of the transfer function, considering the driving stage as an ideal one, and considering the equivalent series resistance (ESR) negligible, will be shown next. In the calculation, reference is made to FIG. 15*a* and FIG. 15*b*, wherein FIG. 15*a* shows a simplified schematic of a driving stage for a power switch circuit and FIG. 15*b* shows a simplified equivalent circuit of a driving stage for a power switch circuit. So, in a first calculation step it can be derived:

$$V_1 \cdot C_{GS} \cdot s + g_{m,MOS} V_1 = V_{OUT} C_L s \rightarrow V_1 = \frac{V_{OUT} C_L s}{(g_{m,MOS} + C_{GS} \cdot s)} \quad (6)$$

$$\frac{V_{IN} - V_1 - V_{OUT}}{R_S} = V_1 (C_{GS} \cdot s) + (V_1 + V_{OUT}) \cdot C_{GD} \cdot s \quad (7)$$

Substituting (6) in (7), we get:

$$\begin{aligned}
V_{IN} &= V_1 + V_{OUT} + R_S V_1 C_{GS} s + R_S (V_1 + V_{OUT}) \cdot C_{GD} \cdot s \\
&= V_{OUT} + V_1 + V_1 \cdot R_S \cdot C_{GS} \cdot s + V_1 \cdot R_S \cdot C_{GD} \cdot s + V_{OUT} \cdot R_S \cdot C_{GD} \cdot s \\
&= V_1 (1 + R_S \cdot s \cdot (C_{GS} + C_{GD})) + V_{OUT} (1 + R_S \cdot C_{GD} \cdot s) \\
&= \frac{V_{OUT} C_L s}{(g_{m,MOS} + C_{GS} \cdot s)} \cdot (1 + R_S s (C_{GS} + C_{GD})) + V_{OUT} (1 + R_S C_{GD} \cdot s) \\
&= V_{OUT} \cdot \frac{C_L \cdot s \cdot (1 + R_S \cdot s (C_{GS} + C_{GD})) + (1 + R_S \cdot C_{GD} \cdot s)(g_{m,MOS} + C_{GS} \cdot s)}{(g_{m,MOS} + C_{GS} \cdot s)}
\end{aligned}$$

$$\Rightarrow \frac{V_{OUT}(s)}{V_{IN}(s)} = \frac{(g_{m,MOS} + sC_{GS})}{s \cdot C_L + s^2 \cdot R_S \cdot C_L (C_{GS} + C_{GD}) + g_{m,MOS} + R_S \cdot C_{GD} \cdot s \cdot g_{m,MOS} + s \cdot C_{GS} + s^2 R_S C_{GS} C_{GD}}$$

$$= \frac{(g_{m,MOS} + sC_{GS})}{s^2 (C_{GS} C_L + C_{GD} C_L + C_{GS} C_{GD}) \cdot R_S + s(C_L + C_{GS} + R_S g_{m,MOS} C_{GD}) + g_{m,MOS}}$$

Figure 16A:
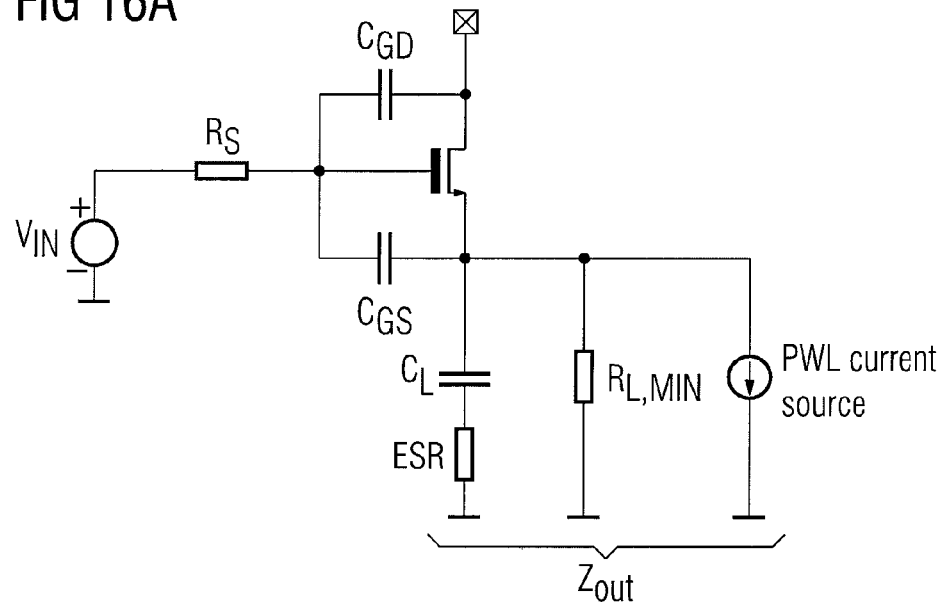
FIG. 16a is a detailed schematic of a driving stage for a power switch circuit.
Figure 16B:
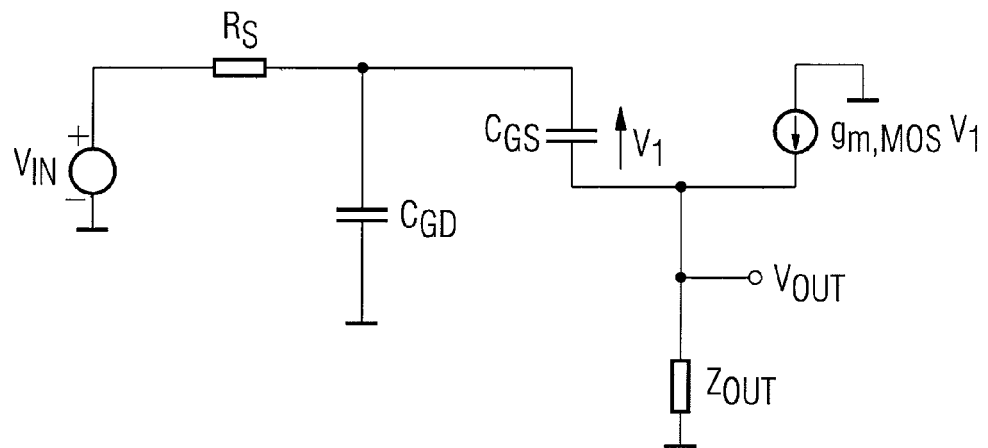
FIG. 16b is a detailed equivalent circuit of a driving stage for a power switch circuit.
Figure 17:
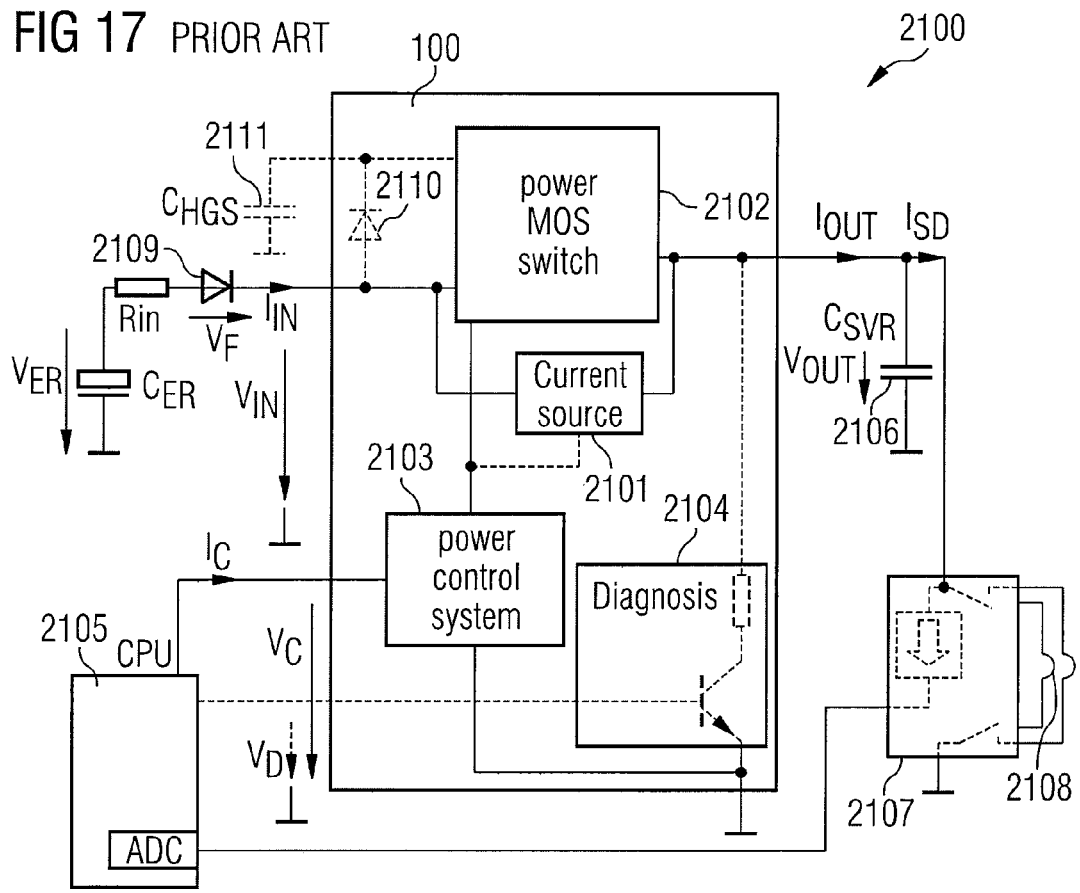
FIG. 17 is a block schematic diagram of a prior-art AIRBAG driver circuit.
Figure 18:
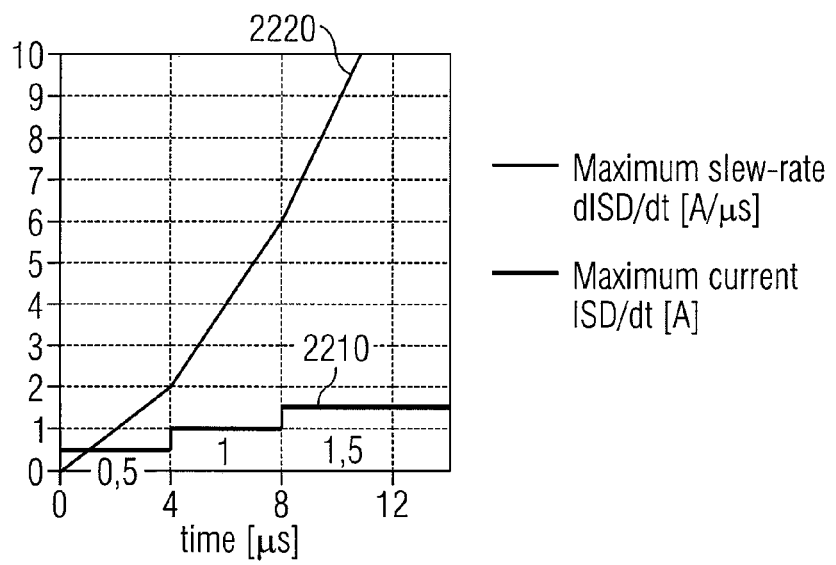
FIG. 18 is a graphical representation of a maximum current slew rate and a maximum current as a function of time for the AIRBAG driver circuit of FIG. 17.

Following the first step, we now redo the calculation, but without considering the equivalent series resistance negligible. It should be noted, that in the following calculations reference is made to FIGS. 16*a* and 16*b*, wherein FIG. 16*a* shows a detailed schematic of a driving stage for a power switch circuit and FIG. 16*b* shows a detailed equivalent circuit of a driving stage for a power switch circuit.

First, an expression for an output impedance $Z_{OUT}(S)$ is calculated, considering the contributions of the load capacitance $C_L$, the equivalent series resistance ESR thereof and the minimum load resistance $R_{L,MIN}$:

$$Z_{OUT}(s) = \left(\frac{1}{sC_L} + ESR\right) \| R_{L,MIN} = \frac{R_{L,MIN}(1 + sC_L ESR)}{1 + sC_L(ESR + R_{L,MIN})}$$

As ESR is negligible in the denominator of the above expression if ESR<<RL,MIN, it can be concluded:

$$Z_{OUT}(s) \cong R_{L,MIN} \frac{(1 + sC_L ESR)}{(1 + sC_L R_{L,MIN})}$$

With the small signal equivalent circuit of FIG. 16b, which can be rebuilt in view of the above equations, it can be written in a second step:

$$V_1 \cdot C_{GS} \cdot s + g_{m,MOS} \cdot V_1 = \frac{V_{OUT}}{R_{L,MIN}} \cdot \frac{(1 + sC_L R_{L,MIN})}{(1 + sC_L ESR)} \to V_1 = \quad (8)$$

$$\frac{V_{OUT}}{R_{L,MIN}} \cdot \frac{(1 + sC_L R_{L,MIN})}{(1 + sC_L ESR) \cdot (g_{m,MOS} + sC_{GS})}$$

$$\frac{(V_{IN} - V_1 - V_{OUT})}{R_S} = V_1 \cdot C_{GS} \cdot s + (V_1 + V_{OUT}) \cdot C_{GD} \cdot s \quad (9)$$

$$V_{IN} = R_S(C_{GS} \cdot s \cdot V_1 + C_{GD} \cdot s \cdot V_1 + C_{GD} \cdot s \cdot V_{OUT}) + V_1 + V_{OUT}$$

$$= V_1(R_S \cdot C_{GS} \cdot s + R_S \cdot C_{GD} \cdot s + 1) + V_{OUT}(1 + R_S \cdot C_{GD} \cdot s)$$

Substituting (8) into (9) we have:

$$V_{IN} = \frac{V_{OUT}}{R_{L,MIN}} \cdot \frac{(1 + sC_L R_{L,MIN})}{(1 + sC_L ESR) \cdot (g_{m,MOS} + sC_{GS})} \cdot [1 + R_S(C_{GS} + C_{GD}) \cdot s] +$$

$$V_{OUT}(1 + s \cdot R_S \cdot C_{GD})$$

$$= V_{OUT}\left\{(1 + R_S C_{GD} s) + \frac{(1 + sC_L R_{L,MIN})(1 + sR_S(C_{GS} + C_{GD}))}{R_{L,MIN}(1 + sC_L ESR)(g_{m,MOS} + sC_{GS})}\right\}$$

It follows:

$$\frac{V_{OUT}(s)}{V_{IN}(s)} = \frac{R_{L,MIN} \cdot (1 + sC_L ESR) \cdot (g_{m,MOS} + sC_{GS})}{(1 + R_S C_{GD} \cdot s) \cdot R_{L,MIN} \cdot (1 + sC_L ESR) \cdot (g_{m,MOS} + sC_{GS}) +}$$
$$(1 + sC_L R_{L,MIN}) \cdot (1 + sR_S(C_{GS} + C_{GD}))$$

$$= \frac{(R_{L,MIN} \cdot g_{m,MOS}) \cdot (1 + sC_L ESR) \cdot (1 + sC_{GS}/g_{m,MOS})}{(R_{L,MIN} + R_S \cdot R_{L,MIN} \cdot C_{GD} \cdot s)\left(\begin{array}{c} g_{m,MOS} + sC_L ESR g_{m,MOS} + \\ sC_{GS} + s^2 C_L ESR C_{GS} \end{array}\right) +}$$
$$(1 + sC_L R_{L,MIN} + sR_L(C_{GS} + C_{GD}) + s^2 R_S R_{L,MIN} C_L(C_{GS} + C_{GD}))$$

$$= \frac{R_{L,MIN} \cdot g_{m,MOS} \cdot (1 + sC_L ESR)(1 + sC_{GS}/g_{m,MOS})}{s^3(ESR \cdot R_S \cdot R_{L,MIN} \cdot C_L \cdot C_{GS} \cdot C_{GD}) +}$$
$$s^2\left(\begin{array}{c} R_S \cdot R_{L,MIN}(C_{GS} \cdot C_{GD} \cdot C_L \cdot C_{GS} + C_L \cdot C_{GD}) + \\ R_S \cdot R_{L,MIN} ESR g_{m,MOS} C_L C_{GD} + R_{L,MIN} \cdot ESR \cdot C_L \cdot C_{GS} \end{array}\right) +$$
$$s\left(\begin{array}{c} R_{L,MIN} \cdot C_L + R_S \cdot (C_{GS} + C_{GD}) + R_{L,MIN} \cdot C_{GS} + g_{m,MOS} \cdot \\ R_{L,MIN} \cdot ESR C_L + g_{m,MOS} R_{L,MIN} R_S C_{GD} \end{array}\right) +$$
$$(1 + g_{m,MOS} R_{L,MIN})$$

$$= \frac{(1 + sC_L ESR)(1 + sC_{GS}/g_{m,MOS})}{s^3\left(\frac{ESR\, R_S C_L C_{GD} C_{GS}}{g_{m,MOS}}\right) +}$$
$$s^2\left(\begin{array}{c} \frac{R_S(C_{GS} C_{GD} + C_{GS} C_L + C_L C_{GD})}{g_{m,MOS}} + R_S ESR C_L C_{GD} + \\ \frac{ESR C_L C_{GS}}{g_{m,MOS}} \end{array}\right) +$$
$$s\left(\frac{C_L + C_{GS}}{g_{m,MOS}} + ESR \cdot C_L + R_S C_{GD} + \frac{R_S(C_{GS} + C_{GD})}{R_{L,MIN} \cdot g_{m,MOS}}\right) +$$
$$\left(1 + \frac{1}{g_{m,MOS} R_{L,MIN}}\right)$$

As can be seen from the above equation for the transfer function Vout(s)/Vin(s), the transfer function comprises two left half plane zeros. Further, the transfer function has a third order denominator, so that there are three poles. A dominant pole approximation is therefore not applicable.

Following the second step detailed above, and considering some realistic values ($C_L \cong 140$ nF; ESR=50 m$\Omega \div 1\Omega$; $C_{GS} \cong C_{GD} \cong 3 \div 10$ nF; $g_{m,MOS,SAT} \cong 1$ mS$\div 10$ mS; $R_{L,MIN}$=20 k$\Omega$), we get some approximations:

$$G_{m,MOS} R_{L,MIN} >> 1;$$

$$C_{GS}, C_{GD} << C_L;$$

$$R_S, g_{m,MOS}^{-1} >> ESR;$$

Using these approximations, it can be concluded:

$$\frac{V_{OUT}(s)}{V_{IN}(s)} = \frac{(1 + sC_L ESR) \cdot (1 + sC_{GS}/g_{m,MOS})}{s^3\left(\frac{ESR\, R_S C_L C_{GD} C_{GS}}{g_{m,MOS}}\right) +}$$
$$s^2\left(\frac{R_S}{g_{m,MOS}} \cdot \left(\underset{\text{NEGLIGIBLE}}{C_{GS} \cdot C_{GD}} + C_{GS} \cdot C_L + C_{GD} \cdot C_L\right) + R_S ESR C_L C_{GD} + \frac{ESR C_L C_{GS}}{g_{m,MOS}}\right) +$$
$$s\left(\frac{C_L + \overset{\text{NEGLIGIBLE}}{C_{GS}}}{g_{m,MOS}} + ESR \cdot C_L + R_S C_{GD} + \frac{R_S(C_{GS} + C_{GD})}{R_{L,MIN} \cdot g_{m,MOS}}\right) + \left(1 + \underset{\text{NEGLIGIBLE}}{\frac{1}{g_{m,MOS} R_{L,MIN}}}\right)$$

$$\frac{V_{OUT}(s)}{V_{IN}(s)} \cong \frac{(1+sC_LESR)\cdot(1+sC_{GS}/g_{m,MOS})}{s^3\left(\frac{ESR\,R_S R_{L,MIN}}{g_{m,MOS}}C_L C_{GD} C_{GS}\right)+} \\ s^2\left(\frac{R_S C_L(C_{GS}+C_{GD})}{g_{m,MOS}}+\frac{ESR\,C_L C_{GS}}{g_{m,MOS}}+R_S\underset{NEGLIGIBLE}{ESR\,C_L\,C_{GD}}\right)+ \\ s\left(C_L\left(\frac{1}{g_{m,MOS}}+\underset{NEGLIGIBLE}{ESR}\right)+R_S C_{GD}+R_S\frac{(C_{GS}+C_{GD})}{R_{L,MIN}\cdot g_{m,MOS}}\right)+1$$

$$\frac{V_{OUT}(s)}{V_{IN}(s)} \cong \frac{(1+sC_LESR)(1+sC_{GS}/g_{m,MOS})}{s^3\left(\frac{ESR\,R_S R_{L,MIN} C_L C_{GS} C_{GD}}{g_{m,MOS}}\right)+s^2\left(\frac{R_S C_L(C_{GS}+C_{GD})+ESR\,C_L C_{GS}}{g_{m,MOS}}\right)+} \\ s\left(\frac{C_L}{g_{m,MOS}}+R_S C_{GD}+R_S\frac{(C_{GS}+C_{GD})}{R_{L,MIN}\cdot g_{m,MOS}}\right)+1$$

Figure 10:
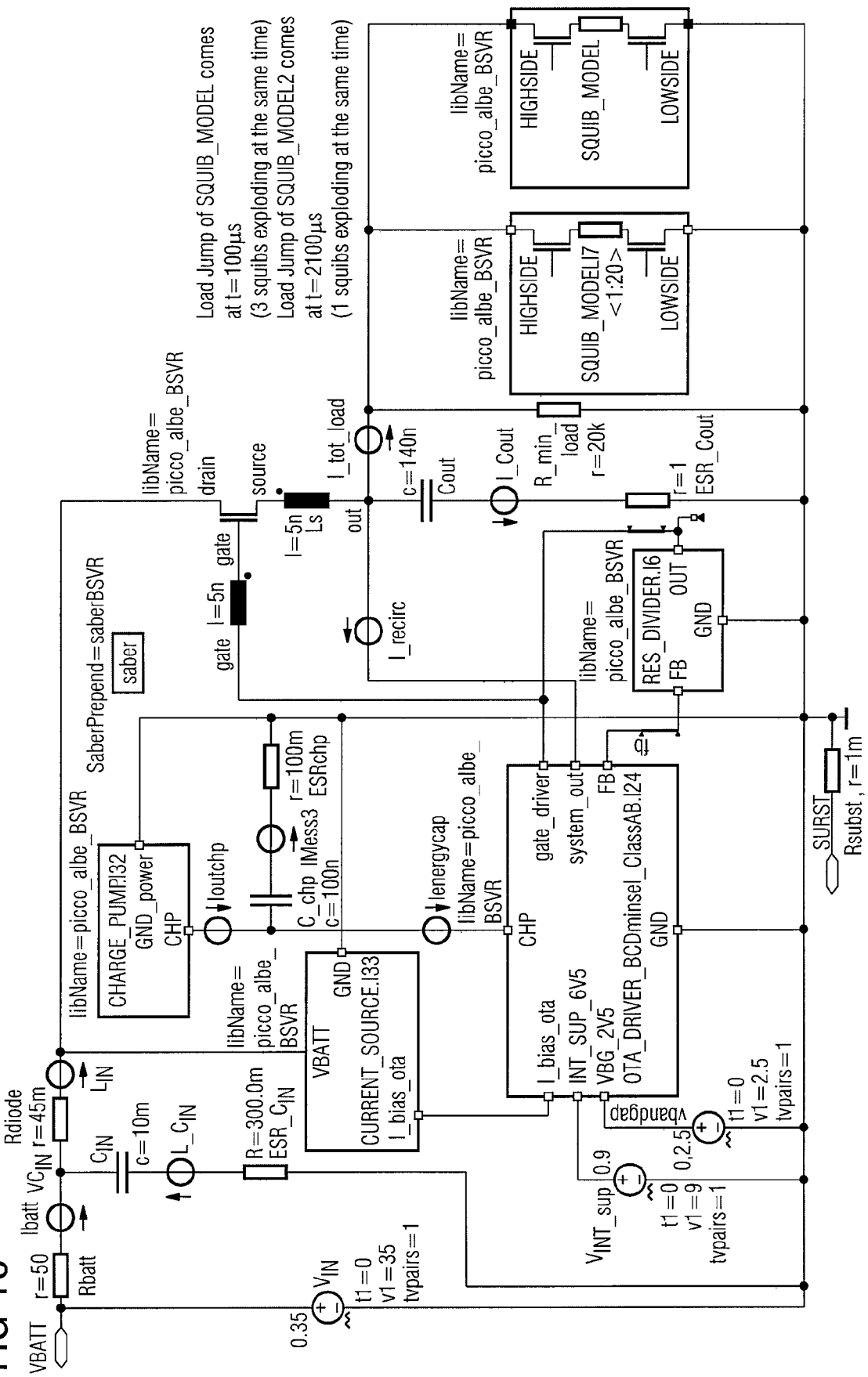
FIG. 10 is a block schematic diagram of an AIRBAG control system comprising a power switch circuit with a class AB driving stage.

The core of the circuit described below, should cover different aspects:

i. in order to make it stable and reliable, we have to minimize $R_s$, using a very strong (it means a high current capability) Class-AB driver in a closed loop configuration, as shown in FIG. 9 (wherein $\tau_{POLE_{CLASS\,AB\,STAGE}} = R_{AB}\cdot C_{AB}$).

ii. We have to use a pole-zero compensation, in order to have an acceptable Phase Margin (PM), but with the unavoidable problem to have a zero before the Unitary Gain Frequency (UGF), and it means to face with a "slow setting time" drawback.

iii. Another important specification is to sustain an high voltage at the gate of the Power-MOS-switch, in order to maintain the high voltage requirements at the source of the switch, as requested by the SQUIBB modules technology, but with the strong limitation not to sink too much current from the supply. In our case a charge pump stage, shown in the schematic complete block diagram of FIG. 10, will be responsible to increase the voltage at the drain of the power-MOS-switch, and this will be our supply voltage. We are therefore obliged to limit the quiescent current sunk by the Class-AB-High-Voltage output stage, in order not to overload the charge pump. (The more current is sunk, the larger will be charge pump area.)

iv. The last specification is to have a low total quiescent current, and this means that we have to consider Class-AB stages with a high current multiplication factor, but also with a fixed total quiescent current, which is reliable over fab spread.

Figure 11:
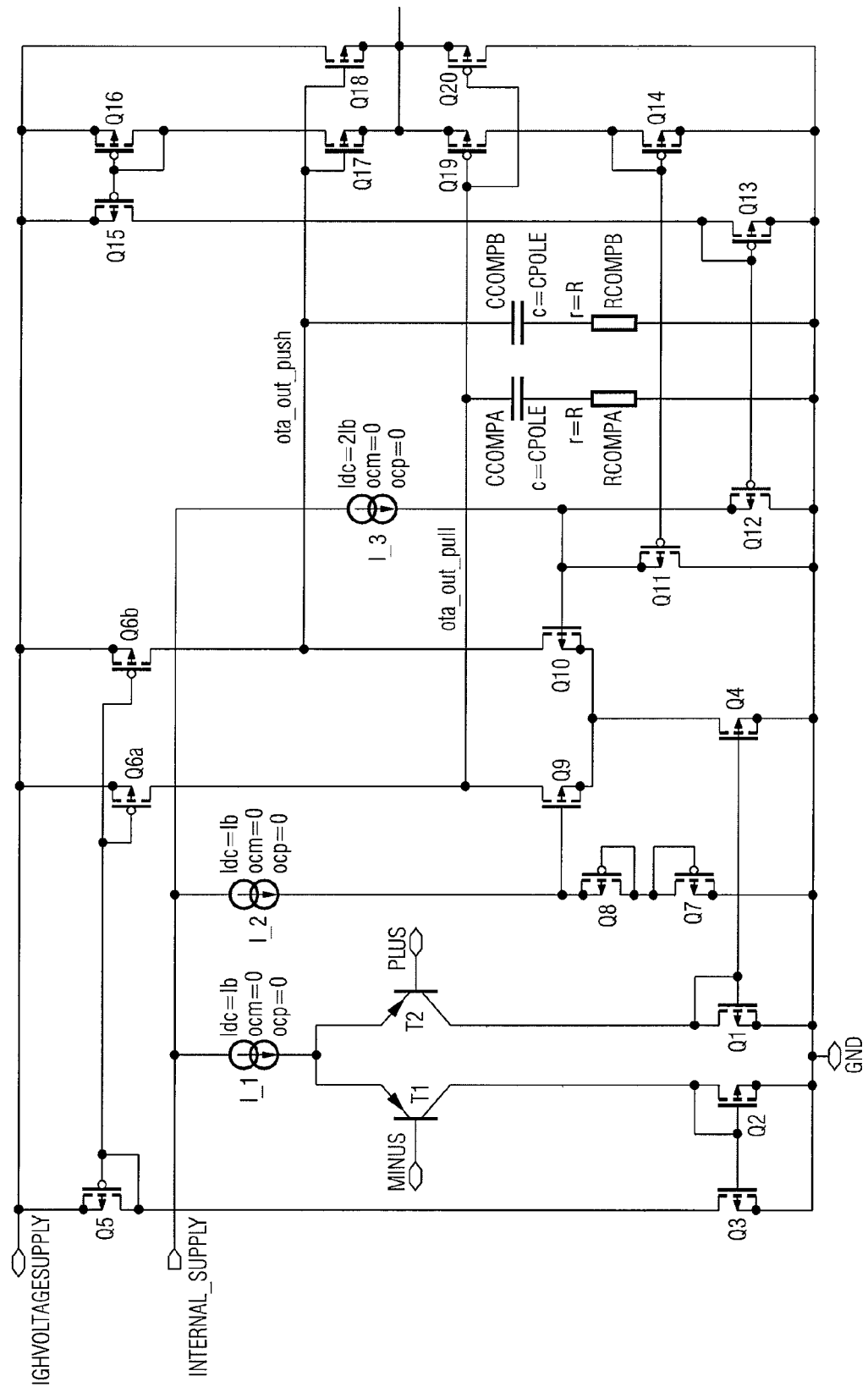
FIG. 11 is a schematic diagram of a class AB power-MOS switch gate driver circuit.

Following the previous considerations, we developed a General-Amplifier Feed-Back-Biased Minimum selector Class-AB stage, with a pole-zero compensation. The complete schematic thereof without cascading stuff is shown in FIG. 11. The General-Amplifier Feed-Back-Biased Minimum selector Class-AB stage has a number of innovative features:

v. A low voltage input differential stage, composed by the input BCMos OTA (Bipolar-CMOS operational transconductance amplifier) plus the mirroring current low voltage stuff.

vi. A high voltage minimum selector topology necessary to maintain a very low quiescent current with an high current multiplication factor when the stage becomes unbalanced;
maintain reasonably on the pull/push transistor during respectively the push/pull phase thus reducing recovering time after hard unbalancing of the output stage vii. an high voltage output stage composed by a simple (cascoded) power current mirror, capable to supply the peak current needed by the Power-MOS gate.

As described in the previous paragraph, the idea of the circuit is to maintain a low total quiescent current system, by means of separating the low voltage part from the high voltage part, in order to sink as less current as possible from the charge pump, but respecting also a lot of restrictive conditions:

i. To minimize as much as possible an output impedance $R_s$ of the stage, with high driving current capabilities.

ii. To obtain a good compromise of stability for the system, with a pole-zero compensation.

iii. To sustain high voltage output loads (as SQUIBB modules are), with a precisely defined and fixed over fab spread current, but maintaining at the meantime a low quiescent current capability.

iv. To obtain a high current multiplication factor, precise over fab spread without affecting the charge pump stage. This is possible improving the classical minimum selector topology to work in high voltage condition.

Our implementation of this concept, is shown in a simplified form in FIG. 11 without the cascoding structures. An actual implementation in a BCDmos technology (SPT4—Infineon proprietary) as showed in FIG. 12.

Starting with the simplified circuit of FIG. 11, it is easy to distinguish three parts:

a. The input error amplifier is formed by a pnp differential pair input stage ($T_1$, $T_2$) supplied with a current Ib=20 μA derived from an internal supply of around 6.5V, and current branches (10 μA) are mirrored using low voltage nmos ($Q_1$, $Q_2$, $Q_3$, $Q_4$) to the high voltage current mirror ($Q_5$, $Q_{6a}$, $Q_{6b}$). This simple BCMos OTA topology duplicates its output node (ota_out_push, ota_out_pull, $Q_{6a}$, $Q_{6b}$) in order to drive a normal class AB FeedBack output stage.

b. The OTA output node is biased by means of a Minimum Selector topology, where the translinear loops are formed by: $Q_7$, $Q_8$, $Q_9$, $Q_{10}$, $Q_{11}$, $Q_{14}$ and $Q_7$, $Q_8$, $Q_9$, $Q_{10}$, $Q_{12}$, $Q_{13}$. Both loops are mixed nmos and pmos loops, where two equations are determined, which fix the push-pull currents:

$$V_{GS\_Q7}+V_{SG\_Q8}-V_{GS\_Q9}+V_{GS\_Q10}=V_{SG\_Q11}+V_{GS\_Q14} \quad (10)$$

$$V_{GS\_Q7}+V_{SG\_Q8}-V_{GS\_Q9}+V_{GS\_Q10}=V_{SG\_Q12}+V_{GS\_Q13} \quad (11)$$

Two ideal current sources ($I_2$=10 uA, $I_3$ 020A) derived from the internal supply provide the bias for $Q_7$, $Q_8$, $Q_{11}$, $Q_{12}$.

$Q_{13}$, $Q_{14}$ are responsible of the minimum selector (MS) feed back concept. $Q_{13}$, $Q_{14}$ sense a fraction (1:5) of the output push/pull currents feeding back this information to the gate of $Q_{10}$. For example if we are in push phase. $V_{GS\_Q13}$ is increased. $Q_{12}$ is off and in the meantime $V_{GS\_Q14}$ is decreasing and $Q_{11}$ pulls down the gate of $Q_{10}$. The same mechanism, but reversed, happens in the pull phase getting the same result of pulling down $Q_{10}$. Unbalancing in this way the differential pair of the minimum selector ($Q_9$, $Q_{10}$) we physically separate the "common node" ota_out_pull and ota_out_push (the command from the OTA stage is a common mode signal) with a differential signal (coming from the minimum selector diff.) pulling down ota_out_pull and pushing up ota_out_push nodes. Final result is to counterbalance an excess of push current with a weak pull current in order to maintain on $Q_{19}$ and $Q_{20}$ and vice versa in the other case. Keeping slightly on in this way (feed back biasing concept) the non conducting transistor of the push/pull class-AB output stage, we significantly reduce the latency time after hard unbalancing phase.

It must be also included in this part the compensation network ($R_{compA}$, $C_{compA}$, $R_{compB}$, $C_{compB}$) between the nets ota_out_pull, ota_out_push and ground.

c. The HV-P-Mos $Q_{15}$, $Q_{16}$, mirror the push current needed by $Q_{13}$ sense transistor. $Q_{17}$, $Q_{18}$, $Q_{19}$, $Q_{20}$ are responsible to physically drive the high peak current given or subtracted to the Power-MOS-switch.

Figure 12:
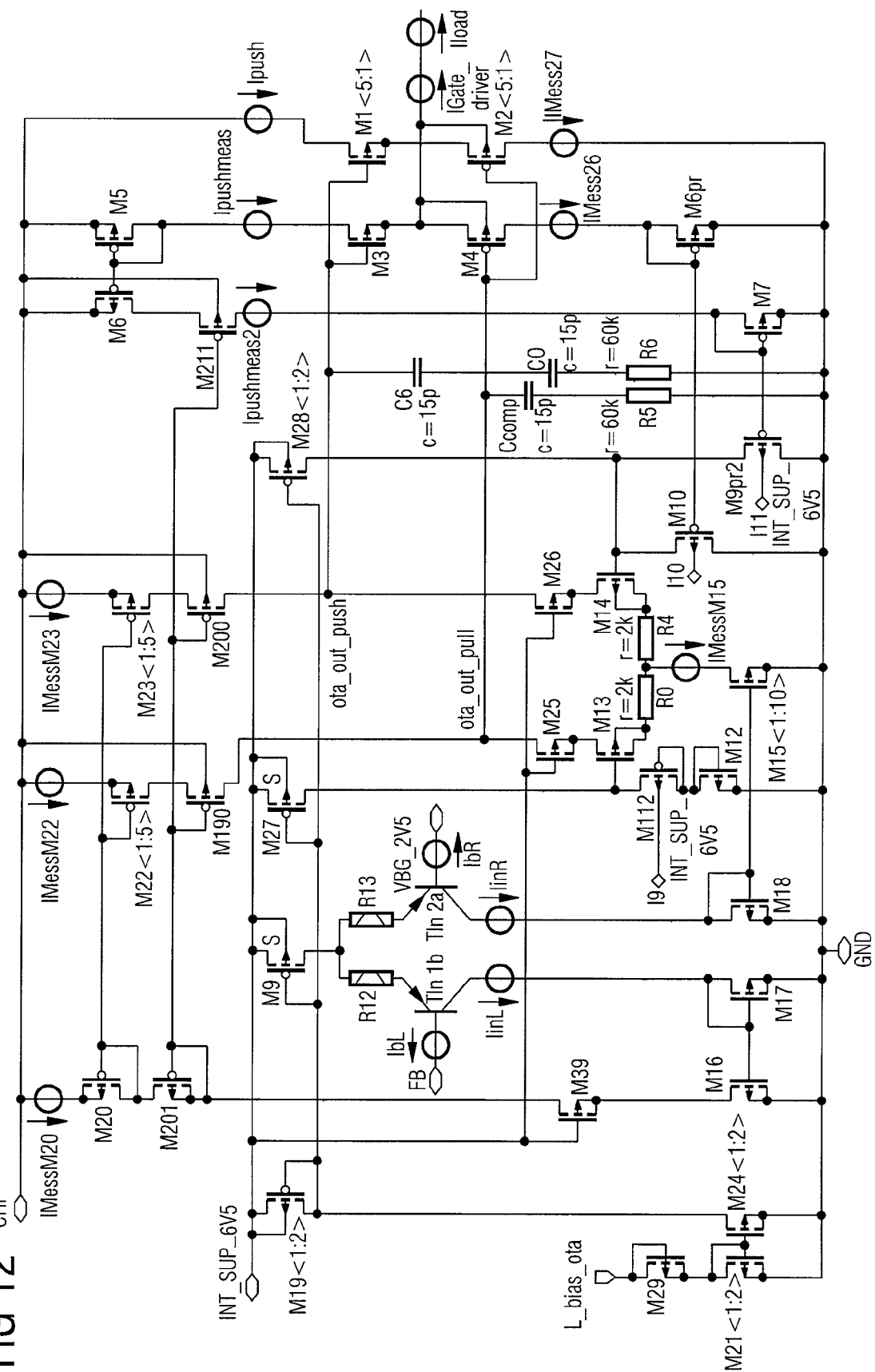
FIG. 12 is a detailed schematic diagram of a class AB power-MOS switch gate driver circuit.

In FIG. 12 the complete implemented circuit is shown. In addition to FIG. 11 are considered:

$M_{201}$, $M_{190}$, $M_{200}$, $M_{211}$: high voltage p-mos cascode transistors;

$M_{39}$, $M_{25}$, $M_{26}$: high voltage d-mos cascode transistors;

$M_{19}$, $M_9$, $M_{27}$, $M_{28}$: low voltage p-mos current mirror;

$M_{29}$, $M_{21}$, $M_{24}$: low voltage n-mos current mirror;

$R_{13}$, $R_{12}$: input differential pair degeneration resistors to better control error OTA dc gain;

$R_0$, $R_4$: MS differential pair degeneration resistors to decrease and control MS loop gain.

Figure 13:
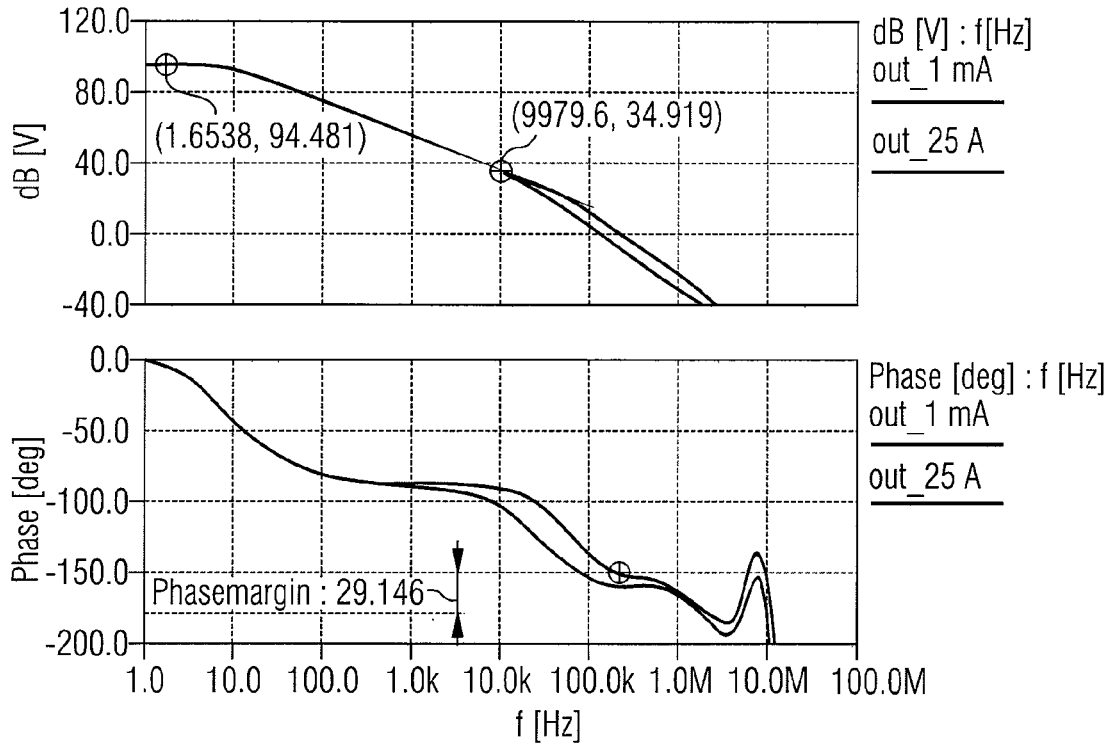
FIG. 13 is a graphical representation of results of an AC analysis for a system comprising a class AB gate driver circuit.
Figure 14:
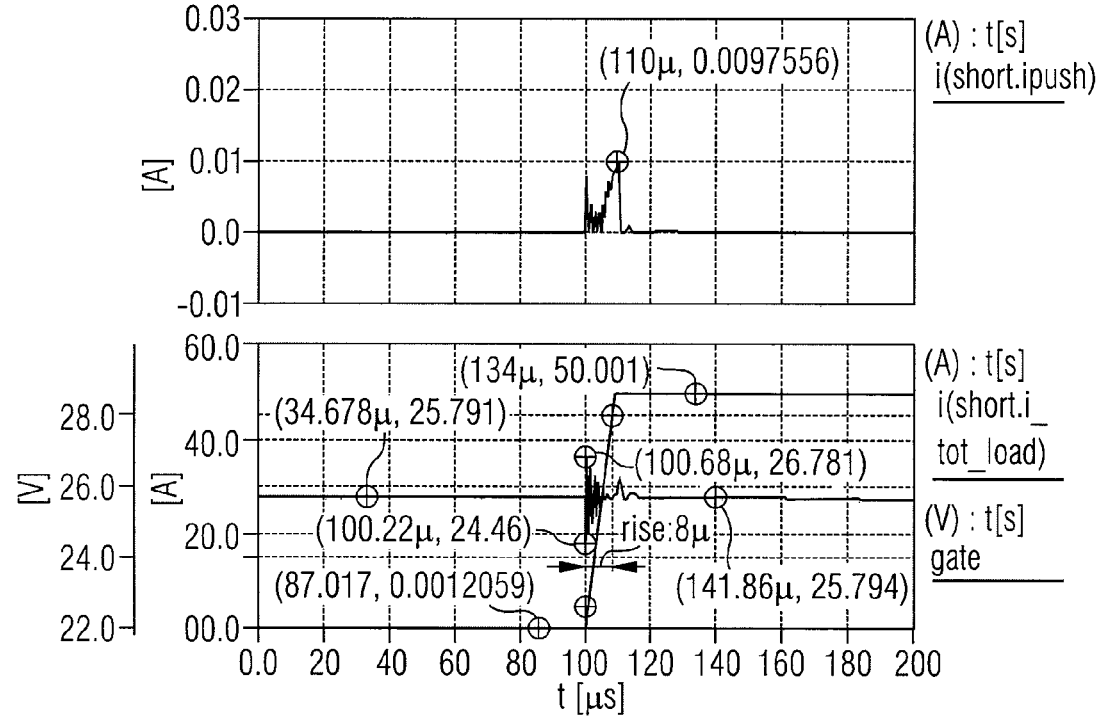
FIG. 14 is a graphical representation of results of a transient analysis for a system comprising a class AB gate driver circuit.

Results of this implementation are shown in FIG. 13 and FIG. 14, wherein:

FIG. 13 shows the AC response of the system, with different load currents (1 mA and 50 A), showing low frequency dominant poles, showing also not great differences with increasing current load and substantially maintaining an acceptable Phase Margin;

FIG. 14 shows the transient step-response of the gate voltage of the Power-MOS-switch, with 5 A/us rate and current load from 1 mA up to 50 A, where the quite good transient behaviour of the system is clearly visible.

Due to the innovation of AIRBAG SQUIBB technology, the idea to extend Class AB stages to high voltage systems, with very low quiescent current consumption, fast transient response and very high driving current capability has produced a very simple and reliable Class AB stage. This stage can be integrated in a recognizable structure.

To summarize the above, it should be noted that the present invention relates to a novel configuration aimed at improving the safety and reliability of driving circuitries for AIRBAG deployment systems. The present invention in particular relates to a system directly connected to squib drivers. Several kinds of solution have already been studied in detail, have been implemented in detail and have to work under the severe conditions of automotive stressed environments. In particular, the system also has to operate properly when a crash occurs and the battery voltage is likely to be lost. This is one of the reasons why an improvement regarding safety and diagnostic possibilities, as the present publication introduces, can be a great challenge. Actually, an improvement in safety and diagnostic possibilities is an aim to be targeted by car manufacturers and car electronic system providers.

Although a big improvement has already been reached on the AIRBAG control system, nevertheless safety reason and technology considerations about new-generation squibs require further features introduced by the present invention. Furthermore, some easy-to-implement diagnostics on the squib driver circuitry and a novel approach of diagnostic management on the external power element itself has been shown in the present disclosure. Particular advantages can be reached by using a couple of voltage regulators with the external power element and a switching mechanism that guarantees the transition from a closed-loop output voltage control with a permanent diagnosis to an open-loop output voltage with further diagnosis based on state transition. It should be noted that the new concept was described with reference to FIG. 7.

In brief, a new circuit concept for a power switch circuit is described in the present disclosure which can be implemented with little effort and which guarantees a high stability and reliability. Also, the safety of the AIRBAG control system can be increased significantly using this concept.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A power switch circuit for driving an airbag squib module, comprising:
    a power transistor having a first electrode, a second electrode, and a control electrode, a path between the first electrode, and a second electrode being connected in series with the airbag squib module between a supply potential and a reference potential;
    a pre-charge capacitance for storing a charge;
    a charging circuit for charging the pre-charge capacitance, the charging circuit being coupled to the pre-charge capacitance; and
    a controllable energy-coupling element connected between a first electrode of the pre-charge capacitance, and the control electrode of the power transistor,
    wherein the charging circuit comprises:
        a first current source coupled with the pre-charge capacitance and adapted to charge the pre-charge capacitance by providing a first current;
        a second current source that can be activated and deactivated, the second current source being adapted to discharge the capacitance by sinking a second current if the second current source is activated,
        wherein the first current source and the second current source are coupled in such a way that magnitudes of the first current and the second current are in a predetermined relationship,
        wherein the first current source and the second current source are further adapted such that an absolute magnitude of the first current is smaller than an absolute magnitude of the second current.

2. The apparatus according to claim 1, wherein the energy-coupling element is a switch or a controllable buffer.

3. The apparatus according to claim 1, wherein the energy-coupling element is a MOS switch.

4. The apparatus according to claim 1, wherein the power transistor is a power-MOS field effect transistor, wherein the first electrode is a drain electrode of the power-MOS field effect transistor, when the second electrode is a source electrode of the power MOS field effect transistor and wherein the control electrode is a gate electrode of the power-MOS field effect transistor.

5. The apparatus according to claim 1, wherein a second electrode of the pre-charge capacitance is connected to a fixed potential.

6. The apparatus according to claim 1, wherein the charging circuit comprises a voltage regulator adapted to adjust the potential at the first electrode of the pre-charge capacitance to a predetermined value based on a reference voltage.

7. The apparatus according to claim 1, wherein the charging circuit comprises an operational amplifier, the output of which is coupled with the pre-charged capacitance.

8. The apparatus according to claim 1, wherein the charging circuit comprises a charge pump coupled to the pre-charge capacitance and adapted to bring the potential at the first electrode of the pre-charge capacitance to a potential level higher than a supply potential of the charging circuit.

9. The apparatus according to claim 1, wherein the charging circuit further comprises a diode connected between the supply potential of the charging circuit and the pre-charge capacitance to charge the pre-charge capacitance based on the supply potential of the charging circuit if the supply potential is sufficient, and to be in the blocked state if the supply potential of the charging circuit is insufficient to charge the pre-charge capacitance.

10. The apparatus according to claim 1, wherein the charging circuit is adapted to provide a current to charge the pre-charge capacitance in a first mode of operation, and to provide a current to discharge the pre-charge capacitance in a second mode of operation.

11. The apparatus according to claim 1, wherein the charging circuit is further adapted to provide a current to charge the pre-charge capacitance alternatively in a voltage limited mode of operation, wherein the charging current is primarily limited by an output impedance of a voltage providing circuit, or in a current-controlled mode, wherein the charging current is provided by a current source.

12. The apparatus according to claim 11, further comprising a voltage monitoring circuit for monitoring a potential in a load circuit of the power transistor, at least at a point in time when the charging circuit is providing a current to discharge the pre-charged capacitance, and to determine, based on the potential in the load circuit, whether the pre-charged capacitance is damaged or not.

13. The apparatus according to claim 1, further comprising a control logic adapted to control the operation of the power switch circuit, wherein the control logic is adapted to control the charging circuit to provide a current charging the pre-charge capacitance in a standby mode, to provide a current discharging the pre-charge capacitance for a predetermined period of time after a transition from the standby mode to a firing mode, and to provide a current charging the pre-charge capacitance after the predetermined period of time has elapsed,
  wherein the control logic is further adapted to switch the energy coupling element to a conductive state in the firing mode and to a non-conductive state in the standby mode,
  wherein the energy coupling element is adapted to provide charge or energy from the pre-charge capacitance to the control electrode of the power transistor in the conductive state.

14. The apparatus of claim 13, wherein the control logic and the charging circuit are adapted such that the charging circuit provides a current to charge the pre-charge capacitance in a voltage limited mode of operation in the standby mode, wherein the current provided by the charging circuit is primarily limited by an output impedance of a voltage providing circuit in the voltage limited mode of operation;
  that the charging circuit provides a current to discharge the pre-charge capacitance during the predetermined period of time after the transition from the standby mode to the firing mode; and
  that the charging circuit provides a current to charge the pre-charge capacitance in a current controlled mode after the predetermined period of time has elapsed, wherein the current provided by the charging circuit is determined by a current source in the current controlled mode.

15. The apparatus according to claim 1, further comprising:
  a voltage-providing circuit for providing a voltage;
  a multiplexer for alternatively coupling an output of the voltage providing circuit to the pre-charge capacitance or to a supply terminal of the first current source; and
  a control logic for controlling the charging circuit in such a way that the output of the voltage providing circuit is connected to the pre-charge capacitance if the energy coupling element is in a non-conductive state, and that the output of the voltage providing circuit is connected to the supply terminal of the first current source if the energy coupling element is in a conductive state.

16. The apparatus according to claim 1, wherein the second current source is connected between the first terminal of the pre-charge capacitance and the reference potential.

17. The apparatus according to claim 1, wherein the first current and the second current are both derived from the same reference current or reference voltage, wherein at least one current mirror is used in order to achieve that a fixed base potential of the first current source is different from a fixed base potential of the second current source.

18. The apparatus according to claim 1, wherein the charging circuit is adapted such that the absolute magnitude of the second current is at least 1.1 times the absolute magnitude of the first current and not larger than 20 times the absolute magnitude of the first current.

19. The apparatus according to claim 1, further comprising a second switch connected between the control electrode of the power transistor and the second electrode of the power transistor in order to ensure that the power transistor does not pass a current through the path between the first electrode and the second electrode if the second switch is closed.

20. The apparatus according to claim 19, further comprising a control logic adapted to close the second switch if the energy coupling element is controlled to be in a non-conductive state, and to open the second switch if the energy coupling element is controlled to be in a conductive state.

21. The apparatus according to claim 1, wherein the squib is connected in series with at least a high side transistor or a low side transistor between the second terminal of the power transistor and the reference potential.

22. The apparatus according to claim 1, further comprising an auxiliary voltage source coupled with the second terminal of the power transistor.

23. The apparatus according to claim 22, wherein the auxiliary voltage source is adapted to regulate the voltage at the second terminal of the power transistor in a closed loop mode.

24. The apparatus according to claim 22, wherein a voltage of the auxiliary voltage source is adapted such that the squib connected between the second terminal of the power transistor in the reference potential cannot be fired if the power transistor is not in a conductive state.

25. The apparatus according to claim 22, wherein the auxiliary voltage source further comprises a current limiter adapted to limit the current in such a way that the squib connected between the second terminal of the power transistor and the reference potential cannot be fired by the maximum current provided by the auxiliary voltage source.

26. The apparatus according to claim 22, wherein the squib is connected in series with at least a high side transistor or a low side transistor between a second terminal of the power transistor and a reference potential,
further comprising control logic for activating the high side transistor and/or the low side transistor when the power transistor is not in the conductive state, and a test circuit for measuring at least a voltage in a load circuit between the second electrode of the power transistor and the reference potential, and for obtaining information on the integrity of the load circuit comprising the high side transistor, and/or the low side transistor and/or the squib from the voltage measure in the load circuit.

27. The apparatus according to claim 1, further comprising a load capacitance connected between the second terminal of the power transistor and the reference potential, and a test circuit for evaluating the time response of the potential in the load circuit between the second terminal of the power transistor and the reference potential when the power transistor is switched from a conductive state to a non-conducting state in order to determine whether the load capacitance is defective or not.

28. A power switch circuit for driving an airbag squib module, comprising:
a power transistor having a first electrode, a second electrode, and a control electrode, a path between the first electrode, and a second electrode being connected in series with the airbag squib module between a supply potential and a reference potential;
a pre-charge capacitance for storing a charge;
a charging circuit for charging the pre-charge capacitance, the charging circuit being coupled to the pre-charge capacitance; and
a controllable energy-coupling element connected between a first electrode of the pre-charge capacitance, and the control electrode of the power transistor;
wherein the charging circuit is adapted to provide a current to charge the pre-charge capacitance in a first mode of operation, and wherein the charging circuit comprises a current source adapted to provide a current to discharge the pre-charge capacitance in a second mode of operation,
wherein an absolute magnitude of the current provided to discharge the pre-charge capacitance is larger than an absolute magnitude of the current provided to charge the pre-charge capacitance.

29. The power switch circuit according to claim 28, wherein the current source adapted to provide a current to discharge the pre-charge capacitance in the second mode of operation is adapted to sink a current from the pre-charge capacitance to a reference potential.

30. The power switch circuit according to claim 29, wherein the controllable energy-coupling element is connected between the charging circuit and the control electrode of the power transistor.

31. The power switch circuit according to claim 28, wherein the current source adapted to provide a current to discharge the pre-charge capacitance in the second mode of operation comprises a field effect transistor, a drain-source path of which is circuited between the pre-charge capacitance and a reference potential to discharge the pre-charge capacitance.

32. The power switch circuit according to claim 28, further comprising a control logic adapted to control the operation of the power switch circuit, wherein the control logic is adapted to control the charging circuit to operate in the first mode of operation to provide a current charging the pre-charge capacitance in a standby mode, to operate in the second mode of operation to provide a current discharging the pre-charge capacitance for a predetermined period of time after a transition from the standby mode to a firing mode, and to operate in the first mode of operation to provide a current charging the pre-charge capacitance after the predetermined period of time has elapsed,
wherein the control logic is further adapted to switch the energy coupling element to a conductive state in the firing mode and to a non-conductive state in the standby mode,
wherein the energy coupling element is adapted to provide charge or energy from the pre-charge capacitance to the control electrode of the power transistor in the conductive state.

33. The power switch circuit according to claim 32, wherein the power switch circuit remains in the firing mode after the predetermined period of time has elapsed.

34. The power switch circuit according to claim 33, further comprising a voltage monitoring circuit for monitoring a potential in a load circuit of the power transistor, at least at a point in time when the charging circuit is providing a current to discharge the pre-charged capacitance, and to determine, based on the potential in the load circuit, whether the pre-charged capacitance is damaged or not.

35. The power switch circuit according to claim 32, wherein the control logic is configured to activate the current source adapted to provide a current to discharge the pre-charge capacitance during the predetermined period of time, and to deactivate the current source adapted to provide a current to discharge the pre-charge capacitance after the predetermined period of time has elapsed.

36. A power switch circuit for driving an airbag squib module, comprising:
a power transistor having a first electrode, a second electrode, and a control electrode, a path between the first electrode, and a second electrode being connected in series with the airbag squib module between a supply potential and a reference potential;
a pre-charge capacitance for storing a charge;
a charging circuit for charging the pre-charge capacitance, the charging circuit being coupled to the pre-charge capacitance; and
a controllable energy-coupling element connected between a first electrode of the pre-charge capacitance, and the control electrode of the power transistor;
wherein the charging circuit is further adapted to provide a current to charge the pre-charge capacitance alternatively in a first manner in a voltage limited mode of operation, wherein the charging current is primarily limited by an output impedance of a voltage providing circuit, or in a second, different manner in a current-controlled mode, wherein the charging current is provided by a current source, wherein an output impedance of the current source is greater than the output impedance of the voltage providing circuit;
wherein the voltage-limited mode of operation is used in a standby mode, and wherein the current-controlled mode is used in a firing mode, wherein the standby mode and the firing mode are different modes of operation, wherein the voltage-limited mode is used in the standby mode in which the controllable energy-coupling element is open, and wherein the current-controlled mode is used in the firing mode, in which the controllable energy-coupling element connects the control electrode of the power transistor to the pre-charge capacitance.

37. The power switch according to claim 36, wherein the charging circuit is configured to provide the current to charge the pre-charge capacitance in the firing mode using a current mirror.

38. The power switch circuit according to claim 36, wherein the power switch circuit comprises a voltage-providing circuit; wherein the power switch circuit comprises a multiplexer configured to select a first path during the standby mode, such that the pre-charge capacitance is charged to a desired voltage, wherein a current is only limited by a parasitic output impedance of the voltage-providing circuit, and to select a second path when switching to the firing mode, such that a current loading the pre-charge capacitance is reduced in the firing mode when compared to the standby mode.

39. A power switch circuit for driving an airbag squib module, comprising:
 a power transistor having a first electrode, a second electrode, and a control electrode, a path between the first electrode, and a second electrode being connected in series with the airbag squib module between a supply potential and a reference potential;
 a pre-charge capacitance for storing a charge;
 a charging circuit for charging the pre-charge capacitance, the charging circuit being coupled to the pre-charge capacitance; and
 a controllable energy-coupling element connected between a first electrode of the pre-charge capacitance, and the control electrode of the power transistor;
 wherein the charging circuit is adapted to provide a current to charge the pre-charge capacitance in a first mode of operation, and wherein the charging circuit comprises a current source adapted to provide a substantially voltage-independent current to discharge the pre-charge capacitance in a second mode of operation, and
 wherein the current source adapted to provide a current to discharge the pre-charge capacitance in the second mode of operation is adapted to sink a current from the pre-charge capacitance to a reference potential.

40. A power switch circuit for driving an airbag squib module, comprising:
 a power transistor having a first electrode, a second electrode, and a control electrode, a path between the first electrode, and a second electrode being connected in series with the airbag squib module between a supply potential and a reference potential;
 a pre-charge capacitance for storing a charge;
 a charging circuit for charging the pre-charge capacitance, the charging circuit being coupled to the pre-charge capacitance; and
 a controllable energy-coupling element connected between a first electrode of the pre-charge capacitance, and the control electrode of the power transistor;
 wherein the charging circuit is adapted to provide a current to charge the pre-charge capacitance in a first mode of operation, and wherein the charging circuit comprises a current source adapted to provide a substantially voltage-independent current to discharge the pre-charge capacitance in a second mode of operation, and
 wherein the current source adapted to provide a current to discharge the pre-charge capacitance in the second mode of operation comprises a field effect transistor, a drain-source path of which is circuited between the pre-charge capacitance and a reference potential to discharge the pre-charge capacitance.

41. A power switch circuit for driving an airbag squib module, comprising:
 a power transistor having a first electrode, a second electrode, and a control electrode, a path between the first electrode, and a second electrode being connected in series with the airbag squib module between a supply potential and a reference potential;
 a pre-charge capacitance for storing a charge;
 a charging circuit for charging the pre-charge capacitance, the charging circuit being coupled to the pre-charge capacitance; and
 a controllable energy-coupling element connected between a first electrode of the pre-charge capacitance, and the control electrode of the power transistor;
 wherein the charging circuit is adapted to provide a current to charge the pre-charge capacitance in a first mode of operation, and wherein the charging circuit comprises a current source adapted to provide a current to discharge the pre-charge capacitance in a second mode of operation;
 wherein the power switch circuit further comprises a control logic adapted to control the operation of the power switch circuit, wherein the control logic is adapted to control the charging circuit to operate in the first mode of operation to provide a current charging the pre-charge capacitance in a standby mode, to operate in the second mode of operation to provide a current discharging the pre-charge capacitance for a predetermined period of time after a transition from the standby mode to a firing mode, and to operate in the first mode of operation to provide a current charging the pre-charge capacitance after the predetermined period of time has elapsed,
 wherein the control logic is further adapted to switch the energy coupling element to a conductive state in the firing mode and to a non-conductive state in the standby mode,
 wherein the energy coupling element is adapted to provide charge or energy from the pre-charge capacitance to the control electrode of the power transistor in the conductive state.

42. A power switch circuit for driving an airbag squib module, comprising:
 a power transistor having a first electrode, a second electrode, and a control electrode, a path between the first electrode, and a second electrode being connected in series with the airbag squib module between a supply potential and a reference potential;
 a pre-charge capacitance for storing a charge;
 a charging circuit for charging the pre-charge capacitance, the charging circuit being coupled to the pre-charge capacitance; and
 a controllable energy-coupling element connected between a first electrode of the pre-charge capacitance, and the control electrode of the power transistor;
 wherein the charging circuit is further adapted to provide a current to charge the pre-charge capacitance alternatively in a voltage limited mode of operation, wherein the charging current is primarily limited by an output impedance of a voltage providing circuit, or in a current-controlled mode, wherein the charging current is provided by a current source, wherein the voltage-limited mode of operation is used in a standby mode, and wherein the current-controlled mode is used in a firing mode;

wherein the power switch circuit comprises a voltage-providing circuit;

wherein the power switch circuit comprises a multiplexer configured to select a first path during the standby mode, such that the pre-charge capacitance is charged to a desired voltage, wherein a current is only limited by a parasitic output impedance of the voltage-providing circuit, and to select a second path when switching to the firing mode, such that a current loading the pre-charge capacitance is reduced in the firing mode when compared to the standby mode.

* * * * *